United States Patent [19]

Hyatt

[11] 4,310,878
[45] Jan. 12, 1982

[54] DIGITAL FEEDBACK CONTROL SYSTEM

[76] Inventor: Gilbert P. Hyatt, P.O. Box 4584, Anaheim, Calif. 92803

[21] Appl. No.: 746,867

[22] Filed: Apr. 24, 1972

Related U.S. Application Data

[63] Continuation-in-part of Ser. No. 879,293, Nov. 24, 1969, abandoned, Ser. No. 101,881, Dec. 28, 1970, Ser. No. 134,958, Apr. 19, 1971, Ser. No. 135,040, Apr. 19, 1971, Ser. No. 229,213, Apr. 13, 1972, Pat. No. 3,820,894, Ser. No. 230,872, Mar. 1, 1972, and Ser. No. 232,459, Mar. 7, 1972.

[51] Int. Cl.² .................... G05B 1/01; G06F 15/46
[52] U.S. Cl. .................... 364/183; 318/608
[58] Field of Search .......... 340/172.5; 235/151.11; 318/562, 567, 569–574, 600–603, 595, 594, 654, 605, 661, 665, 608; 82/5, 2 B; 304/107, 118, 474

[56] References Cited

U.S. PATENT DOCUMENTS

| | | | |
|---|---|---|---|
| 3,110,865 | 11/1963 | Scuitto | 235/151.11 X |
| 3,122,691 | 2/1964 | Centner et al. | 235/151.11 X |
| 3,174,367 | 3/1965 | Lukens | 235/151.11 X |
| 3,283,129 | 11/1966 | Kelling | 235/151.11 X |
| 3,308,279 | 3/1967 | Kelling | 235/151.11 |
| 3,312,884 | 4/1967 | Gabor | 235/151.11 X |
| 3,315,235 | 4/1967 | Carnevale et al. | 340/172.5 |
| 3,349,229 | 10/1967 | Evans | 235/151.11 |
| 3,548,172 | 12/1970 | Centner et al. | 235/151.11 |
| 3,582,749 | 6/1971 | Wenzel | 318/571 |
| 3,602,994 | 9/1971 | Layman | 318/571 |
| 3,612,841 | 10/1971 | Kosem et al. | 235/151.11 |
| 3,626,385 | 12/1971 | Bouman | 340/172.5 |
| 3,633,011 | 1/1972 | Bederman et al. | 340/172.5 X |
| 3,634,662 | 1/1972 | Slawson | 340/172.5 X |
| 3,634,664 | 1/1972 | Valek | 235/151.11 |
| 3,656,377 | 4/1972 | Kosem | 235/151.11 X |
| 3,665,493 | 5/1972 | Glowzewski | 235/151.11 |
| 3,668,503 | 6/1972 | Lindner | 318/665 |
| 3,668,653 | 6/1972 | Fair et al. | 340/172.5 |
| 3,671,727 | 6/1972 | Rhoades | 235/151.11 |
| 3,684,873 | 8/1972 | Meyer et al. | 235/151.11 |
| 3,686,556 | 8/1972 | Anger et al. | 318/595 |
| 3,699,317 | 10/1972 | Middleditch | 235/151.11 |
| 3,701,888 | 10/1972 | McDaniel | 235/150.1 |
| 3,702,988 | 11/1972 | Haney et al. | 340/172.5 |
| 3,715,938 | 2/1973 | Ledergerber et al. | 235/151.11 X |
| 3,720,120 | 3/1973 | Cutler | 235/151.11 X |
| 3,731,177 | 5/1973 | Commander et al. | 318/603 |
| 3,739,158 | 6/1973 | Woodward | 235/151.11 |
| 3,746,845 | 7/1973 | Henegar et al. | 235/151.11 |

OTHER PUBLICATIONS

"Three Machine Tool Shows—or Were They Control Show?", in *Control Engineering*, Nov. 1970, pp. 53–56.
Mesniaeff, P. G., "The Technical Ins and Outs of Computerized Numerical Control", in *Control Engineering*, Mar. 1971, pp. 65–84.
"Microprogrammable Digital Computer", by Micro Systems, Inc., *Computer Design*, May 1969, p. 69.

*Primary Examiner*—Joseph F. Ruggiero
*Attorney, Agent, or Firm*—Gilbert P. Hyatt

[57] ABSTRACT

A feedback control system is provided for control of a machine with a computer. A whole number command structure and a whole number feedback arrangement provide for interfacing a servo to a computer. Direct conversion between pulse width modulated and phase modulated signals and whole number digital signals facilitate computer interfacing to analog servos.

9 Claims, 15 Drawing Figures

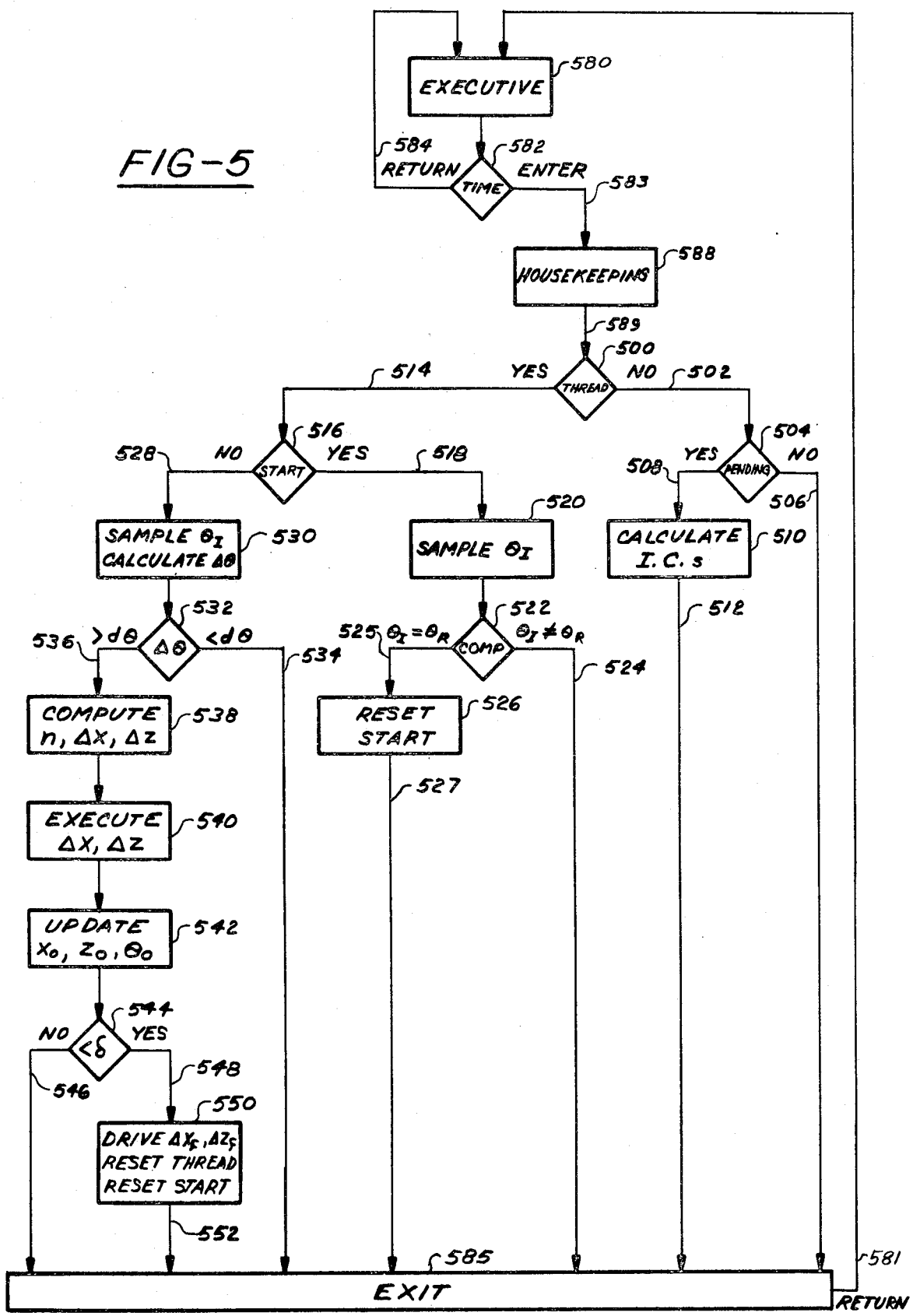

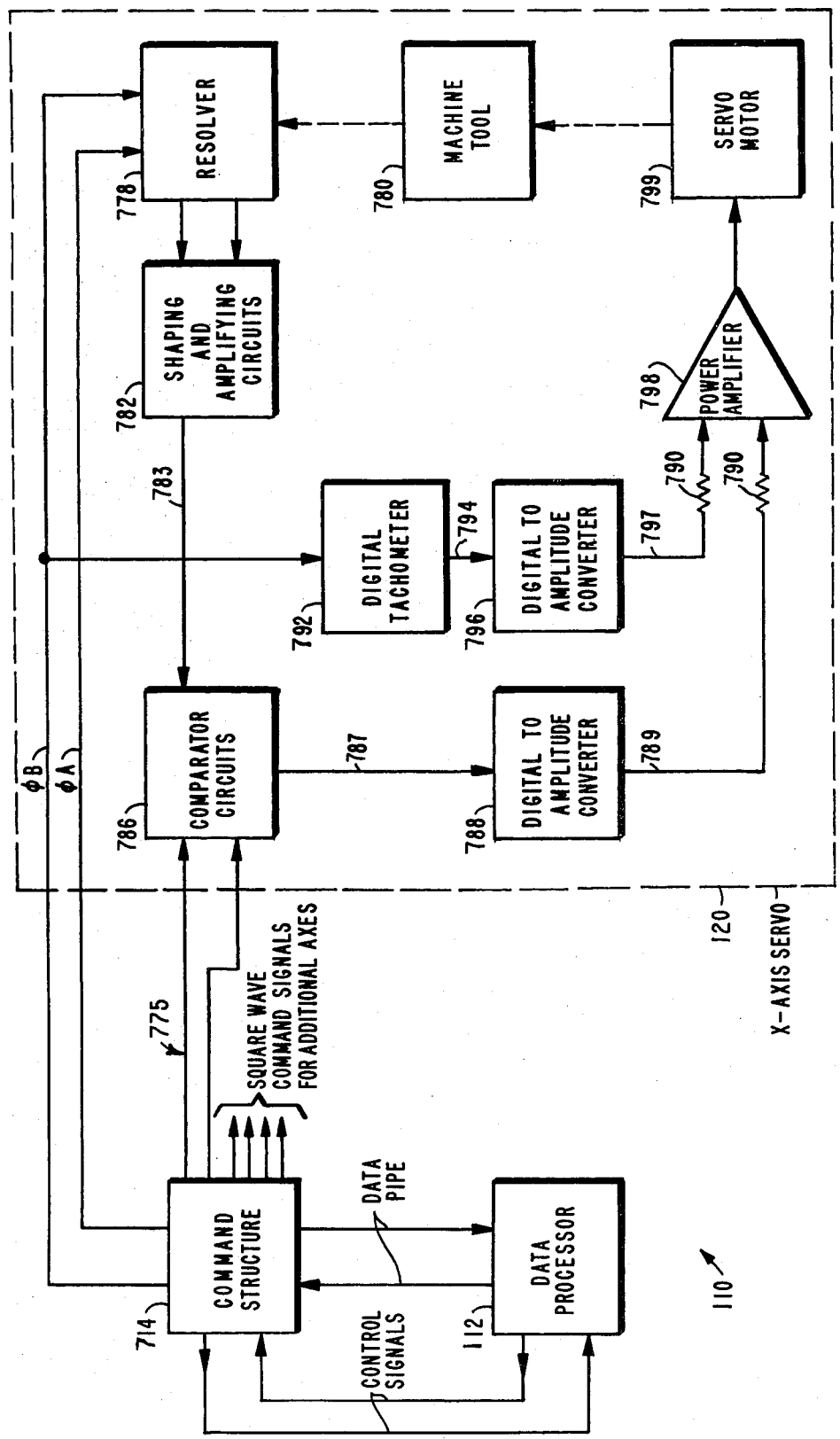
FIG.—7A

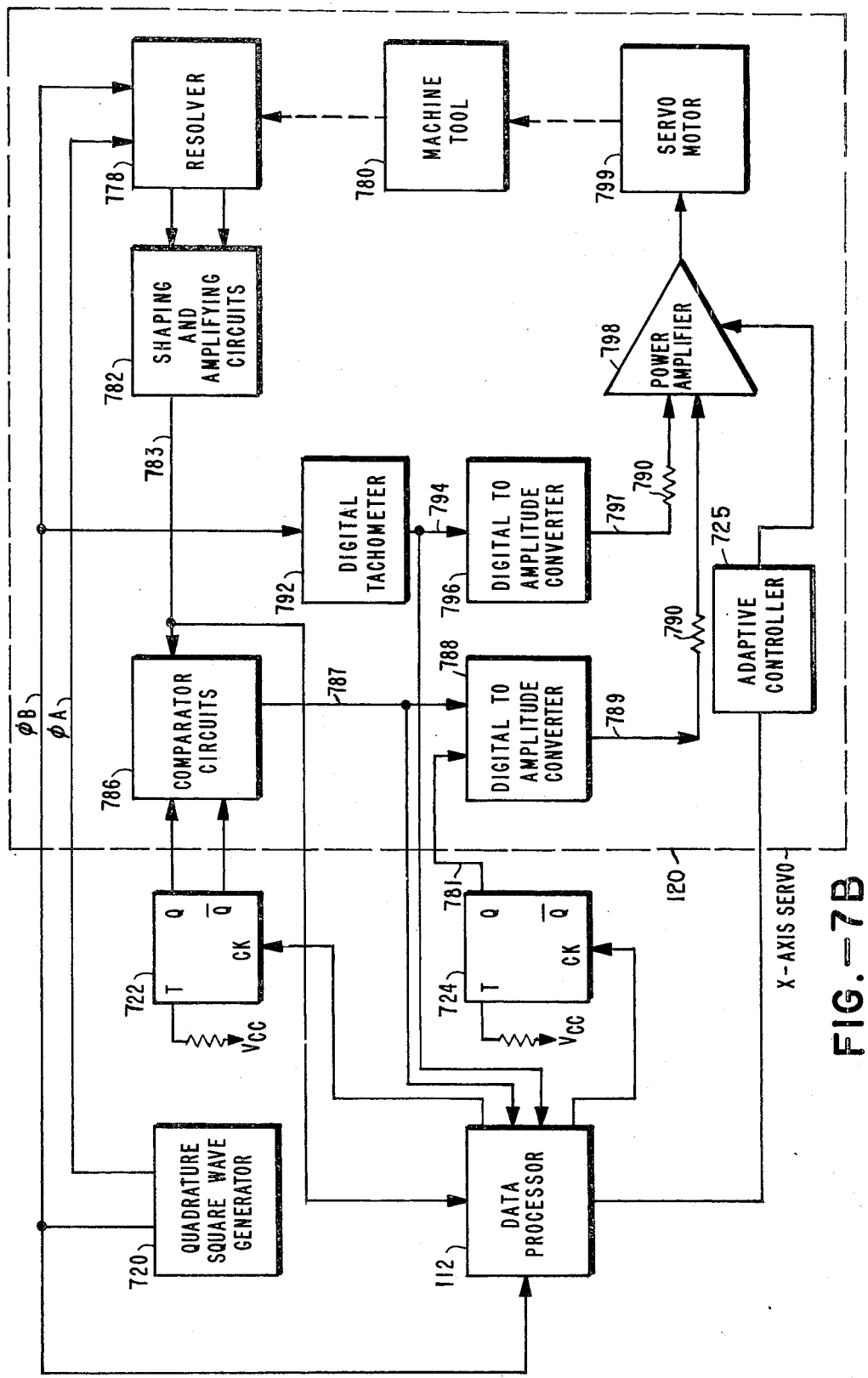
FIG.—7B

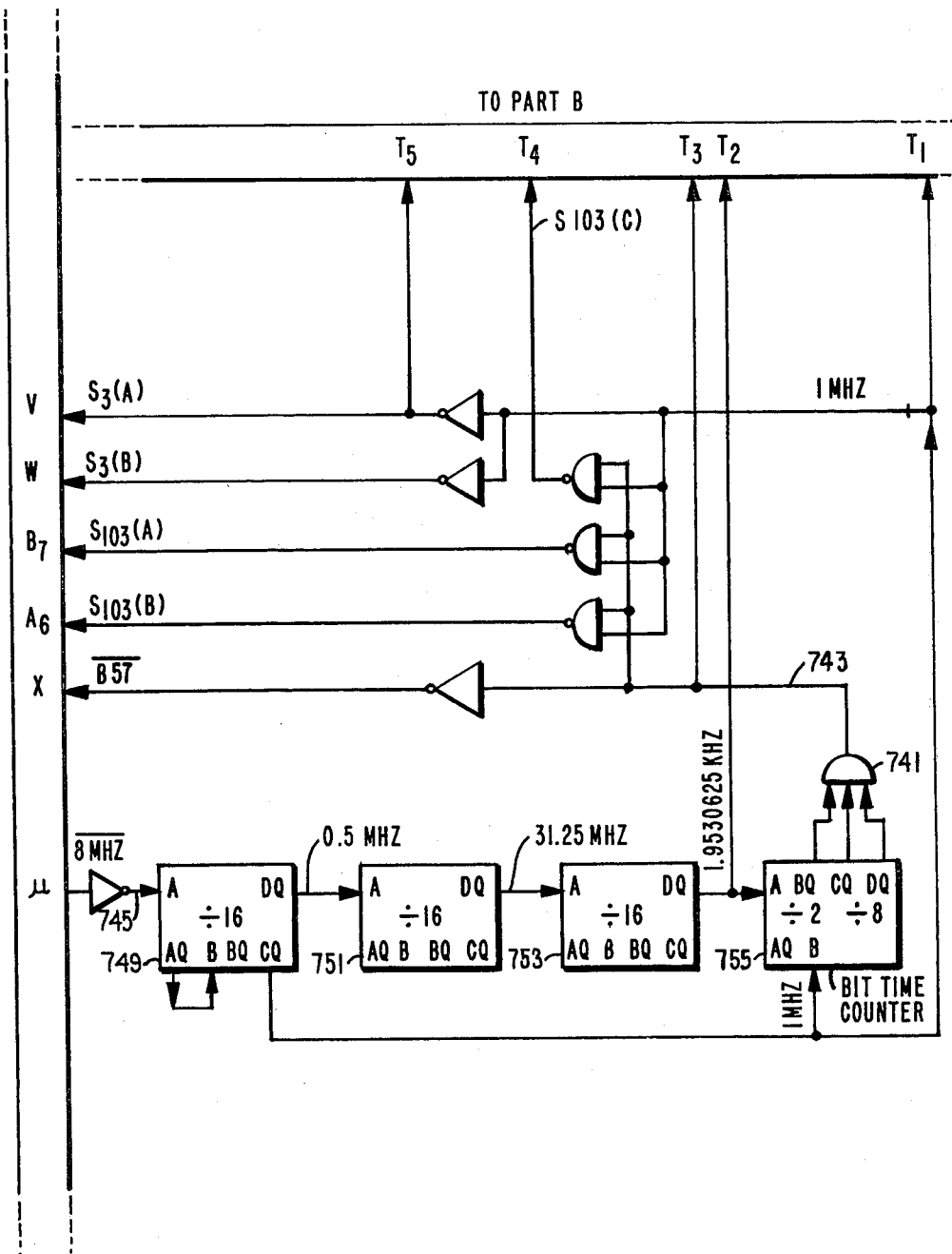
FIG.—7D

DIGITAL FEEDBACK CONTROL SYSTEM

CROSS REFERENCE TO RELATED APPLICATIONS

This application is a continuation-in-part of the chain of parent applications:
1. METHOD AND APPARATUS FOR PROCESSING THE DIGITAL OUTPUT OF AN INPUT MEANS Ser. No. 879,293 filed on Nov. 24, 1969 now abandoned in favor of continuing applications;
2. FACTORED DATA PROCESSING SYSTEM FOR DEDICATED APPLICATIONS Ser. No. 101,881 filed on Dec. 28, 1970;
3. CONTROL SYSTEM AND METHOD Ser. No. 134,958 filed on Apr. 19, 1971;
4. CONTROL APPARATUS Ser. No. 135,040 filed on Apr. 19, 1971;
5. APPARATUS AND METHOD FOR PRODUCING HIGH REGISTRATION PHOTO MASKS Ser. No. 229,213 filed on Apr. 13, 1972 now U.S. Pat. No. 3,820,894 issued on June 28, 1974;
6. MACHINE CONTROL SYSTEM OPERATING FROM REMOTE COMMANDS Ser. No. 230,872 filed on Mar. 1, 1972; and
7. COORDINATE RESOLUTION FOR NUMERICAL CONTROL SYSTEMS Ser. No. 232,459 filed on Mar. 7, 1972 and issuing cotemporaneously with the instant application:

all by Gilbert P. Hyatt:

wherein the benefit of the filing dates of this chain of parent applications is herein claimed in accordance with 35 USC 120 and other authorities provided therefore: and wherein said parent applications and the patents issuing thereon are herein incorporated by reference.

Said parent application Ser. No. 232,459 issuing cotemporaneously with the instant application contains extensive disclosures on the data processor preferred embodiment originally disclosed in said parent application Ser. No. 101,881.

This application is related to applications:
8. COMPUTERIZED SYSTEM FOR OPERATOR INTERACTION Ser. No. 288,247 filed on Sept. 11, 1972, now U.S. Pat. No. 4,121,284 issued on Oct. 17, 1978;
9. STORED PROGRAM DATA PROCESSING SYSTEM FOR DIRECT CONTROL OF A MACHINE IN REAL TIME WITH DISCRETE SIGNALS Ser. No. 291,394 filed on Sept. 22, 1972;
10. DIGITAL ARRANGEMENT FOR PROCESSING SQUAREWAVE SIGNALS Ser. No. 302,771 filed on Nov. 1, 1972;
11. APPARATUS AND METHOD FOR PROVIDING INTERACTIVE AUDIO COMMUNICATION Ser. No. 325,933 filed on Jan. 22, 1973, now U.S. Pat. No. 4,016,540 issued on Apr. 5, 1977;
12. ELECTRONIC CALCULATOR SYSTEM HAVING AUDIO MESSAGES FOR OPERATOR INTERACTION Ser. No. 325,941 filed on Jan. 22, 1973, now U.S. Pat. No. 4,060,848 issued on Nov. 29, 1977;
13. DIGITAL SIGNAL PROCESSOR FOR SERVO VELOCITY CONTROL Ser. No. 339,817 filed on Mar. 9, 1973, now U.S. Pat. No. 4,034,276 issued on July 5, 1977;
14. CONTROL SYSTEM AND METHOD Ser. No. 339,688 filed on Mar. 9, 1973;
15. DATA PROCESSOR HAVING INTEGRATED CIRCUIT MEMORY REFRESH Ser. No. 402,520 filed on Oct. 1, 1973 now issuing as a U.S. Patent;
16. COMPUTERIZED MACHINE CONTROL SYSTEM Ser. No. 476,743 filed on June 5, 1974 and issuing cotemporaneously with the instant application; and
17. HIGH REGISTRATION PHOTOMASK METHOD AND APPARATUS Ser. No. 752,751 filed on Dec. 20, 1976 now U.S. Pat. No. 4,120,583 issued on Oct. 17, 1978:

all by Gilbert P. Hyatt.

This application is further related to applications:
18. INTERACTIVE CONTROL SYSTEM by Barry T. Lee, Ralph V. Cole, Irving Hirsch, Gilbert P. Hyatt, and Gunther W. Wimmer Ser. No. 101,449 filed on Dec. 28, 1970; now abandoned in favor of continuing applications; and herein incorporated by reference and
19. INTERACTIVE CONTROL SYSTEM by Barry T. Lee, Ralph V. Cole, Irving Hirsch, Gilbert P. Hyatt, and Gunther W. Wimmer Ser. No. 354,590 filed on Apr. 24, 1973 now U.S. Pat. No. 4,038,640 issued on July 26, 1977.

Certain of said related aplications that have matured or are maturing into U.S. patents have the same disclosure as-filed as contained in certain of said parent and related applications:

wherein said related application Ser. No. 402,520 now issuing as a U.S. patent had the same disclosure as-filed as said parent application Ser. No. 101,881;

wherein said related application Ser. No. 339,817 now U.S. Pat. No. 4,034,276 had the same disclosure as filed as said parent application Ser. No. 135,040; and wherein said related application Ser. No. 354,590 now U.S. Pat. No. 4,038,640 had the same disclosure as-filed as said parent application Ser. No. 101,449;

wherein said related applications Ser. No. 402,520; Ser. No. 339,817; and Ser. No. 354,590 having the same disclosures as-filed as said parent applications thereof Ser. No. 101,881; Ser No. 135,040; and Ser. No. 101,449 respectively were filed as PTO Rule 60 continuing applications thereof;

wherein the PTO had copied the disclosures of said parent applications thereof Ser. No. 101,881; Ser. No. 135,040; and Ser. No. 101,449 to obtain the disclosures as-filed for related applications Ser. No. 402,520; Ser. No. 339,817; and Ser. No. 354,590 respectively in accordance with said PTO Rule 60; and wherein said U.S. Pat. Nos. 4,034,276 and 4,038,640 have been provided to the U.S. Patent and Trademark Office for being included in the file wrapper of the instant application.

Certain of said parent applications have been partially incorporated in continuing applications therefrom;

wherein said parent application Ser. No. 101,881 has been partially incorporated in said parent application Ser. No. 232,459 which is issuing cotemporaneously with the instant application;

wherein said parent application Ser. No. 134,958 has been partially incorporated in the instant application; and wherein said parent application Ser. No. 230,872 has been partially incorporated in said related application Ser. No. 476,743 which is issuing cotemporaneously with the instant application.

One skilled in the art will be able to combine the disclosures in said applications that are incorporated by reference with the disclosure in the instant application from the disclosures therein and the disclosures herein.

This application is further related to subsequently filed patent application Digital Signal Processor For Servo Velocity Control Ser. No. 339,817 filed on Mar. 9, 1973 now Pat. No. 4,034,276 issued on July 5, 1977 which is a Rule 60 Divisional application of said application Ser. No. 135,040 and is further related to subsequently filed related application Interactive Control Systems Ser. No. 354,590 filed on Apr. 24, 1973 now U.S. Pat. No. 4,038,640 issued on July 26, 1977 and which is a Rule 60 continuing application of said application Ser. No. 101,449 abandoned; wherein these two patents are incorporated herein by reference.

BACKGROUND OF THE INVENTION

1. Field of the Invention

This invention relates to feedback control systems, particularly for machine control.

2. Prior Art

Numerical control systems are used to control machines such as machine tools. Digital commands are input with a punched tape to describe the part to be cut on a machine such as a lathe machine. These commands are accessed by the numerical control system and are executed to drive the machine to automatically cut the part.

Prior art numerical control systems have been designed around special purpose digital devices where operations such as logic, control, and computations are performed with special purpose logic. Because of the limited capability of these special purpose numerical control systems, interaction between the contour generator and servo is usually precluded, permitting only open loop incremental commands from the contour generator to the servo. One exception is for threading operations, where an incremental pickoff is used to sense incremental changes in spindle position. These incremental feedback pulses are used by well known incremental digital differential analyzers to synchronize the contour with the spindle. Communication is in incremental form; thereby precluding the detection of accumulating errors such as with noise causing loss or introduction of incremental pulses; precluding the use of stored program data processors because of the high iteration rates associated with incremental computations; reducing reliability due to the relatively unreliable operation of incremental pickoffs; reducing threading speed due to the relatively low rotational velocity of incremental pickoffs; increasing costs due to the relatively high cost of incremental pickoffs as compared to resolver type pickoffs and other such disadvantages.

Contouring controls command the rectilinear translational axis to move relative to the independent variable, which is time. A distance command to an axis for each period of time defines an axis velocity, which is that distance divided by that period. Distance commands to a plurality of machine axes for each period of time defines not only the velocity of each axis, but the relative slope of the multi-dimensional contour which is defined by the relative magnitudes of those distance or velocity commands.

Precise turning operations such as thread cutting on a lathe requires a multi-dimensional contour that includes the spindle rotational degree of freedom. The translational axes have high performance, high accuracy drives that permits close tracking of the commands. Unfortunately, the spindle drive is typically implemented with a high power but low accuracy drive. Therefore, it is not possible to provide precise synchronized spindle motion by controlling the spindle motor. One solution to the problem has been to use the spindle motion as the independent variable for the contouring operation, with the high performance translational motions slaved to the spindle motion. An incremental sensor is usually geared to the spindle to generate an output pulse for each increment of spindle rotational displacement. These feedback increments are used as the independent variable inputs to the incremental digital differential analyzer contouring devices used in prior art systems.

Multi-speed resolver pickoffs have been used for absolute position capability in prior art systems, where the various resolvers are geared for different ranges of the axis position and are switched into the servo loop; but provide no feedback to the control portion of the system, precluding interactive control.

In the prior art, stored program data processors have been used to command physical systems, such as with machine tools, but these commands were not real time path defining commands. The data processor merely generated end point commands to non-computerized numerical control systems, where the non-computerized numerical control systems provided the interpolation function to generate the multitudes of intermediate incremental path defining commands to the machine tool subsystem. Prior art systems that have been used to generate end point commands to non-computerized numerical control systems are the General Electric Commandir system and the Sundstrand Omnicontrol system.

SUMMARY OF THE INVENTION

This invention presents a simple, inexpensive system and method to provide computerized capability for control of a physical system. This physical system will be described as a lathe machine numerical control system. It should be understood that any reference to such a numerical control system is intended to include any physical system wherein digital command and control capability is to be provided, such as for a machine, apparatus, or process. The particular lathe system discussed herein is one class of such physical systems.

The preferred embodiment of this invention is an advanced numerical control system, containing a general-purpose digital data processor for high levels of capability and versatility. Computerized capability is provided at a price competitive with prior art non-computerized systems, justifying computerized numerical control (CNC) on only one machine. The system of this invention can provide one computer per machine "dedicated" to the individual machine on a stand-alone basis, which operates in conjunction with the machine in real-time to provide self-contained CNC capability. Major assemblies in this system include a general purpose digital computer, interactive control panel, multi-axis servo drives, machine interface electronics, memory, CRT display, typewriter, punched tape reader, power supplies, and other equipment. Capability includes complex contouring with linear, circular, and parabolic curves; curve fitting; automatic fairing contours; six axes of simultaneous contouring; digital resolution of 50 millionths (0.000050) inch; departure range of 99.999 950 inches; contouring velocities of 1,200 inches per minute; and other features. Also provided are closed-loop DC servos with resolver feedback; inductosyn (FERRAND SCALE) feedback; full absolute position feedback with multi-speed pickoffs and other features.

Special features include automatic tool change with up to 99 tool offsets in core memory, spindle speed control, constant cutter chip load, and adaptive feeds and speeds. Tool history is automatically recorded for preventative maintenance. Thread cutting with direct inch-per-revolution IPR and revolution-per-inch RPI (pitch) feedrate programming is provided for lathes, and cutter compensation is available for milling and grinding machines.

This dedicated computer system includes a computer integrated into the system for versatility, economy, and performance. For example, the control panel is an extension of the computer I/O section. This I/O section is physically partitioned so that many of the interface functions, normally performed in a computer I/O, are physically contained on the panel motherboard. This dedicated computer system is under program control, where control, display, data processing, contouring, and machine control functions are handled under program control by the computer. An executive routine permits time-share operation and self-contained diagnostics. Therefore, the system can be conveniently upgraded to incorporate additional features, primarily by reprogramming the computer.

Prior art systems use remote computers to process parts program information, but have used local, non-computerized numerical control systems for real-time machine control operations. Problems associated with using a remote computer and the limitations of a non-computerized numerical control system have greatly limited their effectiveness. The system of this invention provides a local, dedicated computer contained in the numerical control system for performing the real-time machine control functions such as contour interpolation, sequencing a spindle on or off, and other such machine control functions.

A stored program digital data processor performs whole number computations at a rapid rate, but not as rapidly as an incremental digital differential analyzer (DDA) found in prior art systems. An advantage of a stored program digital data processor is in the ability to perform whole number computations that encompasses multitudes of incremental computations. If a stored program data processor were used with a prior art system and required to perform incremental computations in conjunction with an incremental spindle pickoff and an incremental servo command structure, then the stored program data processor would become severly burdened with the incremental computations. However, a means and method has been devised to provide synchronized contouring operations in whole number form to take advantage of the inherent whole number processing capability of a stored program data processor, thereby eliminating the need for burdensome incremental computations.

The system of this invention provides interactive communication between the servo controls and the data processor, where this communication is in whole number form and defines the machine condition with high resolution compared to the prior art incremental form. Also, whole number pickoffs such as the well known resolver are low in cost, high in reliability, and provide high speed capability compared to prior art incremental pickoffs.

The computational capability of the data processor provides adaptive control capability; where the data processor can detect error conditions such as might be caused by tool wear, feedback converter characteristics, or other such causes; then computationally compensates for these conditions thereby providing higher precision and greater performance.

The terms computer and data processor used herein are intended to mean a stored program data processor. The preferred embodiment of a stored program data processor is presented in the previously referenced application Ser. No. 101,881. It will be obvious that a stored program data processor is unique in that the operation of such a data processor is determined by a stored program. This stored program may be contained in a uniquely defineable main memory as shown schematically in FIG. 1A. This block diagram representation is in accordance with prior art memories, such as core memories or rotating memories. In the preferred embodiment of this invention the main memory 130 is an integrated circuit read only memory. This arrangement is unique because the integrated circuit processes required to manufacture the main memory 130 may be the same as the integrated circuit processes required to manufacture the data processor, thereby permitting an integrated monolithic data processor and stored program memory to be fabricated together. A well defined boundary between processor means and stored program memory means may not exist in a factored data processor subsystem. Therefore, a more generalized data processor must be visualized wherein the stored program may be an integral part of the data processor. Similarly, because of the low cost and flexibility of this integrated circuit read only memory, part of the data processor logic may be implemented in this read only memory just as part of the extremity logic is implemented in this read only memory. One characterization of the stored program of this monolithic data processor is a repetitive array of memory elements that defines the operation of the data processor which constitutes a stored program. This main memory contains a group of digital conditions, or instructions, accessed sequentially from the main memory, and executed in the data processor to perform data processor tasks such as computational and control tasks. The data processor is responsive to program routines or groups of these instructions to perform data processor operations and system operations.

Interaction of a stored program data processor and a control subsystem such as a lathe machine servo provides significant advantages over prior art systems which do not have a stored program data processor or which use a stored program data processor merely to generate open loop commands such as boundary condition or set point commands. This interaction is most effective if the command parameters and feedback parameters are in whole number form, where whole number form relates to a parameter that provides high resolution to define the parameter as contrasted to incremental form where the resolution is merely a single increment requiring high incremental data rates to resolve the parameters.

Interactive data processor control is exemplified by the thread contour with a lathe machine system, where the data processor is responsive to whole number spindle feedback parameters to adaptively modify the whole number thread contour commands for precisely synchronizing the translational axes with the spindle. A directly coupled spindle pickoff, preferably an electromagnetic pickoff such as a resolver providing square-wave feedback signals, provides absolute position capability with improved performance and economy over prior art devices. Various special types of thread contours are provided such as a taper thread contour, a variable lead thread contour, a compound thread contour comprising variable lead with taper, and a retract thread contour. Data processor compensation for various error mechanisms such as time related feedback converter errors provides even greater precision. Fixed cycles are provided for multipass threading operations to automatically command a sequence of different machine motions to generate a thread of the proper depth. These motions include endfeed, retract, synchronized startup, and a thread contour synchronized to the spindle motion.

Whole number, real time, path defining commands are provided by the data processor for precise, continuous path contours. The data processor provides the interpolation operations to generate whole number or integral commands that define intermediate points along the contour at a rate more rapid than the physical system can respond and with a magnitude within the response of the physical system. The machine responds to these commands as if they were continuous commands, thereby precluding the limitations of prior art systems that generate discontinuous commands or merely generate boundary condition commands such as set point commands or end point coordinates; using a non-computerized, special purpose logic apparatus to provide the interpolation operations to generate the multitudes of intermediate commands along the contour.

The data processor can adaptively control the physical system by automatically modifying the commands to the physical system relative to one or more physical system conditions. These conditions may be sensed as feedback parameters or may be available as computed parameters. Cutter load compensation is one example for a lathe machine system, where the data processor is responsive to an x axis position parameter, either sensed with feedback devices or computed with the data processor, for adaptively modifying machine feedrate and spindle speed in an inverse relation to that x axis position parameter.

This invention thus provides a high precision, high performance practical computerized numerical control system. Whole number interactive communication utilizing an improved feedback converter arrangement is attained between a stored program data processor and a machine control arrangement. The dedication of a computer to a single numerical control system permits precise, but flexible control over production or prime tasks such as thread cutting and multi-axis contouring as well as production support tasks such as tool wear compensation, system checkout and record keeping.

BRIEF DESCRIPTION OF THE DRAWINGS

A better understanding of the invention will be had from consideration of the detailed description taken in conjunction with the following drawings.

FIG. 5 is a program flow diagram showing threading operations.

FIG. 7A is a block diagram representation of a servo control system wherein a digital device communicates with an analog device in accordance with the invention.

FIG. 7B is a schematic diagram representation of an alternate arrangement of a servo control system wherein time domain position command signals and position error signals are generated directly by a data processor.

FIGS. 7D and 7E are schematic diagram representations of a portion of the command structure shown in FIG. 7A which is common to all controlled axes.

DETAILED DESCRIPTION OF THE INVENTION

Figure 1A:
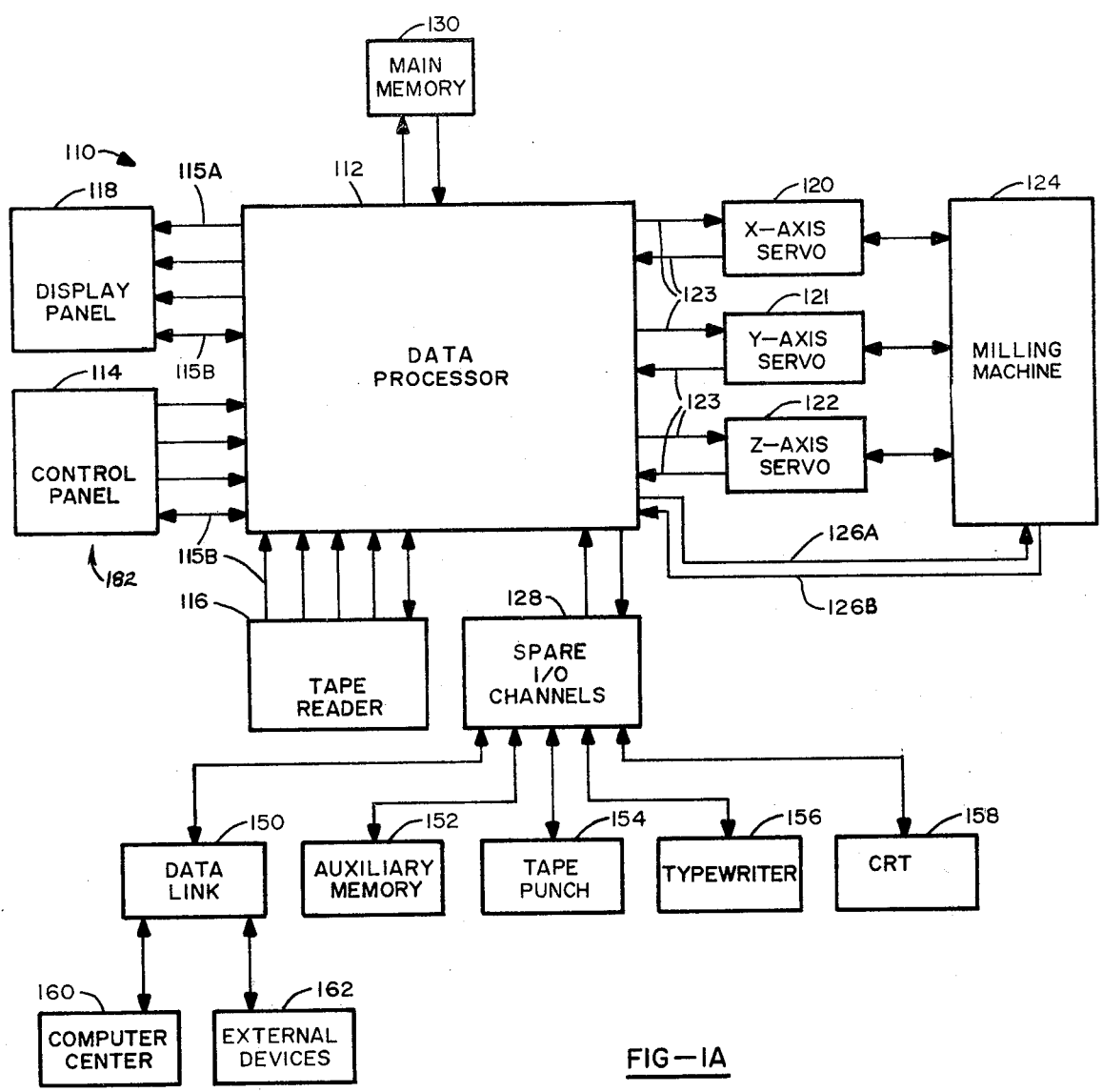
FIG. 1A is a block diagram of the system of the present invention.

The numerical control system of this invention can take any of a number of possible forms. A preferred embodiment of the present invention is shown in FIG. 1A and will be described in detail hereafter.

By way of introduction of the illustrated embodiment, the components shown in FIGS. 1 through 7 of the drawings have been assigned general reference numerals and a brief description of each such component is given in the following description. The components in each figure have in general been assigned three digit reference numerals wherein the hundreds digit of the reference numerals corresponds to the figure number. For example, the components in FIGS. 1A and 1B have reference numerals between 100 and 199 and the components in FIG. 2 have reference numerals between 200 and 299 except that the same component appearing in successive drawing figures has maintained the first reference numeral.

This continuation-in-part to the previously referenced application Ser. No. 101,881 describes the interactive machine control capability provided with the system of that referenced application.

The system shown in block diagram form in FIG. 1A is described in detail in the copending patent applications set forth under Cross Reference To Related Applications above and incorporated by reference. A brief description of the system is presented under System Description hereinafter. Further, preferred embodiments of various system arrangements are described in sections entitled Tape Reader, Data Processor, Interactive Control System, and Servo Command Structure hereinafter. These arrangements are described in further detail in the related copending patent applications that are incorporated by reference. Still further, a brief description of data processor interface instructions is presented under Instruction Repetoire hereinafter. A detailed description of the data processor instruction repetoire is provided in the parent application, Factored Data Processing System For Dedicated Applications Ser. No. 101,881 filed on Dec. 28, 1970 and incorporated by reference herein.

Figure 1B:
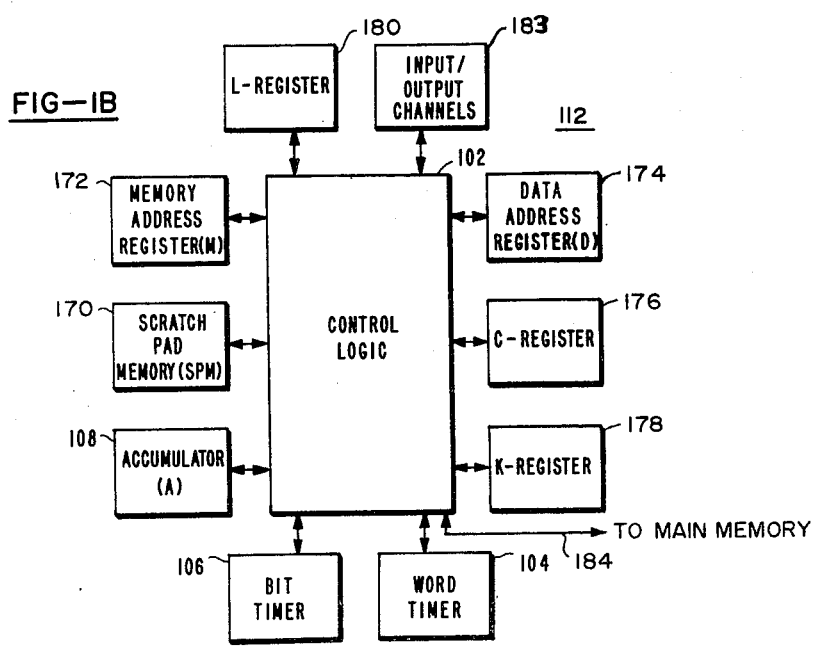
FIG. 1B is a block diagram of the data processor in accordance with FIG. 1A.
Figure 2:
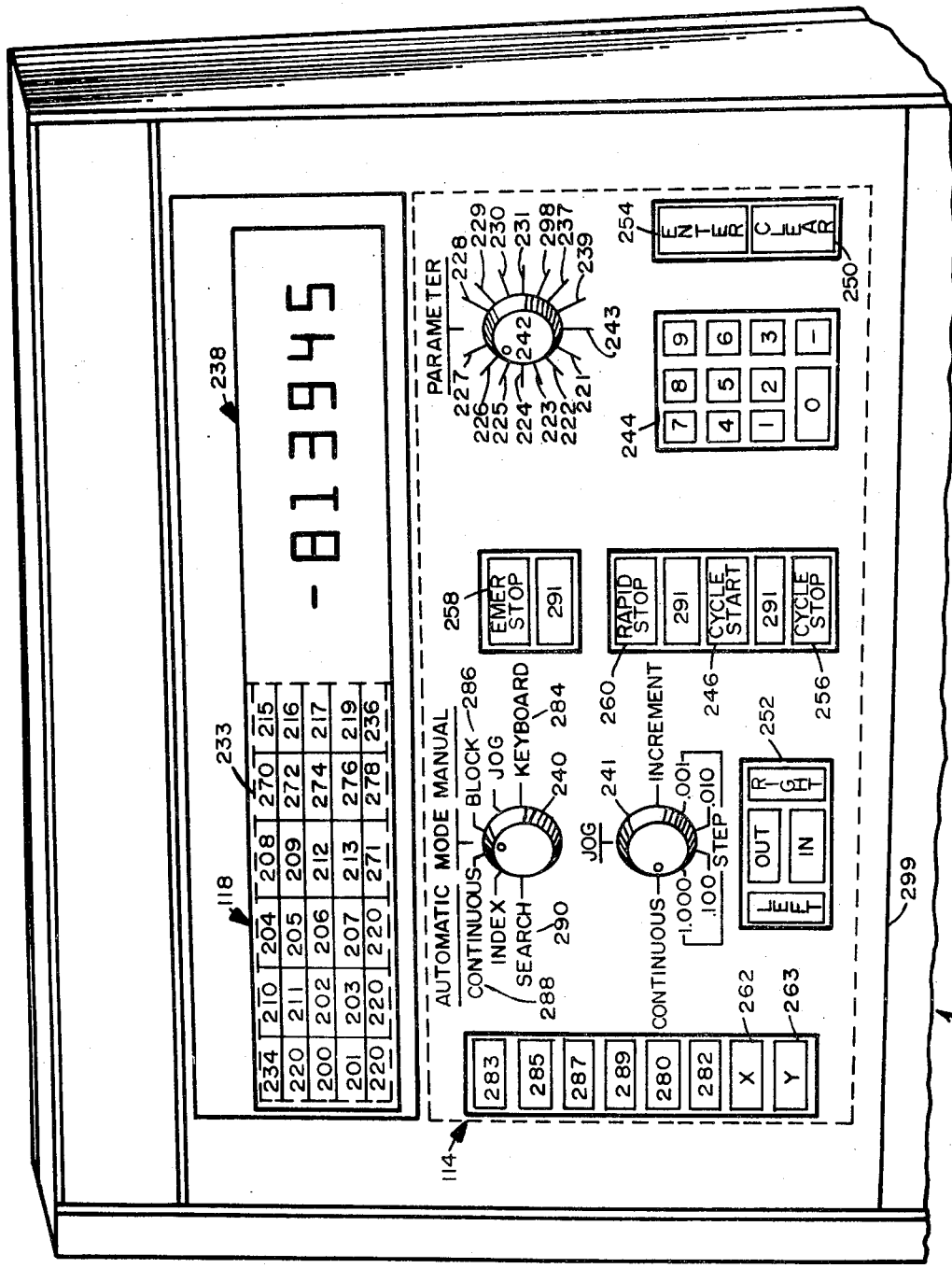
FIG. 2 is a diagram of an operator panel in accordance with FIG. 1A.

FIGS. 1A, 1B, and 2 of this application are generally the same as FIGS. 1, 4, and 2 respectively, of the previously referenced application Ser. No. 101,881; with minor changes such as with the assignment of reference numerals to make those figures compatible with the form of this application.

The elements in FIG. 1A are either described in detail in the copending patent applications or are well known elements. The system 110 is described in the parent application Factored Data Processing System for Dedicated Applications at pages 1–16. Data processor 112 is described in detail in the parent application Factored Data Processing System for Dedicated Applications at pages 16–18 and 34–102. Input/output channels such as auxiliary channels 128 are described in detail in the parent application Factored Data Processing System for Dedicated Applications such as at pages 83–84. Tape reader 116 is described in detail in the parent application Factored Data Processing System for Dedicated Applications such as at page 32. Operator panel 182, comprising control panel 114 and display panel 118, is described in detail in the parent application Factored Data Processing System for Dedicated Applications at pages 19–31 and in the copending patent application Interactive Control System at pages 1–19. Servos 120–122 are described in the parent applications Factored Data Processing System for Dedicated Applications at pages 32–34 and 84–88, Control System and Method at pages 1–23, and Control Apparatus at pages 1–33. These disclosures are provided in detail in the copending applications and are incorporated herein by reference. Other elements such as data link 150, auxiliary memory 152, tape punch 154, typewriter 156, CRT 158, computer center 160 and various external devices 162 are well known in the art.

The system of this invention will now be described, where the previously referenced application Ser. No. 101,881 provides the preferred embodiment of this invention. A computerized numerical control system 110 is shown in FIG. 1A. The data processor 112 communicates with a control panel 114 and a display panel 118, also shown in FIG. 2, over signal lines 115. A main memory 130 contains a stored program for the data processor 112. In one embodiment, this main memory 130 is a core memory and is also used to store a parts program. A tape reader 116 is primarily used to load a parts program. In one mode of operation, this tape reader 116 is used to access the parts program for execution by the data processor 112 to control a machine 124. In another mode of operation, this tape reader 116 is used to access the parts program for loading a parts program memory, which may be either portion of the main memory 130 or an auxiliary parts program memory.

The machine 124 is controlled with multiple axis servos 120, 121, and 122 operating from data processor real-time command signals 123 and is controlled with various auxiliary command signals 126. These command signals are provided by the data processor 112 which accesses a parts program and computes the command signals required to command the machine 124 to execute the parts program.

The data processor 112 accepts parts program commands at a data rate and at operating times dictated by the source of parts program commands and by the numerical control system operations. The machine 124 requires commands at a rate dictated by the machine considerations such as machine dynamics for contouring; discussed in the previously referenced application Ser. No. 134,958; and machine response time such as for tool change and spindle speed change requirements. These machine command requirements place a real-time operation constraint on the control system 110. Real-time machine commands are herein intended to mean commands to the machine 124 with time constraints dictated by machine requirements.

The data processor 112 may be any well known data processor arrangement such as a well known mini-computer; but, in a preferred embodiment, is the data processor described in detail in the parent application, Factored Data Processing System for Dedicated Applications. Because the specific data processor architecture is not a part of the invention described and claimed herein, the detailed design of the data processor will not be described herein, but is incorporated by reference from the parent application Factored Data Processing System for Dedicated Applications.

Computer programming techniques are well known in the prior art. Programs may be defined in a descriptive text form, in a compiler language such as Fortran, in an assembler language, or directly in the "machine language" of a particular computer. For illustrative purposes, flow charts are widely used to define computer programs. For simplicity of illustration, the program operations associated with one embodiment of this invention are exemplified with descriptions and flow charts. These descriptions and flow charts are in a form well known in the programming art and may be converted to other programming descriptions such as compiler, assembler, and machine languages by those skilled in the programming art. Such well known programming techniques are described in the prior art literature such as PROGRAMMING: AN INTRODUCTION TO COMPUTER LANGUAGES AND TECHNIQUES by Ward Douglas Maurer for Holden Day Inc. (1968); PROGRAMMING FOR DIGITAL COMPUTERS by Joachim Jeenel for McGraw Hill (1959); FUNDAMENTALS OF FLOWCHARTING by Thomas J. Schriber for John Wily and Sons (1969); and ELEMENTS OF COMPUTER PROGRAMMING by Swallow and Price for Holt, Rinehart, and Winston (1965); incorporated herein by reference.

Parts program information is typically accessed by a punched tape reader 116 but may be obtained from other sources; where the use of alternate sources of parts programs is presented in the previously referenced application Ser. No. 101,881 particularly page 22 lines 4 through 7 and other descriptions therein. One source may be a remote large scale computer system that generates the parts program with an APT compiler, then transmits this program over a data link 150 to the numerical control system 110. The data link 150 could be a telephone line or other well known means with appropriate terminal devices such as modems that are well known in the art. This data link 150 would connect to this numerical control system 110 through the auxiliary I/O channels 128 for access of the data by the data processor 112. Another source of parts program data is from a typewriter 156 such as a Teletype model ASR-33 or from other well known sources of digital information such as computer peripherals.

The parts program memory in one embodiment is a portion of the data processor main core memory; but may be a drum memory, disc memory, shift register memory or other such memory well known in the computer art. This parts program memory may be an internal part of the numerical control system 110 as with the main memory 130 and the data processor scratch pad memory, or may be a peripheral of the numerical control system 110 with communication through the spare I/O channels 128. In some cases interface controllers such as a disc memory controller may be required with the peripheral memory. These memories, controllers, and associated devices are well known in the computer art.

A well known auxiliary input and output channel 128 is a 110 baud auxiliary channel for communication with a typewriter such as a Teletype Corporation Model ASR-33, a data link 150, an alpha-numeric CRT 158, a remote large scale computer center 160, or other devices. This 110 baud auxiliary channel provides serial data at a rate of approximately 110 bits per second. Eleven bits are required for each word; comprising a start pulse, eight data pulses and two stop pulses. In this invention, the data processor 112 performs the timing, control, sequencing, and buffering operations associated with the signal processing and command signal generation under program control, thereby eliminating the requirement for prior art interface control devices.

The versatility of the control panel 114 and display panel 118 are presented in the previously referenced applications Ser. No. 101,881 and Ser. No. 101,449. This versatility permits the lamp displays 218, the momentary switches, and the selector switches to be assigned various functions, as described below.

The momentary switches may be assigned various functions such as Optional Stop 283, Block Delete 285, EIA and ASCII Codes 287, English and Metric Units 289, CNC Source Select 280, CNC Mode 282, Mirror Image 262, Mirror Image 263, Jog 252, Emergency Stop 258, Rapid Stop or Slide Hold 260, Cycle Start 246, Cycle Stop 256, Enter 254, Clear 250, and various spares 291, 292, 293, 294, and 295. These switch assignments can be changed and the execution can be defined under data processor program control.

The lamp displays may be assigned various functions such as Power On 234, Error 236, CNC 270, Execute 272, Edit 274, Delete 276, Record 278, Optional Stop 200, Block Delete 201, Spindle CW 202, Spindle CCW 203, X Reverse 204, Y Reverse 205, Z Reverse 206, B Reverse 207, EIA Code 208, ASCII Code 209, English Units 210, Metric Units 211, Slide Hold 212, Cycle On 213, Cycle Off 271, and various spares 215, 216, 217, 219 and 220. These lamp display assignments can be changed and the execution can be defined under data processor program control.

The selector switch such as the Parameter selector switch 242, can be assigned various functions. For a Milling machine the assignments can be X Axis 227, Y Axis 226, Z Axis 225, B Axis 224, Sequence Number 223, Spindle Speed 222, I Arc Center 228, J Arc Center 229, K Arc Center 230, M Command 231, G Command 232, Feedrate 237, Feedrate Override 239, Cutter Compensation 243, and spare 221. For a lathe the assignments can be X Axis 227, Z Axis 226, Sequence Number 225, Spindle Speed 224, Turret Select 223, Tool Offsets 222, I Arc Center 228, K Arc Center 229, M Command 230, G Command 231, Feedrate 232, Feedrate Override 237, and spares 221, 239, and 243. These selector switch assignments can be changed and the execution can be defined under data processor program control.

System Description

By way of example, a factored computer system is represented in block diagram form in FIG. 1A as a numerical control system 110, including an electronic data processor 112, arranged in accordance with the invention. The specific example referred to here and described hereafter relates to a three-axis controlled milling machine, but it will readily be appreciated that systems in accordance with the invention may be applied to a wide variety of tasks including communication, process control, processing of business data and other control functions such as photo optical pattern generators and multiturret machines.

In accordance with the basic concepts of a factored electronics system, the numerical control system (FIG. 1A) provides an illustration of this factoring process. The data processor is used in conjunction with the various extremities of the system where some of these extremities are elemental extremities. The data processor has a distributed characteristic, where the raw instruction signals comprised of micro operation and operand address signals are communicated in intrinsic signal form to the interface assembly which is physically distributed and set apart from the data processor 112 and the various extremities that communicate with the data processor through this input-output structure.

The data processor 112 is shown by way of this example to be used in conjunction with a core memory 130. The basic architecture of this data processor will permit an integrated circuit memory, such as a read-only memory (ROM), or a random-access memory (RAM) or flip-flop type memory to be substituted for the core memory 130 to provide a completely integrated circuit computer which might be called a monolithic computer.

The architecture of the computer is oriented towards a factored computer system to permit the data processor to operate in close conjunction with the extremities for this factored computer system. The special organization and instruction repertoire aid in implementing this factored computer system.

The control panel operates with the data processor in a mutually interdependent fashion to yield interactive capability for operator functions.

The photoelectric tape reader 116 is an extremity that inputs part programs to define the part to be cut by the milling machine 124. The real time non-adapted signal form 115B intrinsic to the tape reader 116 includes not only data but taper reader characteristics caused by photo-optical, electromechanical, and electrical effects that are inherent to the tape reader, described in the referenced application A Method And Apparatus For Processing The Digital Output Of An Input Means. The data processor accepts these intrinsic signal forms directly from the tape reader and derives the required data from the ambiguity and errors present in this intrinsic signal form.

The milling machine 124 is an extremity of the system which can be implemented as an elemental extremity in conjunction with the data processor. Direct control of the various machine functions, such as storing the tool position, compensating for tool characteristics, and controlling a turret motor for tool selection, reduce the machine interface that is often implemented with relay logic and other such "magnetics". The machine axes pickoffs in the square-wave servo loop can be used directly by the data processor to derive position, velocity and acceleration information pertaining to the motion of machine axes.

The axes servos 120, 121, and 122 are a typical example of elemental extremities. The communication between the data processor and the axes servos is in a signal form wherein the whole number aspect is intrinsic to the data processor and wherein the squarewave aspect is intrinsic to the axes servos. This intrinsic signal form simplifies the communication interface between the data processor and the axes servos and relieves limitations previously imposed on servos for numerically controlled machines.

The operative dispersion associated with this factored computer system is typified by the multi-axes contouring capability of the system. The data processor performs the contouring computations in whole number form intrinsic to the data processor and generates the resultant whole number commands for the axes servos. The operative dispersion provides extremely high levels of performance with a significant reduction in hardware and a reduction in the computational burden placed on the data processor. The intrinsic signal forms of the servos have a whole number square wave characteristic that is acceptable to the data processor in a non-adapted form to provide interactive communication between the data processor and the axes servos to provide adaptive control capability with this elemental extremity. The axes servos illustrate an elemental extremity that can yield a high level of economy and versatility with a reduced burden on the data processor together with the additional capability of adaptive control.

The present invention more particularly incorporates the normal computer functions of controlling, performing mathematical operations, and storing data into a physically distributed, operatively dispersed system providing concurrent internal control of coaction with associated extremities. Although interfacing is not prohibited, these systems utilize substantially direct communication with elemental subsystems as needed for a chosen class of tasks.

Specific data processor features include an adaptive memory control power interrupt technique preventing detrimental system operation and a memory protect technique creating inalterable fields in an electrically alterable memory. Functional modifiers permit shortened program instructions without sacrifice of program capability or flexibility.

One technical area in which systems in accordance with the invention have particular advantage is in the control of multi-axis machine tools and the control of photo optical plotters to provide output products. Other areas of particular advantage include the processing of communications and business data, for instance, payroll processing and inventory control. In all of these applications the system can receive rudimentary data in real time intrinsic signal form from an elemental extremity such as an axis servo, process the non-adapted intrinsic signals, and provide data to the system. The system in turn commands an output device in a signal form which may be readily useable by or intrinsic to the output device, such as a servo system. Use of the physical distribution and operative dispersion of the system in conjunction with processor-dependent elemental extremities operating in non-adapted language modes permitting great versatility to be attained with low manufacturing cost. Furthermore, orientation of the system to a different class of tasks involves no significant redesign, but primarily involves changes in the data processor program.

A general purpose data processor in accordance with this invention may include multiple data and program registers, a random access memory and a scratch pad memory, and non-buffered, directly coupled input-output lines connected to elemental input-output manifesting devices. These elements perform basic or prime functions and are physically distributed at different locations in the system, with operative dispersion making them functionally available throughout the system. This system comprises a numerical control machine, e.g. for three axis controlled milling machine, and closely integrates the operator and other input and output functions into the numerical control tasks. Minimal structure input-output extremities in this particular example comprise an elemental tape reader 116 and operator panels 114 and 118, servos 120, 121, and 122 for independent tool axis control and a passive data display 118. The data processor, in real time, concurrently monitors these extremities, pre-processes the external manifestations into machine-adaptable or intrinsic data, and generates extremity intrinsic or extremity-adapted extrinsic commands. The system concurrently operates under programs control to perform the other aspects of the task, including carrying out complex computations for tool path control, generating servo commands for each of the controlled axes, sequencing through the program, providing other machine controls and generating graphical and printed output data if needed.

Part program inputs are provided by a photoelectric punched tape reader having Model No. RRS0304RA, manufactured by Remex Electronics.

Data and program storage is provided by a core memory 130 which may be a commercially available memory having Part No. 909838-A01, manufactured by Electronic Memories, Inc. This is an 8 bit 4096 word core memory which is primarily devoted to program storage. Remaining portions may be used for data storage if desired. In this application, the core memory 130 (CM) may be replaced by a read-only memory (ROM) such as a MOS FET read only memory sold commercially by General Instruments Corporation of Hicksville, N.Y. or flip flop memory.

In a typical, very generalized example of the operation of the system of FIG. 1A for control of a milling machine 124, the data processor 112 accepts part program data from the tape reader 116 and operator inputs from the control panel 114 to commence the computation of servo commands. As the reader 116 and panel 114 are operated, however, the processor 112 is under program control to monitor the operative states and pre-processes the rudimentary data itself. Concurrently, and also under program control, the display panel 118 is activated by exciting the passive elements to form desired characters at a flicker-free rate. These time related monitoring and pre-processing sub-task functions concerned with the extremities continue to be carried out as needed as the processor 112 enters into its computational and processing functions concerned with its main task, that of executing the part program in real time. Thereafter, command data is translated into servo commands for the individual servos 120, 121, and 122, in intrinsic servo signal form. Feedback signals in the intrinsic servo format are likewise returned to the processor 112, pre-processed for conversion into the processor base language and utilized in further computations.

Programming of computers is a well known art and is described in detail in the prior art literature such as PROGRAMMING: AN INTRODUCTION TO COMPUTER LANGUAGES AND TECHNIQUES by Ward Douglas Maurer for Holden Day Inc. (1968); PROGRAMMING FOR DIGITAL COMPUTERS by Joachim Jeenel for McGraw Hill (1959); FUNDAMENTALS OF FLOWCHARTING by Thomas J. Schriber for John Wily and Sons (1969); and ELEMENTS OF COMPUTER PROGRAMMING by Swallow and Price for Holt, Rinehart, and Winston (1965); incorporated herein by reference. The programs to provide data processor operations described hereinafter will be obvious to those skilled in the programming art from the descriptions of those desired operators. Further, coding of programs for use with the particular computer described herein will be obvious to those skilled in the program art from the description of computer instructions provided hereinafter.

There are profound differences between systems thus arranged and operated and systems of the prior art. In the physical and operational sense, the data processor 112 is a much greater portion of the whole, and the associated units 114, 116, 118, 120, 121, and 122 are extremities of the processor 112. These extremities, which may not be independent in terms of control, are largely directly coupled to the processor 112. Each elemental extremity has certain characteristic relationships to the system, although other differences necessarily exist. Each relies essentially upon the operatively dispersed program capabilities of the processor 112. Each further effectively relies upon the processor 112 for pre-processing of the non-adapted signal forms for interpretation of signals and meaningful time related data transfer. In this respect, digital buffering, conversion, and signal conditioning functions ordinarily provided by interface logic circuits are also avoided. Furthermore, the processor 112 itself need not be tailored in configuration to cooperate with pre-determined interface formats and requirements. In a further respect, the data processor presents data or accepts data in real time from/to system extremities in intrinsic signal forms such that the processor itself can effect the significance of such terms.

Elimination of physical identities are representative of what is herein termed physical distribution, where the processor 112 can be distributed throughout the preponderance of the task-performing system. Yet, by virtue of the operational dispersion of the system and other prime functions, this task-performing system may readily be modified, with a minimum of hardware changes to perform another task. Such change entails the essential modification of the system program, and also modification of the subtask programs, and their relation to the task-pertinent program. It should be appreciated that the operative dispersion of the system encompasses and eliminates much of the interface circuitry that is redundant when used in conjunction with a data processor.

For the performance of many tasks, as in the numerical control field, systems in accordance with the invention can utilize a relatively small-scale computer without overloading. Concurrent performance of the subtasks does not in the usual instance result in excessive demands on the processor. To the contrary for numerical control systems, the general purpose computational capability of the system hereinafter described can generally be utilized to perform many functions such as contouring functions.

The data processor 112 is organized to operate in a manner somewhat similar to presently known stored program digital computers. The fundamental theory and technology of such presently known systems are described in Chapter 11 of *Digital Computer Design Fundamentals*, Yaohan Chu, McGraw-Hill Book Co., Inc. (New York, 1962) incorporated herein by reference.

The data processor is organized to process 8 bit words with most working and storage registers having a 16 bit capacity permitting the storage of two words. Serial transfer of data is used throughout the data processor 112 to minimize the logic and interconnections required.

The data processor 112 includes a 12 bit memory address register (M Register) which defines a memory location being accessed in the main memory 130. A memory data register (D-register) defines an operand location such as in the scratch pad memory and input-/output (I/O) channels. Thirty two Scratch Pad Memory (SPM) Registers provide convenient intermediate storage, independent of the main memory. A three bit counter divides the execution of program instructions into word times and a four bit counter subdivides the word times into bit times, the basic operating intervals.

The data processor operates by executing programmed instructions received from the main memory. When an instruction is received, control logic causes the data processor to progress through a matrix of micro operations, the exact path varying with the instruction being executed. Each micro operation occurs during one of the eight possible word times, 0 thru 7, and performs a micro operation portion of the instruction being executed. Upon completion of the FZ micro operation the data processor recycles through the matrix to begin execution of the next instruction.

Tape Reader

Referring now to FIG. 1A, the taper reader 116 may be a commercially available paper tape puncher and reader such as Model RRS0304RA manufactured by Remex Electronics. However, it has been found that by implementing this tape reader 116 as an Elemental Extremity and using the Intrinsic Signal Form concept and Operative Dispersion concept, significant advantages can be achieved. These advantages are described in detail in copending application, "A Method and Apparatus For Processing The Digital Output of an Input Means," Ser. No. 879,293 filed Nov. 24, 1969, by Gilbert Hyatt and incorporated herein by reference. This referenced application is now abandoned in favor of the present application. Generally, the system operates by having the data processor sample the output of the tape reader 116 at a cyclic rate which is much faster than the operation of the tape reader 116 in a manner similar to the sampling of the control panel outputs. Punching and formatting of the paper tape is in accordance with EIA standards RS-274-B, interchangeable perforated tape variable block format for contouring and contouring/positioning numerically controlled machines, incorporated herein by reference.

Data Processor

A general purpose data processor is provided with the digital portions fully implementable with integrated circuits. Thus, an integrated circuit read-only memory (ROM) provides an example of a capability not found in present data processing systems. Other examples are a random access memory (RAM) and other types of flip-flop memories used alone or in combinations of integrated circuit memories for this processing system.

As shown in FIG. 1A, the data processor 112 receives data from the various input sources, performs calculations or otherwise manipulates data in accordance with the input information and outputs processed information to control the milling machine 124 through servos 120, 121 and 122 and auxiliary control signals 126A and 126B. The data processor is built from series SN7400 integrated circuits manufactured by Texas Instruments, Inc. which are located on a series or printed circuit boards. These printed circuit boards plug into a Mother board which provides necessary interconnections between the terminals of the printed circuit boards.

The architecture of the data processor 112 lends itself to a fully integrated circuit computer mainframe where all of the logic may be implemented with integrated circuits in a conventional manner and additionally includes an integrated circuit scratch pad memory (SPM). Further, this data processor 112 has the architecture to use an integrated circuit read-only memory (ROM) in place of or in addition to a core memory such as for the main memory 130 providing a data processor with the digital portion constructed wholly of integrated circuit components.

In a somewhat simplified block diagram, the data processor 112 is shown in FIG. 1B as control logic 120 interconnecting registers, timers and communication channels. Signal definitions are provided to permit those knowledgeable in the art to identify the various connections between boards.

The basic timing functions of the data processor 112 are performed by a word timer 104 and a bit timer 106. The fundamental synchronization of the central processor 112 is provided by an 8 MHz clock signal which is included as part of the control logic 102. The synchronizing clock signal is an asymmetric square wave, the positive portion of which is designated $P_3$ and the negative portion of which is designated $\overline{P_3}$. The asymmetrical character of the clock signal permits a longer clock period for stabilization of propogation delays without sacrifice of processing speed. The word timer 104 is a three-bit counter with associated decode logic. It counts from 0 to 7 as the data processor cycles through the micro operations during the performance of an instruction with each micro operation being performed in a different word time. The associated decode logic provides eight output lines, each being true during one of the eight different counting states of the word timer 104. These output signals are used by the control logic 102 for sequencing the data processor through the micro operations associated with an instruction. The bit timer is a four-bit binary counter with associated decode logic. The bit timer 106 counts down from 15 thru 0 and consequently the associated decode logic has 16 output lines, each going true during a different one of the 16 possible counts of the bit timer 106. The bit timer 106 provides sequencing and timing within a given micro operation or word time.

An accumulator (A-register) 108 is the basic arithmetic register and is used as the repository of the results of arithmetic and logical operations. It is also the source and destination of the input/output (I/O) parameters. The A-register is a 16 bit serial in, serial out shift register. Associated with the A-register 108 is a serial full adder which in FIG. 1B is included within the control logic 102.

A scratch pad memory (SPM) 170 provides storage for intermediate parameters such as computational results, return addresses, indexes and other pertinent information. The SPM 170 provides rapid internal storage without the need for transferring data to the main memory 130. It is a group of 32 16 bit serial in, serial out registers which are divided into two pages with 16 registers on each page. Paging is accomplished by toggling a flip-flop, which is automatically set to page 0 when the power is turned on. When the SPM is set to page 0, the data processor acts as if page 1 did not exist; and similarly, when the SPM is set to page 1, the data processor acts as if page 0 did not exist. All of the SPM registers can be used for the storage of information, but some of them are primarily associated with specific functions to increase the efficiency of the data processor. The $SPM_0$ register is generally used as a TX instruction register (decrement and transfer on non-negative) where the index byte to identify the $SPM_0$ register is automatically assumed and need not be programmed in conjunction with the TX instruction. The $SPM_2$ register is used for return address associated with the execution of transfer-type instructions. In addition the $SPM_2$ register is used as the intermediate register for operands obtained from the constant memory portion of the main memory. The first eight SPM registers can be used for index or TX instructions in addition to scratch pad operations.

A memory address register (M-register) 172 holds the 12 bit address of an eight-bit byte to be accessed from the program memory. The M-register is a 12 bit shift register having the capability to address up to 4,096 different memory locations. It has a serial input and both serial and parallel outputs. Associated with the M-register but represented as being within the control logic 102 is a serial full adder which increments the M-register to access sequential instructions or, as applicable, the next two bytes of in-line instructions. The M-register is incremented by two for a TX instruction when the condition for that transfer is not met, resulting in a skip of two bytes. The M-register is incremented by three for a skip-on-discrete (SD) instruction. The M-register is exchanged with the $SPM_2$ register for transfer type instructions and exchanged with a data address register (D-register) 174 to access operands from the main memory. The M-register is also exchanged with the $SPM_2$ register at the start of an ST instruction which causes the contents of the A-register to be stored in the main memory when implemented with a core memory.

The data address register (D-register) 174 is a 12 bit shift register that usually contains an operand address and is used to select: (a) SPM register, (b) I/O channel, and (c) number of shifts, depending upon the type of instruction being executed. The D-register has a serial input and serial output, with the eight least significant bits ($D_0$–$D_7$) having parallel outputs in addition.

A C-register 176 is composed of six flip-flops designated $C_3$, $C_2$, $C_1$, $C_0$, $K_{11}$, and $K_{10}$ which store the six most significant bits of an eight-bit instruction byte obtained from program memory. The flip flops $C_3$ through $K_{10}$ store the instruction bits designated $I_7$, $I_6$, $I_5$, $I_4$, $I_3$ and $I_2$, respectively as received from the main memory interface lines (I). These instruction bits are held by the C-register during the performance of an instruction to control the sequence of micro operations executed during the performance of the instruction.

An element designated K-register 178 is not a single register but rather a group of miscellaneous flip-flop for various functions. The $K_6$ and $K_9$ flip flops are not mechanized. The $K_0$, $K_1$ and $K_2$ flip-flops are used primarily to control sequencing through the micro operations. The $K_1$ flip-flop is also used to store the sign of the operand in the A-register and the sign of a decremented number during a TX instruction. The $K_2$ flip-flop is also used to extend the A-register during a shift left operation where the $K_2$ register acts as the A-1 stage of the A-register. The $K_3$, $K_4$, and $K_5$ flip-flops may be grouped together and designated the KA-register and may be used to store the address of the index. The KA-register is also used as an extension of the A-register during a shift left operation with $K_3$ as the A-2 stage, $K_4$ as the A-3 stage, and $K_5$ as the A-4 stage of the A-register. The $K_7$ flip-flop is primarily used as a carry flip-flop in conjunction with the A-register full adder. It is also used in the FK micro operation in the transfer of the D-register contents to the M-register as a shift left operation to multiply the D-register word address by two to obtain the M-register byte address. The $K_8$ flip-flop is used as a carry flip-flop in conjunction with the M-register full adder. As previously described, the $K_{10}$ and $K_{11}$ flip-flops form the two least significant bits of the C-register.

An element designated L-register 180 is, like the K-register, a group of miscellaneous flip-flops performing control functions. The most significant is the $L_1$ flip-flop which controls turn-on and turn-off of the data processor.

Input/output (I/O) channels 183 include whole number and discrete channels. The whole number channels connect the A-register with the various entities and extremities. The whole number I/O channels are arranged in pairs so that as the output from the least significant bit ($A_0Q$) of the A-register shifts information to an output channel with a corresponding input channel simultaneously shifting information into the A-register through the input to the most significant bit ($A_{15}D$).

A data path 184 provides two-way communication between the data processor and the main memory. This path carries the main memory address stored in the M-register and transfers operands to or from the main memory.

Instruction Repertoire

The program instructions for the numerical control system 110 are encoded as 8-bit bytes, each byte being stored in a different program memory location of the program memory. The instructions may have multiple bytes, but most have a length of only 1 byte. Each instruction contains an operation code in the most significant portion, and, when required, an operand address in the least significant portion. Indexing is achieved with an index functional modifier byte preceding the instruction whose operand address is to be indexed. Operands can be located in any of the SPM Registers, the constant memory part of the program memory, or in the two program memory bytes following an instruction (in line).

EX (input/output word) 1010-$I_3I_2I_1I_0$

This is a one-byte indexable instruction wherein the four most significant bits identify the operation code and the four least significant bits identify and I/O channel address. The contents of the A-register are output to the addressed channel while the contents of the addressed channel are simultaneously loaded into the A-register. A shift enable signal is output to gate 16 clock pulses to the selected channel.

FAB—$C_3Q \cdot \overline{C_2Q} \cdot C_1Q \cdot \overline{C_0Q} \cdot W1$. The FAB microoperation occurs in word time 1 and has a duration of 16 bit times. The contents of the A-register are shifted to a selected output channel while the contents of a selected input channel are simultaneously shifted into the A-register.

The data processor can generate discrete outputs (DO) to meet specific requirements under program control. The DO assignments are:

DO-0 Set interrupt enable.
DO-1 Provide clock pulses to ASR-33 (TELETYPEWRITER).
DO-2 Provides a clock to set the power turn-on interrupt, $L_1$. A DO-2 instruction (1100–0010) will be contained in program memory location $40_{16}$ to reset $L_1$ during power turn-on.
DO-3 Iteration timer reset.
DO-4 Trigger to $I_2$ latch, the discrete input 4(DI-4) toggle. The $I_2$ flip-flop is automatically zero set during the power on sequence.
DO-5 Trigger to $I_3$ latch, the discrete input-5(DI-5) toggle. The $I_3$ flip-flop is automatically zero set during the power turn-on sequence.
DO-6 Trigger to the $I_4$ latch, the discrete input-6 (DI-6) toggle. The $I_4$ flip-flop is automatically zero set during the power turn-on sequence.
DO-7 Intensity control (2 line) (not implemented).
DO-8 Toggles the $I_1$ flip-flop causing scratch pad memory paging.
DO-9 Main memory paging.
DO-10 Spare.
DO-11 Servo set.
DC (discrete output) $110I_4$-$I_3I_2I_1I_0$ This is a one-byte indexable instruction wherein the three most significant bits define the operation code and the five least significant bits define an output channel address. A discrete output signal, an inverted 3 microsecond pulse is generated on the addressed output channel.

The data processor can operate on a discrete input (DI) with a skip-on-discrete instruction under program control. The discrete inputs are various low frequency digital signals. The purpose of the discrete inputs is to define a status or condition. The DI assignments are:

DI-0 Spare
DI-1 Skip unconditional.
DI-2 Skip on ASR-33 (TELETYPEWRITER).
DI-3 Skip on the sign of (A).
DI-4 Skip on $I_2Q$ latch (DO-4 trigger).
DI-5 Skip on $I_3Q$ latch (DO-5 trigger).
DI-6 Skip on $I_4Q$ latch (DO-6 trigger).
DI-7 Skip on logical overflow in A-register.
DI-8 Used for troubleshooting.
DI-9 Skip on arithmetic carry from A-register.
DI-10 Skip on positive.
DI-11 Skip on servo ready.
SK (skip on discrete) $111I_4$-$I_3I_2I_1I_0$ This is a one-byte indexable instruction wherein the three most significant bits identify the operation code and the five least significant bits identify a discrete input channel address. If a discrete exists on the addressed channel, three bytes (usually a transfer instruction) are skipped and the next instruction is obtained from the fourth byte following the skip on discrete instruction. If a discrete does not exist on the addressed channel, the next instruction (usually a three-byte transfer instruction) is obtained from the three bytes immediately following the skip on discrete instruction.

$FAG - C_3Q \cdot C_2Q \cdot C_1Q \cdot W1$. The FAG micro-operation occurs in word time 1 and has a duration of 12 bit times. It is used for the skip on discrete instruction. If the selected discrete is true, the M-register is clocked and incremented by three. If the selected discrete is false, the M-register is not clocked and is therefore not incremented.

Interactive Control System

Interactive control systems in accordance with the invention provide bidirectional communication between an operator and a data processing system via intermediary binary digital words. The interactive control system is an elemental extremity of the data processing system, providing unprocessed rudimentary data for a data processor and receiving preprocessed data for control of display illumination from the data processor. This elemental control system is dependent on processor coaction for performance of the task of interactive communication with an operator. The data processor operates under the control of a selected stored program to interpret input words and produce an appropriate system response, and provide output words having an appropriate format.

An elemental panel for use in systems of the type disclosed herein are processor dependent structures having means for receiving panel elements and having circuit conductors for coupling elements, and having electronic means in the conductive paths for signal processing. By this arrangement, uncommitted elements can be added or changed and the significance of given panel positions can be determined at processor option under program control without being previously committed through wired operation. The outputs of operator controllable selector switches and momentary switches are transformed to binary codes for greater efficiency. The coded outputs from the momentary switches may be gated to latches which hold the information until sampled by the data processor. Appropriate interlocks and interlock overrides may be used to control the effect of continuous depression of a momentary switch. The binary coded outputs of each selector switch and the combined momentary switch are combined to form a single intermediary input word with each binary coded output occupying a different portion of the word. The word is then sampled and interpreted by the data processor.

A display panel is composed of both lamp displays and numeric displays. Each lamp display driver is connected to a different bit of a lamp display register such that when that bit stores a binary "1" or is "set" the lamp display is lighted. The data processor provides an output word to the lamp display register comprising packed discrete lamp control bits to cause appropriate lamp displays to be lighted.

The numeric display elements may be segmented tubes, Nixie tubes, or similar devices displaying a selected character. A single numeric character display register is used to control all of the numeric displays. Output words are transferred to the numeric display register at a rapid periodic rate. One portion of these words contains a tube (element) select code identifying a particular element and a second part of the word contains a code identifying the character to be displayed. Appropriate decoding logic responsive to the numeric display register causes the appropriate segment drivers of the selected numeric display tube to be activated to display the output character. Each numeric display is then driven in turn to display a selected character. In order to refresh the numeric display at a flicker-free rate of 30 times per second, the processor places a new word in the numeric register at a cyclic rate of 30 times the number of numeric word displays desired each second. Assuming 8 numeric displays, the rate would be 240 times per second and would consume only a small part of the operating time of a modern high speed data processor.

The reduction of direct wiring connections between the interactive control system and the data processing system not only reduces manufacturing costs but provides tremendous versatility for changing system tasks to which the data processing system may be committed. Panel elements are not committed by wired connection to system circuits but are committed under program control of the data processor, providing generalized elements whose significance may be readily changed through changes in the task defining program. System controls and outputs can be varied by merely adding or deleting switches and displays and by changing associated captions in the interactive control system. Corresponding changes in data processor responses are accomplished by making appropriate changes in the stored program.

This invention provides an interactive control system establishing bidirectional communication between an operator and a data processing system. All control and data information passing between an operator and the system passes through an electronic data processor via the medium of intermediary binary digital words.

As shown in FIG. 1A an electronic data processing system 110 includes an electronic data processor 112 and an interactive control system 182. In general, the electronic data processing system may be any such system but the full advantages of this invention are best realized when used in conjunction with a system which has been committed or dedicated to a specific task or family or tasks, such as numerical control, payroll, accounting, or inventory control. It will be assumed herein, however, that the electronic data processing system 110 is committed to the task of numerical control of a milling machine.

The interactive control system 182 (FIG. 7) includes a control panel 780 as well as gates 624 and latches 620 which are physically located on available space of a printed circuit board within the electronic data processor 112 but functionally operate as part of the interactive control system 182.

As illustrated in FIG. 2, the control panel 114 and the display panel 118 are mounted in a single rectangular plane with the display panel occupying the upper portion of the plane and the control panel occupying the lower portion of the plane. The lefthand portion of the display panel is occupied by status indicator lamp displays 233 such as the Power On indicator lamp 213 and an error indicator lamp 236. These lamp displays provide feedback to the operator by indicating system modes and conditions. All status indicator lamp displays 233 are enhanced with a special filter to suppress glare and provide an easy to read, aesthetically pleasing presentation. Displays and legends that are not illuminated are obscured behind the filter, simplifying rapid appraisal of system conditions and eliminating the need to mentally separate illuminated displays from non-illuminated but visible displays. Included within the status indicator lamp displays 233 are a bank of trouble-shooting lamps such as an error indication lamp 236, which are normally obscured behind the filter, but become flashing displays if a malfunction or error should occur. The righthand portion of the display panel 118 is composed of eight numeric displays 238 which may be used to identify the magnitude of system parameters.

As described more fully in copending application "Interactive Control System", Ser. No. 101,449, filed Dec. 28, 1970, by Lee et al, and incorporated herein by reference, each lamp display 233 is driven by a well known lamp driver circuit which is controlled by one bit in a lamp display register 700. The lamp display register 700 stores an intermediary output word output from the data processor 112 which defines the status of the lamp displays 233. In contrast, the numeric displays 238 are driven sequentially in accordance with an intermediary output word stored in a numeric display register 798.

Each numeric display lamp 238 is excited at a 30 cycle per second flicker free rate under program control in accordance with information contained within a numeric display register. Since the numeric display register controls the excitation of all eight numeric display tubes 238, its content must change at a cyclic rate of $8 \times 30 = 240$ times per second. When an intermediary output word is clocked into the numeric display register, the first three bits select the one of eight lamps to be driven. The remaining bits within the numeric display register select the segments within the driven numeric display which are to be excited. This arrangement affords high versatility with reduced hardware. The operation of each numeric display is under program control and only one numeric display register is needed to drive all eight numeric displays.

The control panel, which is also described in copending application Interactive Control System, Ser. No. 101,449, filed Dec. 28, 1970, by Lee at al, has three selector switches and a plurality of momentary switches as shown in FIG. 2. The three selector switches, a Mode switch 240, a Jog switch 241 and a Parameter switch 242, are multiple position rotary switches. The Mode selector switch 40 defines one of the six operating modes of the system, the Jog switch 241 defines the machine displacement for each job command executed when in the jog mode, and the Parameter switch 242 defines the parameter to be displayed on the numeric displays 238 and, when in the keyboard mode, defines the address of the parameter to be entered through the keyboard 244. The remaining switches are momentary switches which maintain contact only so long as they are held down. The Mode selector switch 240 defines the major operating conditions of the system which are: (1) Search, (2) Index, (3) Continuous, (4) Block, (5) Jog, and (6) Keyboard. The Search position 290 of the Mode selector switch 240 permits an operator to identify a desired part program block of commands from a punched tape or from a self-contained parts program memory such as the core memory 130 in systems where this capability is provided, and then initiate an automatic search for that block of commands. A sequence number, which is used to identify the selected block of commands, is entered through a keyboard 244 made up of momentary switches. The number which is entered through the keyboard 244 is displayed on the numeric displays 238 to permit the operator to verify the number which has been entered.

The numerical control system 110 uses a zero synchronization or index point with respect to which all positions of the machine tool are defined. The Index position of the Mode selector switch 240 causes the machine tool to return to the previously defined index point. When in the index mode, depression of the Cycle Start switch 246 will cause the numerical control system 110 to drive the machine tool precisely to the index point.

The Continuous position of the Mode selector switch 240 is used only after system initialization and initial work piece setup. Depression of the Cycle Start button 246 while in the Continuous mode initiates fully automatic operation as commanded by the part program from the tape reader 116 or other source of part programs.

The Block position 286 of the Mode selector switch 240 permits an operator to control the numerical control system 110 in a semi-automatic mode for operations such as part program checkout. In this mode, the system will access a single block of commands from a part program, execute those commands, and then enter the Cycle Stop condition. When in this mode, a part program can be executed one block at a time by refraining from depressing the Cycle Start switch 246 until subsequent to the completion of execution of the previous block of commands.

The Keyboard position 284 of the Mode selector switch 240 permits operator control of the system in a semi-automatic mode. A block of part program commands can be entered through the keyboard 244, and then executed when the Cycle Start switch 246 is depressed. When commands are loaded through the keyboard the parameters will automatically appear on the numeric displays 238. Data input errors can be easily corrected by depressing a Clear switch 250 and reentering the parameter through the Keyboard.

The Jog position of the Mode selector switch permits an operator to reposition the machine tool in a semi-automatic manner for operations such as initial work piece setup or index definition. The Jog selector switch 241 and the Jog Direction switches 252 may be used by the operator to conveniently reposition the machine tool. With these basic controls, the machine can be positioned precisely to within the resolution of a system (0.0005 inch) with a minimum of effort, fixtures, readouts, and optics. The numerical control system 110 executes precision positioning commands in accordance with the distances and directions selected without burdening the operator with tedious measuring functions. In addition, the numeric displays 238 will show the machine position for positive verification while in this mode.

The Jog selector switch 241 becomes operative only when the Mode selector switch 240 is in the Jog position, and defines the machine displacement for each jog command executed. The selectable positions are: (1) Continuous, (2) 1.0000 inch step, (3) 0.1000 inch step, (4) 0.0100 inch step, (5) 0.0010 inch step; (6) Increment.

The Continuous position of the Jog selector switch 241 will cause the system to drive continuously in a direction commanded by one of four Jog Direction switches 252. These direction switches cause the machine tool to move left, right, in, or out depending upon which one of the four switches is depressed. While in the Continuous Jog position, the machine tool is driven continuously in the command direction for the duration of time that a Jog Direction switch is maintained in a depressed state. Electronic detents are implemented causing the machine to decelerate and accelerate subsequent to each one inch of translation of the machine tool. This action graphically defines and permits the operator to observe the magnitude of motion for convenient operation. In addition, continuous jogging will always terminate a precise number of inches from the starting point for accurate control of displacement.

The four step positions of the Jog selector switch cause the system to drive the machine tool a precise step distance selected each time a Jog Direction switch is depressed.

The Increment position of the Jog selector switch 241 causes the system to drive the machine tool a single precise least significant increment of distance each time a Jog Direction switch 252 is depressed, 0.0005 inch in this embodiment of the invention. When in the Step or Increment positions, regardless of whether the Jog direction switch is maintained in a depressed state for an instant or continuously, the machine will still execute only the single commanded step and then halt. Additional motion can only be initiated by releasing and again depressing a Jog Direction switch 252. This eliminates the need for rapid operator response, since the precise step commanded will be executed independent of the duration of time that a direction switch 252 is depressed.

The position of the Parameter selector switch 242 defines the parameter to be displayed on the numeric displays and, when the Mode selector switch 240 is in the Keyboard position, the block of commands being entered through the keyboard 244 is displayed. The selectable parameters for this numerical control system 10 are: (1) Sequence No. $-N$, (2) Absolute Position $-X$, (3) Absolute Position $-Y$, (4) Arc Center $-I$, (5) Arc Center $-J$, (6) Auxiliary Command $-M$, (7) Auxiliary Command $-G$.

The Sequence Number position causes the numeric displays 238 to show the address of a block of punched tape commands being read from the punched tape while in the Continuous or Block mode. The Sequence Number position of the Parameter selector switch 242 also causes the numeric displays 238 to show the sequence number being entered through the Keyborad 244 while the Mode selector switch is in the Keyboard position. This is done prior to initiating a tape search in the Search mode.

The Absolute Position location of the Parameter selector switch 242 causes the numeric displays 238 to monitor the position of the machine tool relative to the floating zero or index point. When the Mode selector switch 240 is in the Keyboard location and the Parameter selector switch 242 is in one of the Position locations, the system enters and the numeric displays 238 show the position commanded by the operator to be entered through the keyboard 244. For instance, suppose the operator wishes to position the machine tool at an X coordinate of 05.6000. To do this, he turns the Mode selector switch 240 to the Keyboard position and the Parameter selector switch 242 to the Absolute Position X, and then enters the numbers 05.6000 through the keyboard 244. At this point, the numeric displays 238 are showing the number 05.6000 and the system is ready to move the machine tool to this X position when the Mode selector switch 240 is in the Keyboard location and the Cycle Start button 246 is depressed.

In similar manner the Arc Center and Auxiliary Command locations of the Parameter selector switch 242 are used in the Keyboard mode to enter the commands from the keyboard.

There are several momentary switchs in addition to the Keyboard switches 244, Cycle Start switch 246, Jog Direction switches 252 and Clear switch 250 whose functions have previously been described. All of the momentary switches are hermetically sealed reed relay switches. A latching interlock is provided, making the system insensitive to dynamic switch conditions such as switch bounce. In addition, operation is independent of operator action such as the duration of switch depression and additional switch commands which might result in ambiguities are automatically locked out as long as one of the momentary switches remains depressed.

For operator convenience the momentary switches are grouped into functional arrays, for example, the Keyboard switches 244 and the Jog Direction switches 252.

The keyboard 244 is composed of ten numeric keys defined as 0 through 9 and a negative sign key. The zero key can be used for the plus sign when required. The numeric and sign keys of the keyboard 244 are used to enter data in the Keyboard mode and a Clear key 250 adjacent to the keyboard 244 blanks the numeric displays 238 prior to the entering of the data. An Enter key 254 causes a parameter to be accepted by the numeric control system after it has been entered through the keyboard 244 and verified by the operator's observation of the numeric display 238. In the Keyboard mode the various parameters can be varied or entered as required. Parameter verification is achieved by rotating the parameter selector switch 242 to the respective position and monitoring the numeric display 238. Parameter modification is accomplished by depressing the Clear key 250, resulting in the blanking of the numeric display 238, and the sequential depression of the sign and numeric keys of the keyboard 244, resulting in a presentation on the numeric display 238 of the newly keyed numbers. The entered parameter will automatically be accepted by the computer for processing and for display under program control.

The Cycle Start switch 246 and the Cycle Stop switch 256 are used to initiate or terminate automatic operation, respectively. When in the cycle off condition, as identified by the Cycle Off status indicator lamp 271, the operator can initiate automatic operation by depressing the Cycle Start switch 246. The system will automatically execute commands until detecting a condition that defines cycle stop which is:

(1) In the Search mode, detecting the required tape location.

(2) In the Index mode, repositioning the machine to the floating zero point.

(3) In the Continuous mode, completing the execution of a block of tape commands in response to appropriate G or M commands contained therein, or if the operator has depressed the Cycle stop switch 256.

(4) In the Block mode, completing the execution of a single block of tape commands.

(5) In the Jog mode, completing execution of the jog command.

(6) In the Keyboard mode, completing execution of a single block of keyboard commands.

When in the Continuous mode with the cycle on condition as identified by the Cycle On status indicator lamp, the operator can discontinue automatic operation by depressing the Cycle Stop switch 256. The system will complete the execution of the block of commands in process and then enter the cycle off condition as identified by the Cycle Off lamp.

When the system is in a mode other than the continuous mode with the cycle on condition, it is not necessary for the operator to depress the Cycle Stop switch to discontinue automatic operation, because all modes other than the Continuous mode execute a single set of commands and then automatically enter the cycle off condition. An Emergency Stop switch 258 is used to discontinue automatic operation rapidly and to force the system into a reinitialization condition. It will then be necessary to perform the system initialization sequence prior to operating the system. The system initialization sequence involves:

(1) position the Mode selector switch 240 to the Jog position.

(2) jog the machine tool to the index position.

(3) position the Mode selector switch 240 to the Index location.

(4) depress the Cycle Start switch 246 to load the index position of the machine tool.

(5) if required, load the punched tape in the tape reader 116.

The Jog Direction switches 252 are used by the operator to define the direction of motion and to initiate this motion, but only if the system is in the Jog mode. In addition, the position of the Jog selector switch 241 will define the type of motion, i.e. Continuous, Step, or Increment. The jog directions of (1) Right, (2) Left, (3) In, and (4) Out, are defined by facing the machine from the control panel side.

The rapid stop switch 260 causes all machine motion to stop immediately, but permits operation to be resumed with the Cycle Start switch.

A pair of Mirror Image switches 262, 263 are used to selectively reverse the commanded directions of motion. Alternate depression of the X or Y mirror image switches 262, 263, respectively, will cause the mirror image status indicator lamps contained in the bank of lamp displays 233 to change state from +X or +Y to −X or −Y and conversely. The operational condition presented on the mirror image status indicator lamps defines to the operator system conditions.

The control switches of the control panel are not hard wired directly into the control panel lamps and other functions. Instead, the central data processor periodically samples the status of the various switches under program control. The data processor then further acts under program control to operate the various entities of the system in accordance with the status of the control switches. Because the switches are sampled in this way as opposed to being hard wired, the basic numerical control system can be used for a different but related application by merely providing different extremities, changing the designations associated with the various switches, and changing the program which interprets the various switch positions and causes the system to react accordingly. In addition, existing switches can be easily deleted or, if desired, spare capacity permits the addition of either extra momentary switches or extra selector switches or even additional positions of existing selector switches.

In order to reduce the number of wiring connections and facilitate convenient processing, the individual switches and switch positions are first encoded into a binary format before being presented to the central processor 112. The six positions of the Mode selector switch 240 are encoded into three binary bits as follows:

TABLE I

| M2 | M1 | M0 | |
|----|----|----|---|
| 0 | 0 | 0 | Spare |
| 0 | 0 | 1 | Block |
| 0 | 1 | 0 | Continous |
| 0 | 1 | 1 | Search |
| 1 | 0 | 0 | Keyboard |
| 1 | 0 | 1 | Jog |
| 1 | 1 | 0 | Index |
| 1 | 1 | 1 | Spare |

Similarly, the six locations of the Jog selector switch 241 are encoded as follows:

TABLE II

| J2 | J1 | J0 | |
|----|----|----|---|
| 0 | 0 | 0 | Spare |
| 0 | 0 | 1 | Continous |
| 0 | 1 | 0 | 1.000 inch |
| 0 | 1 | 1 | 0.100 inch |
| 1 | 0 | 0 | 0.010 inch |
| 1 | 0 | 1 | 0.001 inch |
| 1 | 1 | 0 | Increment |
| 1 | 1 | 1 | Spare |

The seven positions of the Parameter selector switch 242 are encoded into four binary bits as follows:

TABLE III

| P3 | P2 | P1 | P0 | |
|----|----|----|----|---|
| 0 | 0 | 0 | 0 | Spare |
| 0 | 0 | 0 | 1 | X-Position |
| 0 | 0 | 1 | 0 | Y-Position |
| 0 | 0 | 1 | 1 | Spare |
| 0 | 1 | 0 | 0 | Spare |
| 0 | 1 | 0 | 1 | I-Arc Center |
| 0 | 1 | 1 | 0 | J-Acr Center |
| 0 | 1 | 1 | 1 | Spare |
| 1 | 0 | 0 | 0 | Spare |
| 1 | 0 | 0 | 1 | M-Auxiliary Command |
| 1 | 0 | 1 | 0 | G-Auxiliary Command |
| 1 | 0 | 1 | 1 | Spare |
| 1 | 1 | 0 | 0 | Spare |
| 1 | 1 | 0 | 1 | Spare |
| 1 | 1 | 1 | 0 | Spare |
| 1 | 1 | 1 | 1 | Spare |

In a similar manner, all of the momentary switches are encoded into five binary bits designated S0, S1, S2, S3 and S4 (Table IV). These five bits can accommodate up to 31 momentary switches. In addition, a sixth bit, $V_s$ provides a verify function for the stop switches.

The encoded selector switch bits are then combined into a single sixteen bit word having the format of P3, P2, P1, P0, Spare, J2, J1, J0, M2, M1, M0, Spare, and four zero states with logic gates. This word is serially scanned into the central processor 112 with logic gates whenever the selector switches are to be sampled under program control. Similarly, the encoded outputs of the momentary switches make up a separate word which is periodically sampled under program control with logic gates.

As shown in FIG. 2, a master panel board 182 supports components and circuits, including a display portion 118 of the control system. The panel board 182 may be a printed circuit board having conventional spaced apart apertures or receptacles 252 (FIG. 2) on the front side into which selector switches and momentary switches may be inserted. Printed circuit wiring to each of the element positions and a minimal amount of electronic circuitry is mounted on the back of the panel board 182 to facilitate error free communication with the data processor. By placing this circuitry in close proximity to the switches and displays, signal lines are held to a minimum length, thereby minimizing costs and errors.

Three multi-position selector switches, a mode selector switch 240, a jog selector switch 241 and a parameter selector switch 242 provide primarily control type functions. Because hardwiring of switch controls is avoided by having intermediary output words communicated to and interpreted by the data processor, the number of selector switches as well as the number of contacts on each selector switch can be easily varied to meet the requirements of a specific application. In this embodiment the interactive control system can accommodate a maximum of 4 selector switches, each having 15 positions. However, even the 7 switch positions on the mode selector switch 240 and the jog selector switch 241 and the 15 switch positions on the parameter selector switch 242, are not fully used in this application.

The selector switches are implemented by grounding the wiper arm and connecting each switch contact to a positive voltage through a resistor. This arrangement causes the signals from the contact outputs to represent the inverse of the selector switch position, a condition particularly suitable to modern integrated circuit logic gates.

The 7 signals from the contacts of the mode selector switch 240 and the 7 signals from the contacts of the jog selector switch 241 are each converted by encoders, into 3-bit binary coded signals. Similarly, the 15 signals from the contacts of the parameter selector switch 242 are converted by an encoder to 4-bit binary coded signals. These encoded signals are connected to Scanout and I/O Channel-0 which converts the parallel signals to a serial intermediary binary digital word as they are shifted into the A-Register of the data processor 112.

Although each of the decoders can accommodate one more input signal, the binary coded output represented by all zeros is not implemented to permit the data processor to detect a switching error. If the wiper arm of a selector switch 240, 241, or 242 is between contacts or fails to make proper contact with a contact the associated encoder provides an all zero output as an error condition and causes an "error" display lamp to be illuminated after a short delay to allow for normal switching time.

24 momentary switches typified by switches 262 are shown mounted on the panel board. As with the selector switches, the number of momentary switches can be easily varied to meet the requirements of a specific application. The circuitry of the present embodiment can accommodate up to 31 momentary switches with locations for possible additional switches.

Reed switches which are mounted in apertures in the panel board are used exclusively in the preferred embodiment for the momentary switches to insure the highest level of reliability, versatility and cost effectiveness, but other well known switches may also be used. As with the selector switches, the momentary switches are implemented by grounding the wiper contacts and connecting the stationary contacts through a pull down resistor to a positive voltage.

TABLE IV

| $V_s$ | $S_4$ | $S_3$ | $S_2$ | $S_1$ | $S_0$ | |
|---|---|---|---|---|---|---|
| 0 | 0 | 0 | 0 | 0 | 0 | Spare-0 |
| 0 | 0 | 0 | 0 | 0 | 1 | Keyboard 0 |
| 0 | 0 | 0 | 0 | 1 | 0 | Keyboard 1 |
| 0 | 0 | 0 | 0 | 1 | 1 | Keyboard 2 |
| 0 | 0 | 0 | 1 | 0 | 0 | Keyboard 3 |
| 0 | 0 | 0 | 1 | 0 | 1 | Keyboard 4 |
| 0 | 0 | 0 | 1 | 1 | 0 | Keyboard 5 |
| 0 | 0 | 0 | 1 | 1 | 1 | Keyboard 6 |
| 0 | 0 | 1 | 0 | 0 | 0 | Keyboard 7 |
| 0 | 0 | 1 | 0 | 0 | 1 | Keyboard 8 |
| 0 | 0 | 1 | 0 | 1 | 0 | Keyboard 9 |
| 0 | 0 | 1 | 0 | 1 | 1 | Keyboard Clear |
| 0 | 0 | 1 | 1 | 0 | 0 | Keyboard Enter |
| 0 | 0 | 1 | 1 | 0 | 1 | Spare-13 |
| 0 | 0 | 1 | 1 | 1 | 0 | Spare-14 |
| 0 | 0 | 1 | 1 | 1 | 1 | X |
| 0 | 1 | 0 | 0 | 0 | 0 | Y |
| 0 | 1 | 0 | 0 | 0 | 1 | Spare-17 |
| 0 | 1 | 0 | 0 | 1 | 0 | Spare-18 |
| 0 | 1 | 0 | 0 | 1 | 1 | Cycle Start |
| 0 | 1 | 0 | 1 | 0 | 0 | Cycle Stop |
| 1 | 1 | 0 | 1 | 0 | 1 | Rapid Stop |
| 1 | 1 | 0 | 1 | 1 | 0 | Emergency Stop |
| 0 | 1 | 0 | 1 | 1 | 1 | Spare-23 |
| 0 | 1 | 1 | 0 | 0 | 0 | In |
| 0 | 1 | 1 | 0 | 0 | 1 | Out |
| 0 | 1 | 1 | 0 | 1 | 0 | Left |
| 0 | 1 | 1 | 0 | 1 | 1 | Right |
| 0 | 1 | 1 | 1 | 0 | 0 | Spare-28 |
| 0 | 1 | 1 | 1 | 0 | 1 | Spare-29 |
| 0 | 1 | 1 | 1 | 1 | 0 | Spare-30 |
| 0 | 1 | 1 | 1 | 1 | 1 | Spare-31 |

Once an intermediary input word is within the A-Register it is manipulated and interpreted by an arithmetic and control unit operating under control of program instructions stored in a memory 130. After an input word has been interpreted, the data processor generates appropriate system responses.

The data processor also generates preprocessed intermediary output words having selected formats and transfers them from the A-Register to a numeric display register and a lamp display register through I/O Channel-5 and I/O Channel-6, respectively. These channels provide bidirectional communication of intermediary output words with the A-Register, permitting previously output words to be returned to the A-Register to check for errors occurring during transmission. The interpretation and processing of intermediary words takes place within the data processor.

The displays include both lamp displays 233 and numeric displays 238. As shown in FIG. 2 both the lamp displays 233 and the numeric displays 238 are mounted on the display subpanel board which is in turn mounted on the mother panel board 182. The lamp displays may be conventional bayonet type lamps and the display subpanel board contains a batch fabricated block of lamp sockets which receive the lamps. These lamp sockets provide the multiple functions of mounting, electrical connection and heat sink. Each lamp may be selectively connected to ground either directly or through a flasher bus. The lamp displays are enhanced with a special filter to suppress glare and provide an easy to read, aesthetically pleasing presentation. Displays and legends that are not illuminated are obscured behind the filter, simplifying rapid appraisal of system conditions and eliminating the need to mentally separate illuminated displays from non-illuminated but visible displays.

The numeric display elements are conventional 9 segment displays capable of displaying all numerical characters and some alphabetic characters. However, the interactive control system has sufficient data capacity to accommodate 13 segment tubes capable of displaying all numeric and alphabetic characters if desired. The eight numeric display elements of this embodiment are mounted horizontally on the display subpanel board.

Coupled to the lamp displays 233 are lamp drivers which are coupled to the lamp display register. With the exception of a few lamp drivers which are hard-wired to respond to special functions such as over temperature, P/S error, Power on and input hold, each lamp driver responds to a selected bit of an intermediary binary digital output word stored in the lamp display register.

The implementation of the 8 numeric display elements 238 is considerably more complex than that used for the lamp displays. Because each numeric display element requires multi-bit control signals a cyclic technique is used to drive all eight numeric display elements from a single numeric display register, thereby greatly reducing the amount of circuitry required. To accomplish this the eight numeric display elements are sequentially excited at a flicker-free 30 cps rate. In order to excite each numeric display element at a rate of 30 cps the contents of the numeric display register must change at a cyclic rate of 240 cps.

The numeric display functions are performed in the data processor 112 under program control and include the numeric display counter, the update control, the refresh control, and the data registers. These functions are not physically identifiable, but are implemented under program control of the data processor. The display parameter is converted from a binary to a BCD code, then modified for the special segment code requirements of the numeric display tube. The tube identification code is packed into the word, which is output to the numeric display register in the interactive control system.

In order to excite one of the numeric display elements the data processor 112 utilizes the count of the numeric display counter implemented under program control, for example, binary 3 indicating that the third numeric display element is to be excited, to access a location in the memory 130 storing information to excite the third numeric display with the proper character. This information is transferred from the memory 130 to a least significant portion of the A-Register where it is joined by the binary count from the numeric display counter parameter (3) stored in memory in the most significant portion to form the intermediary digital output word.

This output word is transferred from the A-Register through I/O Channel-5 to the numeric display register. As the word is output the numeric display counter is incremented so that the fourth numeric display element will be excited next. In addition to providing intermediary output words to the numeric display register at a rate of 240 cps, the data processor also updates the locations in the memory 130 which store the information determining the character to be displayed by each numeric display element. This updating occurs at a cyclic rate of 16 cps or twice per second for each memory location. This is about as fast as the eye of the operator can follow changes in the characters displayed by the numeric display elements.

The contents of the three numeric display select bits in the most significant portion of the numeric display register are communicated by three pairs of lines, each pair representing the Q and $\bar{Q}$ outputs from a flip-flop, to a decoder. The decoder activates one of eight select drivers, the third select driver in this instance. Simultaneously, nine segment drivers are selectively excited according to the character information stored in the least significant portion of the word in the numeric display register, each driver being responsive to a different bit. In some circumstances, it may be desirable to convert the character information to a binary code, thereby reducing the number of bits required to define a character, but necessitating the use of a decoder between the numeric display register and the segment drivers. However, such a coded technique is not used in this application.

The segment drivers present drive signals forming the stored character to the appropriate segments of all eight numeric display elements. However, only the third numeric display element, which receives a select signal from the select drivers, displays the selected character.

The elemental nature of system subsystems and the related data processor coaction under program control may be utilized to simplify system setup procedures, thereby minimizing setup time as well as errors. One of the major problems that every user of sophisticated control equipment has is that of familiarizing a new operator with the complex maze of switches, lights and other controls. This is particularly important to a company which has a high turnover of personnel. Even experienced operators, on occasion will neglect to set a switch properly or overlook a procedure which could have a disastrous result.

This control panel provides a means for interactivity between the data processor and an operator. Included in this interactivity is a unique feature which permits the data processor to "lead the operator by the hand" through various operations and procedures the operator must perform for proper machine operation.

For this purpose, an operator's manual may be used in conjunction with the numeric displays on the control panel and a special program in the data processor. The operator's manual is divided into several sections, each pertaining to a particular mode of machine operation. The parameter switch would be set to a specified position defining an interactive system initialization condition. This condition would cause the data processor to sense system conditions and respond under selected program control by causing the numeric displays to display a code number identifying a section in the operator's manual. The operator would look up the number in the operator's manual to identify the machine condition or status and the next step of the procedure to place the system into its desired mode. As each procedural step is taken, a new code number appears, showing whether the last step was properly performed until the system can be started. This permits a totally inexperienced operator to sequentially perform the entire system set up or initialization.

Servo Command Structure

An apparatus and method is presented wherein a digital device precisely controls a path of a physical system such as a multi-axis analog servo for control of a machine. By providing successive integral path defining commands with an independent variable resolution finer than the resolution of the analog device with respect to that variable, the digital device is able to drive the analog device along a smooth but precisely controlled path substantially without discontinuities associated with the digital commands.

An integral command is so designated in contrast to an incremental command. An incremental command has only a single value which is usually the desired resolution value of the commands. An integral command may be a whole number command having a range of values to permit a particular parameter to be resolved with a single command. Integral number commands are exemplified with binary coded delta parameters as will be discussed hereafter. Integral number commands may include other number commands, but specifically exclude incremental commands. Integral time domain commands are exemplified hereafter with the command parameter defined by the time position of a signal.

In a servo control system in accordance with the invention, a general purpose stored program computer generates integral commands in response to predetermined desired system conditions such as temperature, pressure, position, velocity or acceleration to control a multi-axis servo system. The computer can operate open loop to command the execution of predefined commands as in a numerical control system or can operate closed loop to provide a response to parameters such as position, velocity or temperature of controlled analog devices. The analog device itself may operate open loop or may have a closed servo loop using analog or time domain feedback signals.

The use of integral commands and time domain signals intrinsic to both the digital and analog domains permits the elimination of expensive analog to digital converters, digital to analog converters and digital differential analyzers. When a time domain integral command signal is compared with a time domain feedback signal, a very precise time domain error signal is attained from which an analog control signal may be generated simply and inexpensively. As used herein a time domain signal is one in which the magnitude of information carried thereby is proportional to a time related characteristic of the time domain signal, such as the pulse width of a squarewave signal or the time between corresponding transitions of a squarewave time domain signal and a squarewave reference signal.

The use of integral commands provides substantial advantages when applied to a servo control system. Because each integral command can substantially resolve the relative slopes of the controlled axes, the commands can be presented in real time at a rate commensurate with the response rate of cutoff frequency of the controlled mechanism and substantially independent of the slopes being resolved. In contrast, presently known systems require a data rate commensurate with the resolution of the system, as for instance, one part in 10,000, which is substantially greater than the rate required for integral commands.

Stored program computers operate in "computer time", having peripheral equipment such as magnetic tape drives "slaved" to the time related requirements of the computer. In order to directly control a physical system having specific time requirements such as response time, a computer may be constrained to the time requirements of the physical system, herein referred to as real time.

A stored program digital computer in accordance with the invention provides intermediate integral commands between path end points in an iterative manner to command a precisely defined path. These integral commands may be provided directly as a time domain signal in the form of a phase referenced squarewave. Alternatively, the computer may provide digital integral commands from which the time referenced squarewave command signal is readily generated. The phase referenced squarewave command signal is compared with similar feedback signals to produce a very precise time domain error signal which may take the form of an asymmetrical squarewave. By providing the successive integral commands at a rate which exceeds the time resolution or response rate of the servos, a smoothing or filtering effect is attained wherein the servos follow the discontinuous integral commands with a smooth path closely following the intermediate command points.

A system is presented wherein a digital device controls an analog device to cause system variables to define precisely controlled paths substantially free of the discontinuities associated with the digital commands. This freedom from discontinuities will exist when the resolution of the independent variables is finer than the resolution of the system with respect to those variables. The dependent variables are system conditions which are being controlled and the independent variables are controlling system conditions. A dependent variable might be a system condition such as pressure or temperature or it might be the status of a mechanism with respect to an axis, such as position, velocity or acceleration. An independent variable might be time, a system condition or the status of a mechanism.

In accordance with the invention, a data processor operates under program control to generate integral commands precisely controlling the position of a multi-axis servo with respect to time. Each integral command completely defines the relationship of each axis with respect to the other axes and with respect to time. By generating path defining commands with a time resolution equal to or finer than the time resolution of the analog device, the discontinuous integral commands are smoothed by the integrating or filtering effect of the physical inertia and electronics of the analog device. As long as the rate at which an analog system can respond to a command is substantially equaled or exceeded by the rate at which integral commands are generated, and if the magnitude of the commands does not exceed the response capability of the system, the actual path will closely follow the integral commands and the commands will be actual path defining.

Communication between digital and analog devices is provided with time domain signals intrinsic to both the digital and analog domains. These time domain signals contain a very precise information content and can be manipulated with relatively simple equipment without loss of precision. They may also be used to easily generate signals in the analog or digital domains. As disclosed herein, integral time domain command signals may be generated directly by a computer or by a command structure in response to digital integral number commands generated by the computer. Time domain position feedback signals are generated directly by a properly excited analog resolver.

Although many different arrangements will become obvious to those skilled in the art, in the preferred embodiment of this invention a phase referenced squarewave signal is generated directly by a digital computer under program control. The phase referenced squarewave signal is a time domain signal and provides integral path defining commands to a closed loop squarewave servo.

As an alternative arrangement the data processor 112 receives a squarewave position signal, a position error signal and a velocity signal to form a closed digital loop. The computer is responsive to discrete inputs with the skip on discrete instructions to precisely measure the duration or phase of these feedback signals and process them as digital integral numbers. Because the data processor is now in a closed loop it can utilize the feedback signals to modify the integral commands and control an adaptive controller. Use of adaptive control permits precise control over the instantaneous position error of each axis by varying the gain of the power amplifier.

Independent of the advantages attained by placing the data processor in a closed loop, direct communication between the data processor and the servo in the time domain permits most components and functions of the command structure to be eliminated. By using the data processor to perform additional real time functions, the command structure may be reduced to a reference squarewave generator and a flip-flop, which serves a function similar to the flip flop $N_{30}$. All squarewaves including the reference and command squarewaves may be derived in this manner.

The data processor is responsive to the reference squarewave $\phi B$ as well as the feedback signals as discrete inputs and clocks the toggling flip-flop with discrete outputs. These discrete outputs are synchronized with the reference signal $\phi B$ and have a selected phase relationship indicating a commanded position just as position command signal.

Additionaly, the data processor may be programmed to provide a time domain error signal by toggling a flip-flop using a technique similar to that used to generate the position command signal in conjunction with flip-flops. The pulse width squarewave signal is communicated to the digital to amplitude converter which generates the servo control signal. The time domain error signal may be provided either as an override of the normal time domain error signal under appropriate circumstances or in lieu thereof with the comparator circuits being completely eliminated.

Additional circuits may be used to reduce the task of the computer in generating command signals and sensing feedback signals. For instance, a counter may be used to measure or control the time between squarewave transitions for phase or pulse width signals.

As shown in FIG. 7A, a numerical control system 110 has a general purpose data processor or computer 112 generating open loop commands to an X-axis closed servo loop 120 through the associated servo command structure 714. The command structure 714 generates the signals required for servo operation and applies the integral commands that are generated under program control in the data processor 112 to the servos in the form of time weighted position command signals which control a plurality of axes as exemplified by the X-axis servo 120. The X-axis servo 120 generates time weighted position feedback signals which are compared with the position command signals to generate digitally precise time weighted postion error signals which are also used to generate digitally precise time weighted velocity signals. These time weighted signals are easily used to generate analog signals to provide a closed inner servo loop.

The X-axis servo 120, which is exemplary of the servos for the other axes, is described in greater detail in the related applications "Data Processing System" and "Control Apparatus". However, generally, the X-axis servo 120 provides a closed analog loop wherein time weighted command and feedback position signals are compared to provide very precise analog error signals without loss of resolution contained in either the digitally derived command signal or the analog derived feedback signal. By operating in the time domain in this manner, the need for expensive digital-to-analog converters and analog-to-digital converters is thus eliminated.

Within the X-axis servo 120 comparator circuits 786 receive time weighted command signals and more specifically phase referenced square wave position command signals from the servo command structure 714 and similar position feedback signals. These signals are compared to produce a time weighted error signal 787 which is converted by a digital-to-amplitude converter 788 into an analog position error signal 789.

Within the X-axis servo 120, a pick-off in the form of a resolver 778 is mechanically coupled to a mechanism to be positioned which may be a machine tool 780 or other mechanism. The resolver 778 receives the quadrature phased reference signals $\phi A$ and $\phi B$ and provides an output to shaping and amplifying circuits 782. The shaping and amplifying circuits 782 transform the output of the resolver 778 into a time weighted square wave position feedback signal 783 having a phase differential with respect to the reference signal $\phi B$ which precisely defines the position of the machine tool 780. In one embodiment, the position feedback signal 783 is communicated to the data processor 112 to close the outer loop and to the comparator circuits 786. The comparator circuits produce a time weighted position error signal 787 in the form of an asymmetrical square wave. The positive portion of a cyle has a duration equal to the time differential of the transitions of the position command and feedback signals. This position error signal 787 is easily converted by the digital-to-amplitude converter 788 into an analog position error signal 789 and, in one embodiment, to the position error feedback signal 787 which is communicated to the data processor 112.

The position feedback signal 783 is also communicated to a digital tachometer 792 which communicates a time weighted velocity signal 794 similar to the position error signal 787 to a digital-to-amplitude converter 796 and, in one embodiment, as the velocity feedback signal 794 which is communicated to the data processor 112. The digital-to-amplitude converter 796 generates an analog velocity feedback signal 797 for loop stabilization.

The analog position feedback signal 789 and the analog velocity feedback signal 797 connect to summing resistors 790 which provide inputs to a power amplifier 798 which controls a servo motor 799. The servo motor 799 is mechanically linked to the machine tool 780.

The analog servo time resolution may be related to bandwidth, dynamics, response, time constant, or other such terms known in the art. It is defined by the characteristics of the machine such as inertia and friction and the characteristics of the electronics such as inductance and capacitance. In a typical servo apparatus, the characteristic may be an exponential decrease in response as frequency increases starting at 10 cps.

Figure 7C:
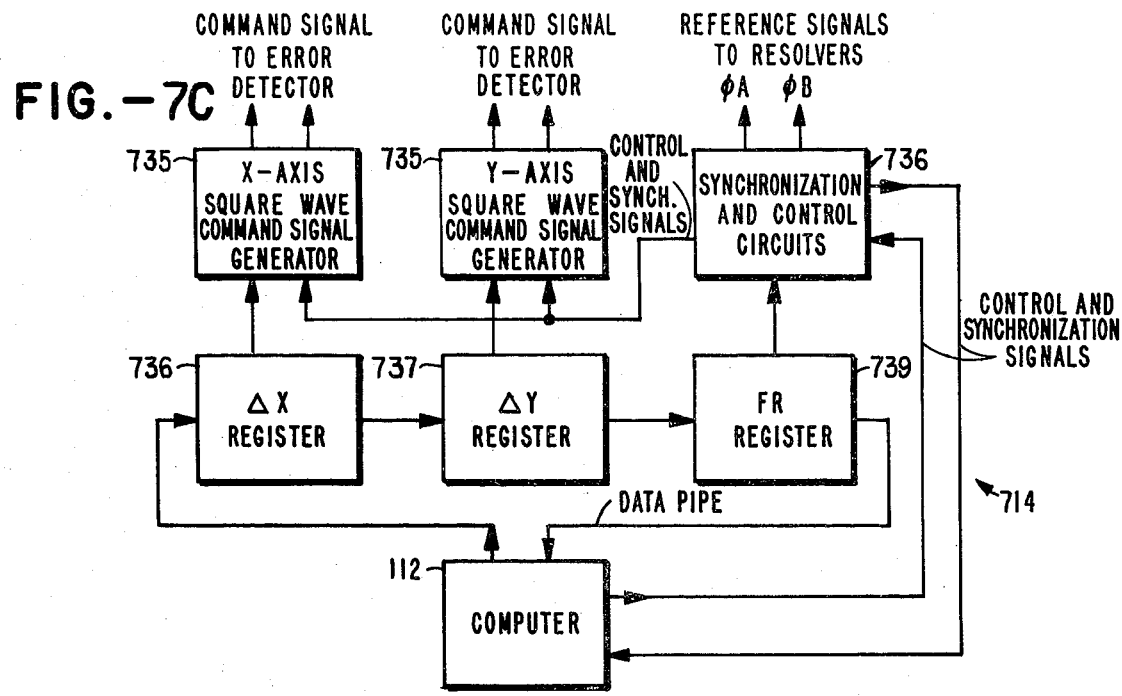
FIG. 7C is a block diagram representation of the computer and command structure position of the numerical control system shown in FIG. 7A.

As shown in FIG. 7C, the servo command structure 714 has a common portion relating to all of the servo axes and a plurality of channel portions each of which relate to a single servo axis. Although only X-axis and Y-axis controls are illustrated by way of example, controls for additional axes could be implemented in similar fashion. The logic circuits are similar to the series 7400 manufactured by Texas Instruments, but may be replaced by other circuits as will be obvious to those knowledgeable in the art. The common portion of the command structure 714 is made up of synchronization and control circuits 736 and an associated feedrate register 739. The synchronization and control circuits 736 generate the quadrature reference signals $\phi A$ and $\phi B$ and provide control and synchronization signals to the channel servo controls. Control and synchronization signals pass bidirectionally between the computer 112 and the synchronization and control circuits 736. The channel servo controls are identical and each contains a square wave command signal generator 735 and an associated delta register 737. The square wave command signal generators 735 provide the phase referenced position command signals to the comparator circuits 786 within the servo for each axis.

The command structure 714 operates in two mutually exclusive modes. During the initialize mode, integral commands are transferred through a data pipe from the computer 112 to the delta registers 737 and the FR register 739. The data is transferred serially under control of the computer clock in two words, each having two 8-bit bytes. The sequence of transfer is first word least significant byte, first word most significant byte, second word least significant byte, and second word most significant byte. As illustrated in FIG. 7C, the first word least significant byte is clocked through the delta X and delta Y shift registers 737 through the feedrate register 739, and back to the computer 112 where it may be accepted for error checking or ignored. As actually implemented in conjunction with the data processing system, the least significant byte of the first word may contain miscellaneous information which is conveniently transferred through the data pipe to this final destination. However, this use of the first byte is not material to the structure disclosed herein and is therefore omitted for simplicity. As the first byte of the first word is clocked from the delta X register to the delta Y register, the second byte of the first word is clocked into the delta X register. This process continues until ultimately the feedrate register 739 contains the second byte of the first word, the delta Y register 737 contains the first byte of the second word and the delta X register 737 contains the second byte of the second word. This arrangement can be easily expanded to accommodate additional axes by increasing the length of the data pipe with additional delta registers and adding one or more additional data words.

After transfer through the data pipe, the computer 112 provides a control signal which causes the command structure 714 to switch from the initialize mode to an update mode. This causes the command structure 714 to switch from the computer clock to an internal servo clock synchronized with the reference square wave $\phi B$. During the update mode, the contents of the feedrate register 739 are added to an R register (FIG. 7E) at the end of each half cycle of the reference square wave $\phi B$. The overflow of the R register generates an update command causing the time weighted position command signal for each axis to be varied according to the contents of the associated delta register. If a small number is placed in the feedrate register during the initialize mode, it will take many half cycles of the reference square wave $\phi B$ before the R register overflows. On the other hand, the placing of a very large number in the FR register will result in an overflow of the R register after as few as $\frac{1}{2}$ cycle of the reference square wave $\phi B$. In this manner, the time between position updates is precisely controlled.

Upon enabling of the update, the contents of each delta register 737 are algebraically added to a P register (FIG. 7F) within each associated axis square wave command signal generator 735. The integral commands are transferred by the computer 112 to the delta registers 737 in two's complement form so that the contents of the P register may be increased or decreased and may store either positive or negative numbers in two's complement form. Upon completion of the update, a control and synchronization signal is transmitted to the computer, identifying the change to the initialize mode and indicating that the command structure is ready to receive new integral update parameters. Throughout both the initialize mode and the update mode, the square wave command signal generators 735 continue to generate interpolation signals under control of the servo clocking system at the same frequency as the reference square wave $\phi B$ for static conditions and with a phase relationship determined by the contents of the P register.

Figure 7F:
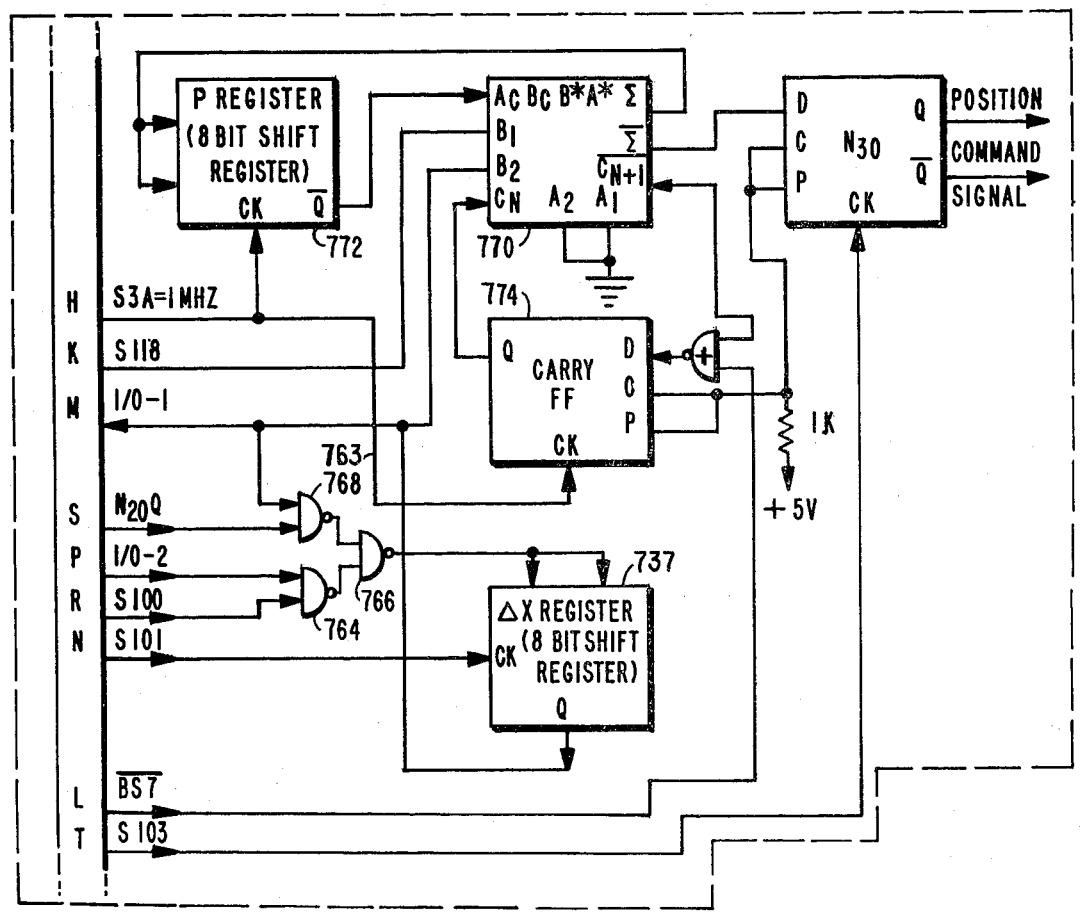
FIG. 7F is a schematic diagram representation of a portion of the command structure shown in FIG. 7A which controls an X-axis servo.
Figure 7E:
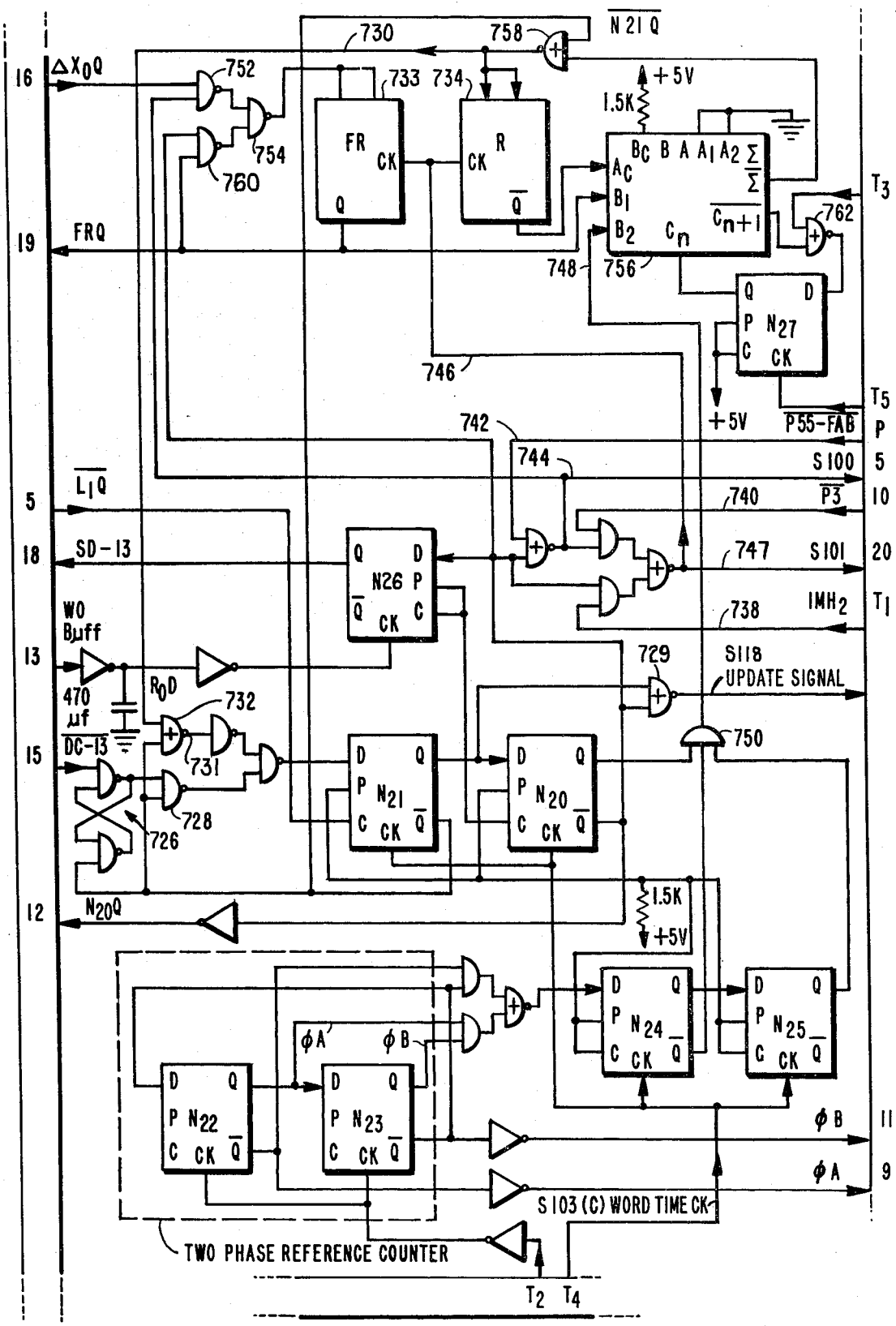

The portion of the command structure 714 which is common to all of the servo axes is shown in FIGS. 7D and 7E. FIG. 7D illustrates the servo clocking system which receives the eight megacycle computer clock 745 and reduces it in a series of digital signal dividers 749, 751, 753 and 755. The first three stages of signal divider 749 reduce the eight megacycle input signal 745 to a one megacycle signal provided at output CQ of signal divider 749. This one megacycle signal is the basic bit time clocking signal for the servo command structure.

The B input of digital signal divider 755 receives the one megacycle bit time signal and divides it by two in each of three successive output stages BQ, CQ and DQ. These outputs are gated through AND gate 741 to form the basic word time signal 743. The word time signal 743 is synchronized with the one megacycle bit time signal and goes true during the seventh bit time of each word time (each word time starting with bit time zero). Thus, the word time signal 743 indicates the last of eight bit times in each word time. The word time signal 743 is inverted to become $\overline{BS7}$. The word time signal 743 is also fanned out and gated by the one megacycle bit time signal to form the gated word time signals S103(A), S103(B), and S103(C). The one megacycle bit time signal is also fanned out and inverted to form the signals S3(A) and S3(B).

Reference is now made to the control portion of the part of the command structure 714 which is common to all of the axes and which is illustrated in FIG. 7E. The square wave reference signals are provided by two flip flops $N_{22}$ and $N_{23}$. The two reference signals are in quadrature with signal $\phi A$ leading signal $\phi B$ by $\frac{1}{4}$ cycle. The reference signals have a frequency of approximately 488 cycles per second, thereby providing exactly 512 microseconds or bit times between the corresponding transitions of the leading signal $\phi A$ and the lagging signal $\phi B$. The signal $\phi B$ is used as the primary reference signal throughout the servo and command structure and the signal $\phi A$ is required for proper operation of the resolver. Both flip flop $N_{22}$ and flip flop $N_{23}$ are clocked by a signal provided by the DQ output of signal divider 753 (FIG. 7D) at a frequency of 1.9530625 KHz which is four times the frequency of the desired reference square waves. To illustrate the operation of the reference signal generator, assume that both flip flops are in the Q, or 1, state. When the next quarter period clock pulse is received, the $N_{22}$ flip flop will switch to the $\bar{Q}$ state while $N_{23}$ will remain unchanged. The second quarter period clock pulse will cause flip flop $N_{23}$ to switch to the $\bar{Q}$ state leaving $N_{22}$ unchanged. The third clock pulse will switch flip flop $N_{22}$ back to the Q state leaving $N_{23}$ in the $\bar{Q}$ state, and the fourth quarter cycle clock pulse will switch flip flop $N_{23}$ back to the Q state so that both flip flops are in the original Q, or 1, starting states. Thus, the Q output of flip flop $N_{22}$ forms the $\phi A$ leading signal and the Q output of flip flop $N_{23}$ forms the $\phi B$ lagging signal and both of these signals have a frequency of $\frac{1}{4}$ their clocking signal or approximately 488 cycles per second.

Flip flop $N_{20}$ is used to define the two modes of operation with $N_{20}Q$ defining the update mode and $\overline{N_{20}Q}$ defining the initialize mode. Output $\overline{N_{20}Q}$ signals the computer that the command structure has completed the update mode, that it has entered the initialize mode and that it is ready to receive additional integral update parameters through the data pipe. When the computer finishes loading new parameters through the data pipe, it generates a $\overline{DC-13}$ signal to command the update mode. When in the update mode, the update functions are performed as defined with the parameters loaded during the initialize mode. After these updates have been performed, the initialize mode is automatically set to permit the loading of new inital conidtions. This initialize mode is identified for the computer through the resynchronization flip flop $N_{26}$ as an SD-13 computer input.

The computer software program interrogates the SD-13 signal through a discrete input channel with a skip on discrete instruction. When the signal is true, it defines that the servo has returned to the initialize mode after completion of previous updates and permits the computer to load new update parameters into the delta and feedrate registers. The computer will load update parameters with the data pipe technique where the various parameters are packed together into an integral number command of virtually unlimited length, thereby permitting servo channels to be added almost without limit.

The resynchronization control formed by the $N_{20}$ and $N_{21}$ flip flops and associated logic is used to insure synchronization between the computer and the command structure which are synchronous logic units operating asynchronously with respect to each other. When the computer detects the SD-13 condition under program control, it loads the update parameters and then generates the $\overline{DC-13}$ signal. The $\overline{DC-13}$ signal sets a latch 726 which holds the DC-13 condition until the S103(C) word time clock sets this true condition into the $N_{21}$ flip flop. This S103(C) word time clock insures that the flip flops will be clocked only at bit time seven thereby making the mode conditions available starting at the first bit time of the following word time. This results in the synchronization of the $\overline{DC-13}$ signal with the command structure word times. At the next S103(C) word time clock the $N_{20}$ flip flop will be set true thereby commanding the update mode. The prior switching of the $N_{21}$ flip flop into the one state will cause the latch 726 to be reset and will disable the $\overline{DC-13}$ command from affecting the resynchronization control through the NAND gate 728 and will enable the reset of the synchronization control with a signal 731 through NOR gate 732.

The signal 731 indicates the overflow to the most significant bit, or the sign bit, of the R register 734. This overflow is generated by adding the contents of the FR register to the R register at each half cycle of the command square wave as described in detail below. Although the signal 731 presents all eight bits of the R register to the D input of flip flop $N_{21}$ as the R register 734 recirculates, only the sign bit is effective because flop flop $N_{21}$ is clocked by the word time clock S103(C) only when the sign bit is present. Thus, when the sign bit of the R register overflows, the $N_{21}$ flip flop is switched to the zero state, enabling latch 726 and generating update command signal S118 through NOR gate 729. When the next word time clock signal is received, the $N_{20}$ flip flop is switched back to the $\bar{Q}$ state, disabling the S118 update signal and causing the resynchronization flip flop $N_{26}$ to be set to the Q state upon receipt of the W0 buffered clock pulse, which is a synchronization signal produced by the computer to indicate word time zero, the beginning of an instruction sequence. Thus, the S118 update signal has a duration of precisely eight bit times or one word time and is synchronized with the word time clock. The $N_{26}$ flip flop resynchronizes the $\overline{N_{20}Q}$ signal with the word time zero (W0) of the computer. Thereby precluding a race condition between the SD-13 signal transition and the computer interrogation of this signal under software control.

It is necessary that the one megacycle servo clock 738 be used to clock the registers during the update mode defined by $N_{20}Q$ and that the $\overline{P3}$ computer clock 740 be used to clock those registers when the computer is loading initial conditions into the data pipe during the initialize mode defined by $\overline{N_{20}Q}$. Signal $\overline{P55.FAB}$ 742 defines that the computer is generating an EX-5 instruction to load the data pipe. When this instruction is executed during the initialize mode defined by $\overline{N_{20}Q}$, the signal S100 744 will enable the computer clock $\overline{P3}$ 740 to appear as the S101 gated clock 747 to shift the data pipe registers with the computer clock. At all other times, the S101 gated clock 747 appears as the one megacycle servo clock 738.

A combination of software and hardware interlocks precludes the possibility of a race condition between the command structure 714 and the computer operation, particularly with respect to the S101 gated clock signal 747. The S101 gated clock does not encounter a race condition because of the programming requirement imposed on the computer, where an EX-5 instruction shall not be executed when the SD-13 signal is low defining the update mode. Also, the $\overline{N_{20}Q}$ signal disables the servo clock 738 and enables the computer clock $\overline{P3}$ 740 during the execution of the EX-5 instruction. The system cannot change back to the servo clock until the computer generates a $\overline{DC-13}$ signal which subsequently causes the $N_{21}$ and $N_{20}$ flip flops to be one set, and the $N_{26}$ flip flop to be zero set. Thus, the SD-13 signal provides a program interlock to prevent generation of an EX-5 instruction during the update mode and the $N_{20}Q$ signal provides a hardware interlock to disable the S100 initialize command 744.

As previously noted, the contents of the feedrate register 733 are added to the contents of the R register immediately following each transition of the reference square wave $\phi B$. This update is commanded by an interval update signal 748 which has a duration of precisely one word time or eight bit times and occurs during the first word time following a transition.

The interval update signal 748 is obtained by providing the $N_{20}Q$ update mode signal and the outputs from a pair of flip flops $N_{24}$ and $N_{25}$ as inputs to an AND gate 750. The flip flop $N_{24}$ has an input signal $N_{24}D = \overline{\phi A \cdot \phi B} + \phi A \cdot \phi B$. This means that flip flop $N_{24}$ goes false for a quarter period following each transition of the reference square wave $\phi B$ when clocked by the word time clock S103(C). It is at this time that the interval update signal 748 is gated through AND gate 750 whenever $N_{20}Q$ indicates an update mode. Precisely one word time after the initiation of the interval update signal 748 flip flop $N_{25}$ is switched to the zero state by the word time clock S103(C), thereby disabling AND gate 750. In this manner, the interval update signal appears throughout the second word time following each transition of the reference square wave $\phi B$.

The feedrate register 733 and the R register 734 are continuously clocked by either the eight magacycle computer clock $\overline{P3}$ or the one megacycle servo clock. During the initialized mode, the FR register 733 receives data pipe information through NAND gates 752 and 754. During this period also, the R register is recirculated through the full adder 756 except that the input to the R register is blocked by disabling NOR gate 758 with the signal $\overline{N_{21}Q}$. In this manner, the R register is cleared prior to the beginning of a new update mode.

During the update mode, the FR register 733 and the R register 734 are clocked by the one megacycle servo clock. During this period, the FR register 733 is recirculated through NAND gates 760 and 754 and the R register 734 is recirculated through the full adder 756 and NOR gate 758. As the feedrate register 733 recirculates, its output is also presented to the B1 input of the full adder 756. However, this B1 input is disabled except when the interval update signal 748 is present during the second word time following each transition of the square wave reference signal $\phi B$. During this word time, when the interval update signal 748 is present, the contents of the feedrate register 733 are added to the contents of the R register 734 through the full adder 756 and its associated carry flip flop $N_{27}$. The carry flop flop $N_{27}$ is always reset during the seventh bit time by the BS-7 signal disabling NOR gate 762. This insures that an overflow of the most significant bit will not be carried forward to the least significant bit during the next recirculation of the R register through the full adder 756.

Thus, the R register is periodically updated until an overflow to the sign bit causes flip flop $N_{21}$ to become set, thereby initiating the update signal, terminating the update mode and initiating the initialize mode.

Referring now to FIG. 7F, there is shown the channel portion of the command structure 714 for the X-axis servo. The delta X register 737 is continuously clocked by the S101 clock signal. As explained in conjunction with FIG. 7E, this signal carries the computer clock $\overline{P3}$ as data is shifted through the data pipe during the initalize mode and carries the one megacycle servo clock 738 during the update mode. As data is shifted through the data pipe, it is received from the delta Y register through input I/O-2 and transferred through NAND gates 764 and 766 to the input of the delta X register 737. Data is simultaneously shifted out of the delta X register over output I/O-1 to the feedrate register 739. Upon completion of the initialize mode, the system is returned to the update mode and the delta X register is clocked by the one megacycle servo clock to be recirculated through NAND gates 768 and 766. The purpose of continuously recirculating the delta X register is to make its contents continuously available to the full adder 770 so that they can be added to the contents of the P register 772. The time reference position command signal for the X-axis is generated by flip flop $N_{30}$. Flip flop $N_{30}$ receives as an input all of the data positions of the P register 772 as it is recirculated through the full adder 770. However, as $N_{30}$ is clocked by the S103 word time signal only during the last bit time, it responds to only the sign bit as the sign bit sequentially sets and resets. The signal $N_{30}Q$ provides the actual time reference position command signal with its inverse $\overline{N_{30}Q}$ being provided merely for the convenience of the comparator circuits 786 (FIG. 7A).

The P register 772 is continuously recirculated through the full adder 770 under the clocking of one megacycle S3A servo clock. As the P register is circulated through the full adder 770, the associated carry flip flop 774 is set by the word time signal $\overline{BS7}$ during each bit time seven at the end of each word time. This causes the least significant bit position of the P register to be incremented by one during the next recirculation through the full adder 770. Since the eight bit P register has 256 counts per overflow and since it is incremented by the word time rate of 125,000 counts per second, the P register overflows with a frequency of about 488 overflows per second. Thus, the command position signal has a frequency equal to and is synchronized with the reference square wave $\phi B$ at zero velocity.

The parameter in the P register during a particular phase time completely defines the commanded position of the resolver. For instance, if the seventh or most significant bit position of the P register is considered to be a sign bit and the 0 through 6 bits are considered to be the number bits, the number bits will overflow at twice the reference frequency and the command signal will be in phase with the reference signal $\phi B$ when all eight bits are 0 at the 0° phase time of the reference signal $\phi B$. On the other hand, the position command signal will lead the reference signal $\phi B$ eight microseconds for each count held by the position parameter in the P register at the 0° phase time. Thus if the position parameter holds a 4 at the 0° phase time the next transition of the position command signal will lead the next transition of the reference signal $\phi B$ by 32 microseconds. Similarly if the phase parameter holds a negative 4 at the 0° phase time, the next transition of the position command signal will lag the next transition of the reference signal $\phi B$ by 32 microseconds.

Referring now to FIG. 7A, the machine tool 780 has a machine lead screw drive and the resolver 778 is geared to the lead screw with a pitch of 10. As previously noted the resolver is excited by the quadrature reference signal $\phi A$ and $\phi B$ at a frequency of approximately 488 Hz. The pitch of 10 means that there is one complete resolver rotation for each 1/10th inch of machine translation and motion. The resolver excitation frequency is chosen so that the command square wave phase shift of $\frac{1}{2}$ cycle per period (1.024 milliseconds) relates to a command displacement equal to the $\frac{1}{2}$ resolver rotation or 0.05 inch. Similarly a command square wave phase shift of $\frac{1}{4}$ cycle period (0.512 millisecond) causes a command displacement equivalent to $\frac{1}{4}$ resolver rotation or 0.025 inches.

A commanded velocity depends upon the frequency at which an update is commanded and also the amount of each update. Because the number portion of the position parameter in the P register, excluding the sign bit overflows each half cycle, a commanded position update must be less than ½ cycle of the resolver or 0.05 inches. This means that the maximum velocity of the machine tool in this example is $$V_{max} = 488 \frac{\text{cycles}}{\text{second}} \times 1/10 \frac{\text{inch}}{\text{cycle}} = 48.8$$

inches per second

As a result of the integral number command technique used in this invention, this relatively high maximum velocity is attained without sacrifice of digital resolution and without extra computational burden on the computer. In this example, the $$\text{digital resolution} = 0.1 \frac{\text{inch}}{\text{resolver cycle}} \div$$
$$\text{by } 256 \frac{\text{increments}}{\text{resolver cycle}} = 0.00039$$

inches per increment. This is well within the 0.0005 inches per increment resolution of the system and can be expanded by merely increasing the length of the registers and a change in the system scaling.

As an alternative arrangement shown in FIG. 7B, the data processor 112 receives a square wave position signal 783, a position error signal 787 and a velocity signal 794 to form a closed digital loop. The computer is responsive to discrete inputs with the skip on discrete instructions to precisely measure the duration or phase of these feedback signals and process them as digital integral numbers. Because the data processor is now in a closed loop it can utilize the feedback signals to modify the integral commands and control an adaptive controller 725. Use of adaptive control permits precise control over the instantaneous position error of each axis by varying the gain of the power amplifier 798.

Independent of the advantages attained by placing the data processor 112 in a closed loop, direct communication between the data processor and the servo in the time domain permits most components and functions of the command structure 714 (FIG. 1A) to be eliminated. By using the data processor 112 to perform additional real time functions where the command structure 714 may be reduced to a reference square wave generator 720 and a flip flop 722, which serves a function similar to the flip flop N30 (FIG. 7F). All square waves including the reference and command square waves may be derived in this manner.

The data processor 112 is responsive to the reference square wave φB as well as the feedback signals as discrete inputs and clocks the toggling flip flop 722 with discrete outputs. These discrete outputs are synchronized with the reference φB and have a selected phase relationship indicating a commanded position just as position command signal 775 in the arrangement shown in FIG. 7A.

Additionally, as shown in FIG. 7B, the data processor 112 may be programmed to provide a time domain error signal 781 by toggling a flip flop 724 using a technique similar to that used to generate the position command signal in conjunction with flip-flop 722. The pulse width square wave signal 781 is communicated to the digital to amplitude converter 788 which generates the servo control signal 789. The time domain error signal 781 may be provided either as an override of the normal time domain error signal 787 under appropriate circumstances or in lieu thereof with the comparator circuits 786 being completely eliminated.

Additional circuits may be used to reduce the task of the computer in generating command signals and sensing feedback signals. For instance, a counter may be used to measure or control the time between square wave transitions for phase of pulse width signals.

Machine Control

The system shown in FIG. 1A, has been described for a milling machine in the referenced application, Ser. No. 101,881 and will be described for a lathe machine herein. The preferred embodiment of the servos are as described herein, but the term servo is intended to mean a control device with feedback; where feedback can be digital or analog with an inner control loop, or an outer command loop or both inner and outer loops. The machine is equiped with feedback transducers also referred to as pickoffs, which are electromechanical resolvers in the preferred embodiment but may be other analog or digital transducers which will become obvious to those skilled in the art. Also, this preferred embodiment is described for a squarewave servo and an electromagnetic pickoff. It will become ovbious to those skilled in the art from the teachings herein that other types of machine control apparatus and pickoff devices can be substituted for those discussed herein.

The servos 120, 121, and 122 control the lathe 124, where the X axis servo 120 and the Y axis servo 121 are the same as used for the milling machine in the referenced application Ser. No. 101,881. The servo 122 may be used to control a spindle and may be a complete servo as with the axis servos 120 and 121, or may merely provide the pickoff excitation and feedback signal processing for the feedback means with the spindle motor control device implemented with prior art control devices. The feedback means is contained in the servo means, shown functionally as individual servo channels 120, 121, and 122 providing command signals and feedback signals 123. In one embodiment of a feedback arrangement, the associated logic and circuitry is primarily contained on a servo common board but is partially distributed on servo channel boards to optimize partitioning of these boards. The common and channel boards are described in the referenced application Ser. No. 101,881.

Figure 3A:
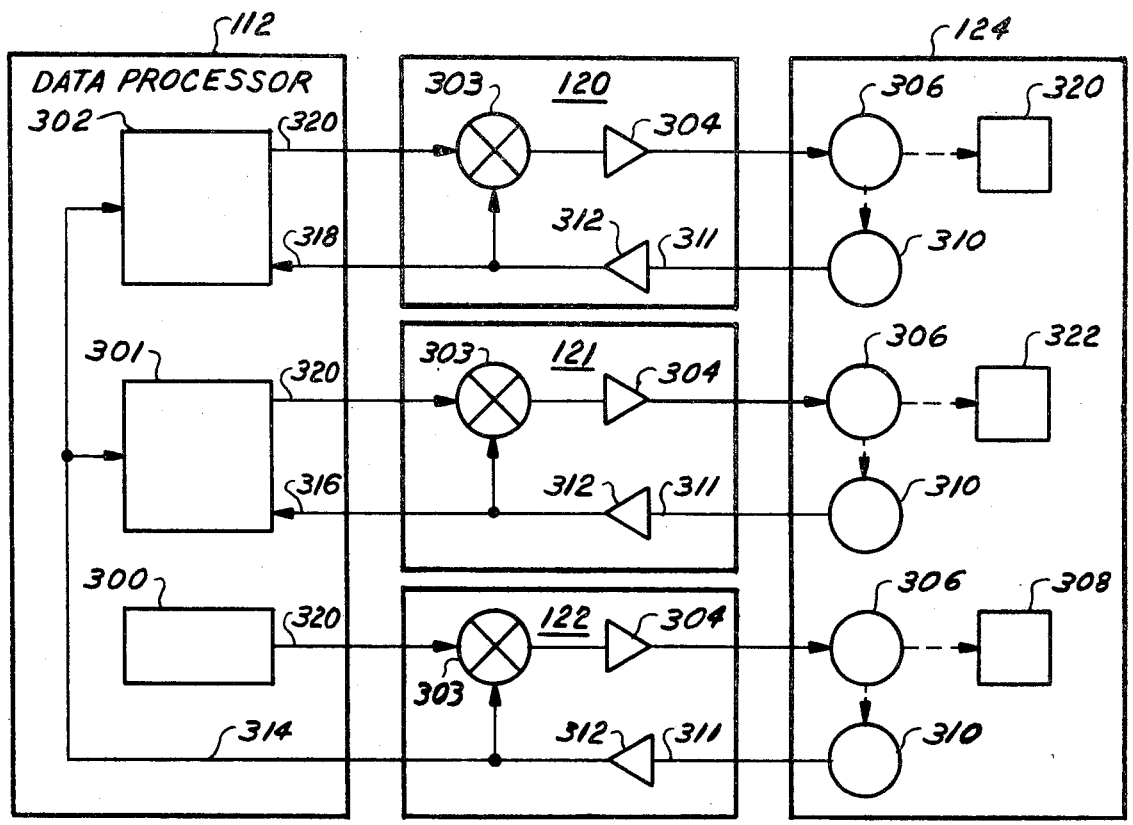
FIGS. 3A and 3B are schematic representations of servo controls.

A simplified block diagram of one embodiment of a lathe contouring system is illustrated in FIG. 3A. The main blocks comprise the data processor 112; the servo channels 120, 121, and 122; and the machine 124. The data processor 112 calculates the servo command parameters and controls the servos 120, 121, and 122 with computational blocks 300, 301, and 302. The servos 120, 121, and 122 include the summing junction 303 and the amplifiers 304, which drive the motors 306, which in turn drive the spindle 308 and axes 320 and 322 as commanded by the data processor 112. The pickoffs 310 provide feedback to the servos 120, 121, and 122; where the feedback signals 311 are processed with circuits 312 and then used to close the servo loop through the summing junctions 303. In one embodiment described herein, the data processor is responsive directly to the feedback signals from amplifiers 312. The spindle feedback signal 314 is used to control the contour computations as described herein for the threading contour. The X axis computation 302 and the Z axis computation 301 drives the X axis servo 120 and Y axis servo 121 synchronized with the spindle motion. The contour computations 301 and 302 may also be controlled with feedback signals 316 and 318 from the axis pickoffs 310. This embodiment exemplifies whole number commands 320 from the data processor 112, whole number feedback 314, 316, and 318 to the data processor 112, control of machine control computations with feedback 316 and 318 from servo channels 121 and 120 respectively, and related of machine control computations with feedback 314 from alternate channels which, in this example, is the spindle feedback 314 controlling computations 301 and 302. The feedback described herein is whole number feedback which defines the actual position of the pickoffs 310; which may also be absolute position feedback describing the actual position of the machine axes 320 and 322 and spindle 308. The distinction between whole number feedback and absolute position feedback will become obvious with the discussion hereafter.

An example of pickoff scaling will now be presented to illustrate absolute position feedback. The machine axes may have translational freedom of 100 inches, while the servo resolution may be 0.0001 inches. This would require a dynamic range of:

$$(100)/(0.0001) = 1,000,000$$

which is one part per million resolution or one million resolution increments for full position determination. This resolution exceeds the capability of practical pickoffs. Therefore, a pickoff may be geared to make a complete rotation in only 0.1 inches, requiring a resolution of 1/1000 to resolve the 0.0001 inch axis position, which is practical resolution for common pickoffs. This pickoff will rotate 1000 times to translate the extent of the 100 inch machine axis dimension, where it is not possible to resolve which one of the 1000 rotations the resolver is at. It can be defined that the number of rotations of the pickoff is the most significant part of the absolute position parameter and the position on that rotation is the least significant part of the absolute position parameter. This least significant part is often referred to in the numerical control art as the incremental position.

Figure 3B:
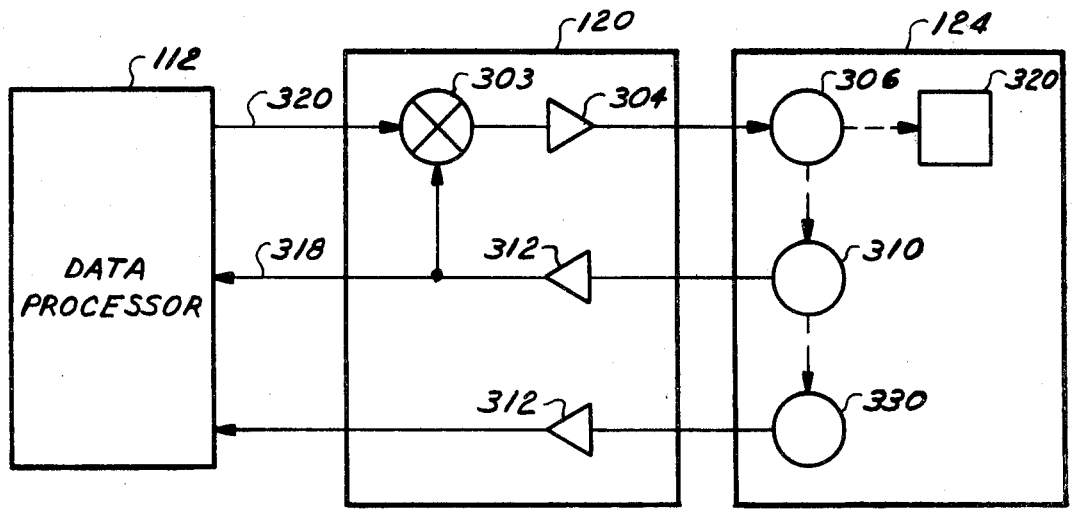

As illustrated in FIG. 3B, a second pickoff 330 is geared to the first pickoff 310 and rotates at 1/1000 the angular distance of the first pickoff 310, providing multispeed pickoff capability; where that second pickoff provides the most significant part of the absolute position parameter which defines which rotation the first pickoff 310 is at. The first pickoff 310 may be referred to as the fast pickoff and the second pickoff 330 may be referred to as the slow pickoff because the first pickoff 310 rotates one thousand times as fast as the slow pickoff 330. In this illustration, only the X axis servo 120 is shown, where other axis servos may be similar to this X axis servo 120 and need not be shown.

In prior art systems, absolute position capability has been provided with multiple pickoffs, but those prior art systems had significant disadvantages. To achieve absolute position capability, the prior art systems alternately switch these pickoffs into the servo loop, which causes switching transients in the servo, causes a dangerous condition by opening a servo loop to select another pickoff, precludes, continuous monitoring of the absolute position by the contour generator, and other disadvantages. In this invention, the data processor 112 monitors the slow speed pickoff 330 in an outer control loop to adaptively control the axis servo 120 and to preclude problems of the prior art systems. The data processor also monitors the high speed pickoff 310, but never opens the loop to change pickoffs.

In incremental systems, the single pickoff is used to control the servo loop as previously described. The most significant part of the position is stored in the numerical control system to provide full position capability. As long as electrical power is present to preserve this stored most significant part of the position parameter and as long as the servo commands 320 are within one half pickoff rotation (0.050 inches, for this example) of the resolver position, then the stored most significant part of the position parameter is accurate.

In order to provide full absolute position capability over all operating extremes, the second, slow speed pickoff 330 is added. The fast pickoff 310, provides the 0.0001 inch resolution required for precise contouring. The slow pickoff 330 resolves the ambiguity of the fast pickoff absolute position. The fast pickoff 310 is used to control the closed servo loop with signal 318 to summing junction 303. The slow pickoff 330 merely provides absolute position feedback 332 to the data processor 112. The data processor 112 monitors the slow pickoff 330 position to verify the fast pickoff 310 is on the proper rotation. If not, the data processor will command the servo with signal 320 to move the fast resolver the number of 0.1 inch rotations or steps required to achieve the proper position.

The discussion of feedback devices and feedback operations herein is independent of whether a single pickoff or multispeed pickoff device is used, where the data processor is not required to compare the calculated and feedback most significant parts of the position parameter but may do so if desired. The feedback device described herein will process feedback signals from single speed or multispeed pickoffs.

In the preferred embodiment, the spindle pickoff 310 is a resolver directly coupled to the spindle 308 to provide one degree of resolver rotation for one degree of spindle rotation. This eliminates gears required in prior art systems to obtain high pickoff to spindle rotation ratios, eliminates the need for expensive and unreliable digital encoder pickoffs, eliminates the need for a special initial position detector to define the initial position, and other such advantages. This results in a less expensive, more reliable and more accurate system. Because there is no position ambiguity with a directly coupled resolver, the data processor 112 can always monitor the exact spindle position with feedback means described hereafter. This constitutes true absolute position feedback from the spindle to the data processor.

The ability to precisely control the position of the spindle 308 enhances system utilization. One application is to automatically orient the workpiece holding fixture on a lathe spindle for rapid replacement of a machined part with the next non-machined part. Another application is to align a non-symetrical tool with a workpiece so as to enter the workpiece and avoid interferences that are a function of the angular relation of the tool and the workpiece. The spindle 308 can be precisely positioned with a servo loop similar to that described for the translational X and Z axes, which can also be provided for the spindle axis. The spindle motor 306 usually has a greater power rating than the X and Z axes servo motors 306 and is usually an AC motor. The power drives for spindle motors such as AC motors are well known in the art. The spindle feedback resolver 310 is the same as the X and Z axes feedback resolvers 310. Therefore, the three servo loops 120, 121, and 122 described in the referenced application Ser. No. 101,881 will control the spindle, the X axis, and the Z axis for the lathe machine described herein.

Commands to the spindle are typically position commands per unit of time, comprising velocity commands. The data processor 112 updates the position parameter either computationally by keeping track of the commanded position or by sensing the axis position with feedback as described herein. Therefore, the data processor 112 can position the spindle to a predefined or commanded angular position in a manner similar to that performed with the X and Z axes servos.

As an alternate, a spindle home position can be implemented similar to that described for the translational axes herein. For this embodiment, the m24 command can be used for the spindle axis home position command; as shown in the previously referenced application Ser. No. 232,459, on page 15 in Table I.

As still another alternate, a spindle jog control similar to that described for translational axis jog in the referenced application Ser. No. 101,881 will permit the operator to precisely position the spindle.

It is often necessary to resolve the ambiguity of which rotation the pickoff is at with servos that use a single pickoff, called incremental servos. This is accomplished in the prior art with a home position switch that is used to select the desired rotation of the pickoff. Prior art non-computerized systems cause the numerical control system to slew in a fixed direction for a home position command until a home position switch is detected, then the slew is terminated. Those prior art systems then require the operator to initiate a zero synchronization command for precise positioning to the pickoff null.

The machine home position is a fixed absolute position on the machine that may be used as an absolute position reference. The ability of the data processor 112 to sense the absolute position of the machine axes such as described in the previously referenced applications Ser. No. 101,881 and Ser. No. 134,958 permits the data processor 112 to keep track of the precise positions of the machine axes. The data processor senses the machine axes conditions from servos 120, 121, and 122 with signals 123 or directly with signals 126B, then controls the machine 124 to perform the commanded operations. In one embodiment, the machine home position is an absolute position point, the general location of the home position is defined by a switch on each axis and the precise location of which is defined by the pickoff null. The data processor will drive the selected axes with command signals 123 until the switch closure is detected with signals 123 or 126B, then the data processor will creep the selected axes into the pickoff null positions. The machine home position is commanded with m codes. Various parameters are selectable with the data processor stored program, such as axes (with associated m codes), direction of slew for each axis, slew velocity, and home position coordinates. The data processor 112 executes the slew routine to drive the selected axes with signals 123 in the specified direction at the specified velocity, with continued testing of the home position switch signals 126B to define the stopping point. A drive resolution of 0.004 inches or better is required to insure repeatable detection of the home position switch closure condition. Acceleration and deceleration are often not required, where the specified velocity is usually low enough to permit velocity step functions without loss of synchronization. The slew feedrate is conveniently modifiable under stored program control to accomodate different machine characteristics. When the home position switch is detected, zero synchronization is initiated to position the axis to the precise resolver null. Because the applicability of this feature is a function of the type of machine, it is programmed as a subroutine for ease of incorporation or deletion. Program execution speed is of little consequence so memory utilization is a primary consideration. An automatic fixed cycle is provided to selectively return each machine axis to the home position. The home position fixed cycle is initiated with m commands m21 through m25, where each m command will cause the associated axis to translate to the home position for that axis. Caution should be exercised to prevent interference between the tool, workpiece, and machine during this positioning operation.

Zero synchronization is used to automatically drive the selected axis to a commanded position of the pickoff. This may be a fixed position as with the home position or may be a position defined by the operator. Feedback from the axes servos 120, 121, and 122 is provided thru signals 123 and 126B. The zero synchronization and programmed synchronization operations are discussed in detail hereafter.

Servo Feedback System

The preferred embodiment of the servo feedback subsystem is discussed in the referenced applications Ser. No. 134,958, page 8 lines 5 through 25 and page 23 lines 1 through 15; Ser. No. 101,881, page 88 lines 3 through 10; and Ser. No. 135,040, page 10 lines 1 through 21. Several embodiments of this feedback device are discussed herein. One embodiment uses the data processor to detect the squarewave transitions under program control and to determine the time between the appropriate transitions. Another embodiment uses a logical means to detect the squarewave transitions, and to count time in a separate counter to determine the time between transitions. Still another embodiment uses the servo phase counter to define the phase of the selected squarewave transition. Other embodiments will become obvious to those skilled in the art from the teachings herein.

Data processor manipulation of the feedback parameters will provide various servo parameters such as position, velocity, and acceleration; where these parameters need not be implicit in the specific feedback parameter but can be derived or refined with data processor manipulation.

The feedback device accepts squarewave type signals such as with pulse width and phase related forms. Pulse width squarewave signals that can be used by the data processor 112 include the servo position error signal and the digital tachometer velocity signal. Phase related squarewave signals that can be used by the data processor 112 include the resolver feedback signal.

The servo logic is described in the referenced application Ser. No. 101,881; where the servo position error signal is shown in FIG. 18 as signal 294 or signals 296 and 298, the digital tachometer velocity signal is shown in FIG. 19 as signals 328, the resolver feedback signal is shown in FIG. 17A as signal 330.

The servo feedback signals to the data processor are described in the referenced application Ser. No. 134,958; where FIG. 5 shows the servo position error signal 87, the digital tachometer velocity signal 94, and the resolver feedback signal 83.

A squarewave is a waveform that carries the information in the time related transitions such as the zero transitions of a bipolar waveform; but does not necessarily require a symetrical waveform nor does it require a constant amplitude waveform. As an example, the output waveforms 311 of transducers 310, such as resolvers, are severly distorted. A degree of signal processing is required, such as with signal processor 312, to shape the waveform 311 to obtain a substantially constant amplitude waveform 314. A squarewave signal is, therefore, intended to mean a waveform that carries the information in the time related transitions.

The operation of one embodiment of the feedback device to the data processor has been described in the referenced application Ser. No. 101,881, page 15 lines 8 through 11 and page 88 lines 3 through 10 and application Ser. No. 134,958, page 22 lines 2 through 30. The various squarewave signals can be sensed as discrete inputs with the skip-on-discrete instructions as described in the referenced applications Ser. No. 101,881 and Ser. No. 134,958 or can be sensed as an assembled array of conditions packed into a whole number input word and loaded by the data processor with the EX instructions as described hereafter.

In this embodiment, scan-in logic such as shown in the referenced application Ser. No. 101,881 in FIG. 14 as logic gates 262, 264, or 266 can be used; where the squarewave signal states are sensed as with the S0 through S11 signals to logic gates 264 as listed in Table I.

TABLE I

| S0 | X axis feedback position signal |
| S1 | Y axis feedback position signal |
| S2 | Z axis feedback position signal |
| S3 | X axis position error signal |
| S4 | Y axis position error signal |
| S5 | Z axis position error signal |
| S6 | X axis velocity signal |
| S7 | Y axis velocity signal |
| S8 | Z axis velocity signal |
| S9 | $\phi$B reference signal |
| S10 | Spare |
| S11 | Spare |

For the three axis milling machine, three sets of parameters are sensed comprising the corresponding parameter from each axis servo 20, 21, and 22, illustrated in FIG. 1 of the referenced application Ser. No. 101,881. These signals can be feedback position 330, position error 332 and velocity 328 signals illustrated in FIG. 17A of the referenced application Ser. No. 101,881 and also shown as the feedback position 83, the position error 87, and the velocity 94 signals illustrated in FIG. 5 of the referenced application Ser. No. 134,958. The reference signal; shown as the $\phi$B signal on pin D in FIG. 17A of the referenced application Ser. No. 101,881 and shown as the $\phi$B signal in FIG. 5 of the referenced application Ser. No. 134,958; can also be sensed as shown in Table II.

The data processor 112 will load the servo squarewave signal conditions with an EX instruction, such as EX-3 for this example; where the squarewave conditions will be scanned-in with logic 264 on line IW-3 pin 49 as shown in FIG. 14B of the referenced application Ser. No. 101,881. The data processor will process this condition word to determine if a condition has changed such as by executing the exclusive-OR instruction between this new servo condition word and the last prior servo condition word. If a servo condition has changed, the data processor can store the time at which this change was detected; then calculate the relative timing between the change of the reference squarewave and the change of a phase squarewave parameter or between the last two changes of a pulse-width squarewave parameter.

The operation of another embodiment of the feedback means to the data processor will now be described in detail in conjunction with FIG. 4A. This embodiment is shown in a combined logical and block diagram form that, when used with the logical equations in Table II and the following description, will completely describe the operation of this feedback means.

Integrated circuit logic is used such as the series 7400 manufactured by Texas Instruments Inc. and described in the Texas Instruments Catalog CC201-R incorporated herein by reference. The multiplexers 402 and 408 are typified by the 74150 devices, the D flip-flops are typified by the 7474 devices, the asynchronous one-shot 464 is typified by the 74121 device, the counters 436 are typified by the 7493 device, the registers 438 are typified by the 7495 device, and other logical elements are typified by the corresponding devices in the 7400 product line of integrated circuits. The counters 436 and registers 438 are shown cascaded to provide a sixteen bit parameter. Certain signals such as clock pulses, certain devices such as inverters, and various interconnections are omitted for clarity; but the use of which will be obvious to those skilled in the art.

The logical equations in Table II use the reference designations in the associated figures to define logical signals. Flip-flop outputs use the Q output symbol to describe the appropriate output line such as 450Q for the true output of the flip-flop 450 and $\overline{450Q}$ for the compliment output of the flip-flop 450.

TABLE II $428 = 450Q \cdot \overline{451Q} \cdot 432 + 454Q \cdot \overline{455Q} \cdot \overline{432}$ $430 = 452Q \cdot \overline{453Q} \cdot 432 + \overline{454Q} \cdot 455Q \cdot \overline{432}$ $424 = (428 + \overline{422Q}) \cdot \overline{430} \cdot 462Q$ $456 = (464Q + 430 \cdot \overline{422Q})$ The feedback device or converter device operates on the principle of a counter that is started, then stopped by the by the desired squarewave transitions, thereby providing a count proportional to the time difference between the two selected transitions. The squarewave information is contained in the relative time of those transitions. Therefore, converter counter 436 provides a digital parameter proportional to the time difference between the squarewave transitions.

The converter can process a plurality of squarewave signals in a time shared manner, where multiplexers 402 and 408 are provided to select the feedback channel to be converted. Various types of squarewaves can be converted, including phase shifted squarewaves and pulse width squarewaves; described in detail in the previously referenced application Ser. No. 134,098. For a phase shifted squarewave, the $\phi$B reference square wave leading edge is used to start the converter counter and the phase shifted squarewave leading edge is used to stop the converter counter; thereby providing a count proportional to the phase shift between the two squarewaves. For a pulse width squarewave, the squarewave leading edge is used to start the converter counter and the squarewave trailing edge is used to stop the converter counter; thereby providing a count proportional to the width of the squarewave pulse.

A set of phase shifted squarewaves 400 are multiplexed with multiplexer 402 to provide the selected phase shifted squarewave 404 and a set of pulse width squarewaves 406 are multiplexed with multiplexer 408 to provide the selected pulse width squarewave 410. The appropriate squarewave in each multiplexer is selected by the four bit address lines 412 from register 438. The selected squarewaves 404 and 410 and the reference squarewave 416 are processed with the flip-flops 418 and logic 420 to provide the start pulse 428 and stop pulse 430 to control the count duration with the state of the count control flip-flop 422.

The flip-flops 418 and associated logic provide synchronous one-shot functions, where the output signal is a single clock period pulse at the time that the selected squarewave makes the proper transition. For phase shifted squarewaves, the positive transition of the reference ($\phi$B) 416 provides the start pulse 428 and the positive transition of the selected squarewave 404 provides the stop pulse 430. For the pulse width squarewaves, the positive transition of the selected squarewave 410 provides the start pulse 428 and the negative transition of the same selected squarewave 410 provides the stop pulse 430. The start and stop pulses for each input squarewave 404 and 410 are formed with logic 420 and the appropriate start and stop pulse pair are selected with signal 432 from registers 438. The equations for the start pulse 428 and the stop pulse 430 are shown in Table II, where flip-flops 450 and 451 define the start pulse and flip-flops 452 and 453 define the stop pulse for the phase shifted squarewave and flip-flops 454 and 455 define the start and stop pulses for the pulse width square waves. The start pulse 428 resets the flip-flop 422 and the stop pulse 430 sets the flip-flop 422 to enable the count with logic 421. The flip-flop 422 is latched with the 422Q term during that interval.

The data processor 112 loads the converted parameter from the register 438 into the A-register with an EX-6 instruction through the IW-6 channel and simultaneously loads the next parameter address from the A-register through the OW-6 channel into the register 438 with signal AoQ to select the next input channel for conversion. Then the data processor 112 executes a DC-10 instruction to initiate the next conversion. The data processor logic is described in the referenced application Ser. No. 101,881; where the IW-6 channel is shown in FIG. 13 on pin 10, the A-register is shown in FIG. 4 as 108 and in FIG. 6 as 130, and the DC-10 channel is shown in FIG. 13 as $\overline{\text{DO-10}}$ on pin 39.

The DO-10 signal sets the synchronous one shot flip-flops 460 and 462, thereby enabling the selected start pulse 428 to set the count enable flip-flop 422 for the next conversion. When the conversion count has been completed, the signal 456 causes the flip-flops 460 and 462 to be sequentially reset; thereby disabling the next start pulse 428 with disable signal $\overline{462Q}$ and generating a load command pulse through gate 446 to cause the registers 438 to load the counter 436 output parameter 458 and the data ready signal 462Q.

The count complete signal 456 is generated when either a stop pulse 430 terminates an in process count or the overtime one-shot 464 defines that the maximum conversion time has been exceeded. The 462Q signal disables the IW-6 signal with gate 466, so a data processor interrogation during a conversion operation will load only zeros. Also, this 462Q signal will be loaded into the least significant bit of the registers 438 with the parameter 458 to insure that, when the data processor 112 loads a proper parameter with the EX-6 instruction, this bit will be one-set providing a non-zero feedback parameter. Therefore, the data processor 112 will load IW-6 words and test these words for a non-zero condition. If this word is zero, the conversion is still in process. If this word is non-zero, The input parameter represents the converted parameter.

When the data processor generates an EX-6 instruction, the FAB micro-operation signal and the P56 operand address signal become true to enable the shifting mode of the registers 438 with logic 470. If the count is complete, as defined with the 462Q signal, then the logic 470 will command the shift mode of the registers 438, thereby permitting it to be clocked with the data processor clock $\overline{\text{P3}}$. Also, logic 470 prevents a race condition, such as with the signal 462Q going true when the FAB signal is true.

While the flip-flop 422 is latched in the reset state, the clock pulses 468 are enabled with gate 434 to cause the counters 436 to count. At the completion of the count and the loading of the registers 438, the signal 462Q clears the counters for the next conversion and the signal 422Q disables the count through gate 434.

For a zero conversion parameter, the start pulse 428 and the stop pulse 430 occur simultaneously, resulting in the flip-flop 422 remaining set. This will preserve the zero state of the counter 436 but will prevent the resetting of the flip-flops 460 and 462 which enables the loading of the register 438 and the enabling of the IW-6 parameter with gate 466. Therefore, a time-delay asynchronous one shot 464 is used to reset the flip-flop 460 through signal 456 after a maximum period has expired following the DC-10 signal which sets the flip-flop 462, which starts this one shot 464 time delay.

It is important to note that multiplexers such as devices 402 and 404 can be implemented to select any squarewave transition as a start pulse or a stop pulse thereby providing parameters that can be derived from the input signals 416, 400, and 406.

The operation of still another embodiment of the data processor feedback device provides the position parameter contained in the position register or phase counter 480 to the data processor 112 at precisely defined squarewave transitions, indicative of the relative times occurances of those transitions.

The servo mechanization shown in FIG. 17A of the referenced application Ser. No. 101,881 is shown in part in FIG. 4B of this application; where the reference numeral for the phase counter 302 in that application is changed to reference numeral 480 for this application and the reference numeral for the $\Delta$ register 276 in that application is changed to reference numeral 481 for this application to be consistant with the numbering procedure in this application. As will be described hereafter, the contents of the phase counter 480 defines the phase of the command squarewave increasing with time and updated with $\Delta$ commands from the $\Delta$ register 481. The data processor 112 can access this phase counter parameter 480 at prescribed times, such as at the transition of a squarewave signal.

Figure 4A:
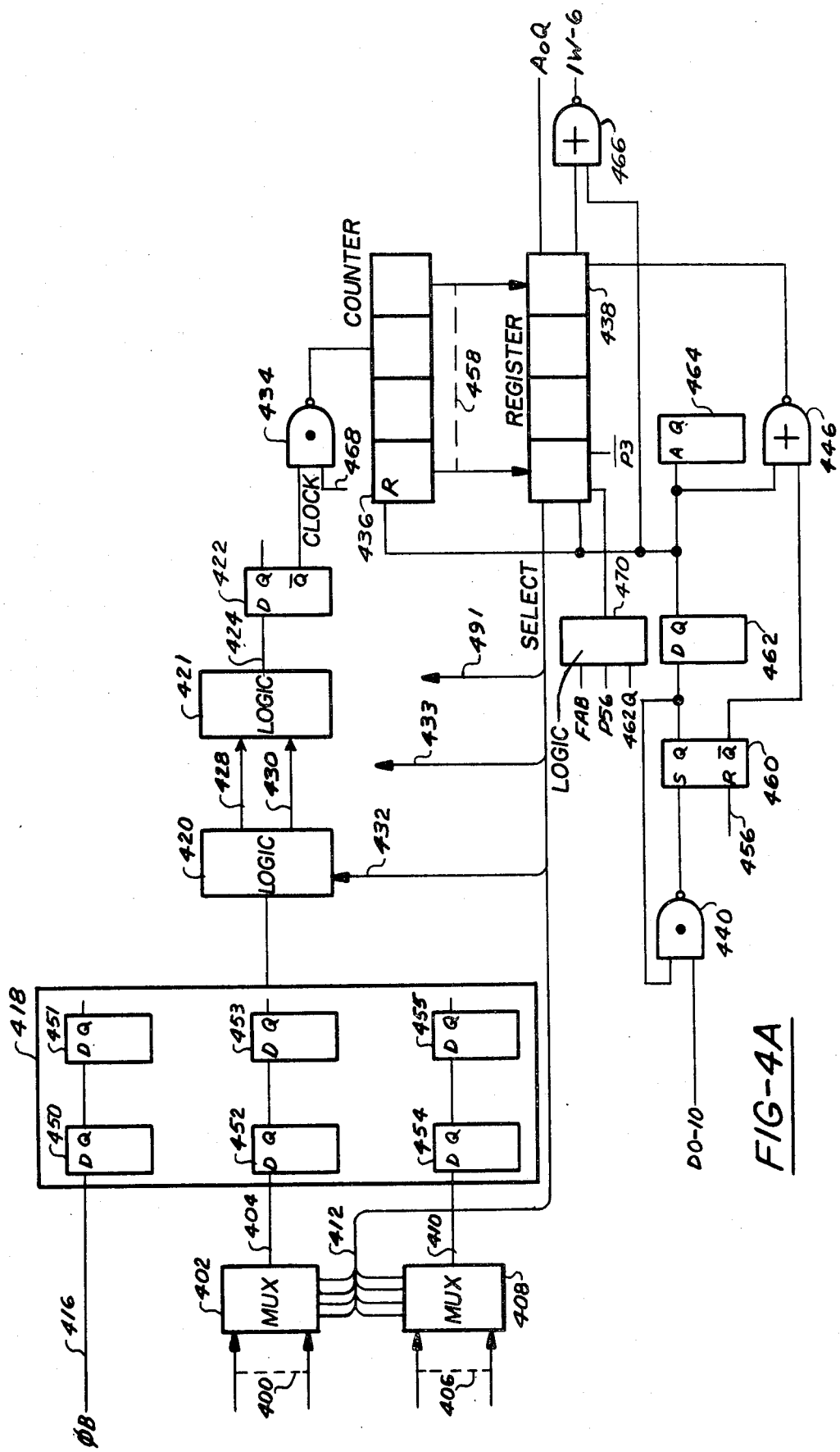
FIGS. 4A and 4B are logical diagrams of servo control logic.

In FIG. 4A, selection logic has been described to select one set of squarewave transitions, a start pulse 428 and a stop pulse 430, for use with the previously described counter feedback device. This selection logic;

comprising multiplexers 402 and 408, flip-flops 418, logic 420, and selection signals 412 and 432; can be used with selection logic 429 to select either the start pulse 428 or the stop pulse 430 with selection signal 433 from register 438. The selected output pulse signal 472 is then used to gate the phase counter parameter in phase register 480 into an intermediate register, such as Δ register 481, through gates 473 and 474, which expand the input logic to the Δ register 481 for this embodiment. This loading function is performed after the Δ register 481 has updated the phase register 480 so that there will not be a conflict between the feedback parameter loaded into the Δ register 481 and the Δ parameter stored in the Δ register 481. The data processor 112 then loads this parameter as described in the previously referenced application Ser. No. 101,881 page 85 lines 3 through 13. This feedback channel is also described in the previously referenced application Ser. No. 134,958 in FIG. 2 and on page 10 line 7 through page 11 line 4.

Various interlocks can be used to preclude a conflict between the contouring operation where the Δ register 281 contains the Δ parameter, the feedback operation where the Δ register 281 is loading or holding a feedback parameter, and the data processor loading of the feedback parameter with an EX instruction. These interlocks will become obvious to those skilled in the art from the teachings herein.

The transfer of data from the phase counter 480 to the Δ register 481 requires eight bit times synchronized with the word times of these registers. If the word time clock BS7 described in referenced applications Ser. No. 101,881 and Ser. No. 134,958 is used to clock the flip-flops 418; then the pulse 472 will be precisely eight bit times long and precisely synchronized with the register iterations for a properly controlled data transfer.

The information contained in the phase counter is described in the referenced application Ser. No. 134,958 page 20 line 14 through page 21 line 1.

Selection of the appropriate transition or pulse 472 with signals 412, 432 and 433 will define the parameter to be fed-back to the data processor. If the reference squarewave (φB) 416 is selected, then the feedback parameter is the value of the command squarewave at φ0 degrees which corresponds to the commanded position. If the feedback squarewave 400 is selected; then the feedback parameter is the value of the command squarewave at the feedback squarewave transition, which corresponds to the the position error. If the actual feedback position parameter is required, the command squarewave feedback parameter is algebraically added to the position error feedback parameter; thereby yielding the equivalent feedback position parameter. If the velocity feedback stop pulse is selected; then the feedback parameter is the value of the velocity parameter referenced to the velocity start pulse; where this velocity start pulse is the same as the feedback position squarewave transition or phase. The velocity parameter is obtained by algebraically subtracting the velocity feedback stop pulse parameter from the feedback position parameter. The velocity parameter can also be obtained by feeding-back the positive and negative transition parameters of the position feedback squarewave, then subtracting these two parameters to determine the half cycle period, then subtracting a constant indicative of the nominal half cycle period to obtain the deviation; where this deviation parameter is proportional to the velocity parameter. Other feedback parameter derivations will become obvious to those skilled in the art from the teachings herein.

Synchronization

The servo feedback device described herein provides whole number feedback, where the data processor 112 obtains a feedback parameter that uniquely defines the position of the pickoff. The data processor 112 can then generate a linear contour command to drive the machine to the required position. For parts programming contour operations, the data processor 112 converts all departures to incremental coordinates, where the final position is related to the starting position for that contour as discussed in the referenced application Ser. No. 232,459. Therefore, a contour can be derived by the data processor by sensing the present position of the axes, then subtracting the present position parameters from the final position parameters to obtain the contour commands in incremental coordinates, then transfer to the linear contour routine to execute this contour.

When the system is initially turned-on, the volatile flip-flop memory elements in the servos 120, 121, and 122 assume arbitrary binary states. Therefore, the contents of the phase counter 480 assumes an arbitrary state; which constitutes a servo command. The servo will then drive rapidly to execute this servo command to null the servo error by positioning the machine axes to this arbitrary command position. A feature known as turn-on synchronization can be provided to prevent this turn-on servo drive condition.

In one embodiment, the data processor provides the turn-on synchronization capability in the initialize routine which is automatically entered for the turn-on condition as described in the referenced applications Ser. No. 101,881 and Ser. No. 232,459. The data processor senses the difference between the actual machine position and the commanded machine position such as with the IW-5 feedback parameter from the Δ register 481 described herein. This difference is the position error, which is also the incremental coordinates for a linear contour to null this position error by commanding the machine servos to the actual machine position, thereby precluding the rapid drive to null the servos during system turn-on.

Figure 4B:
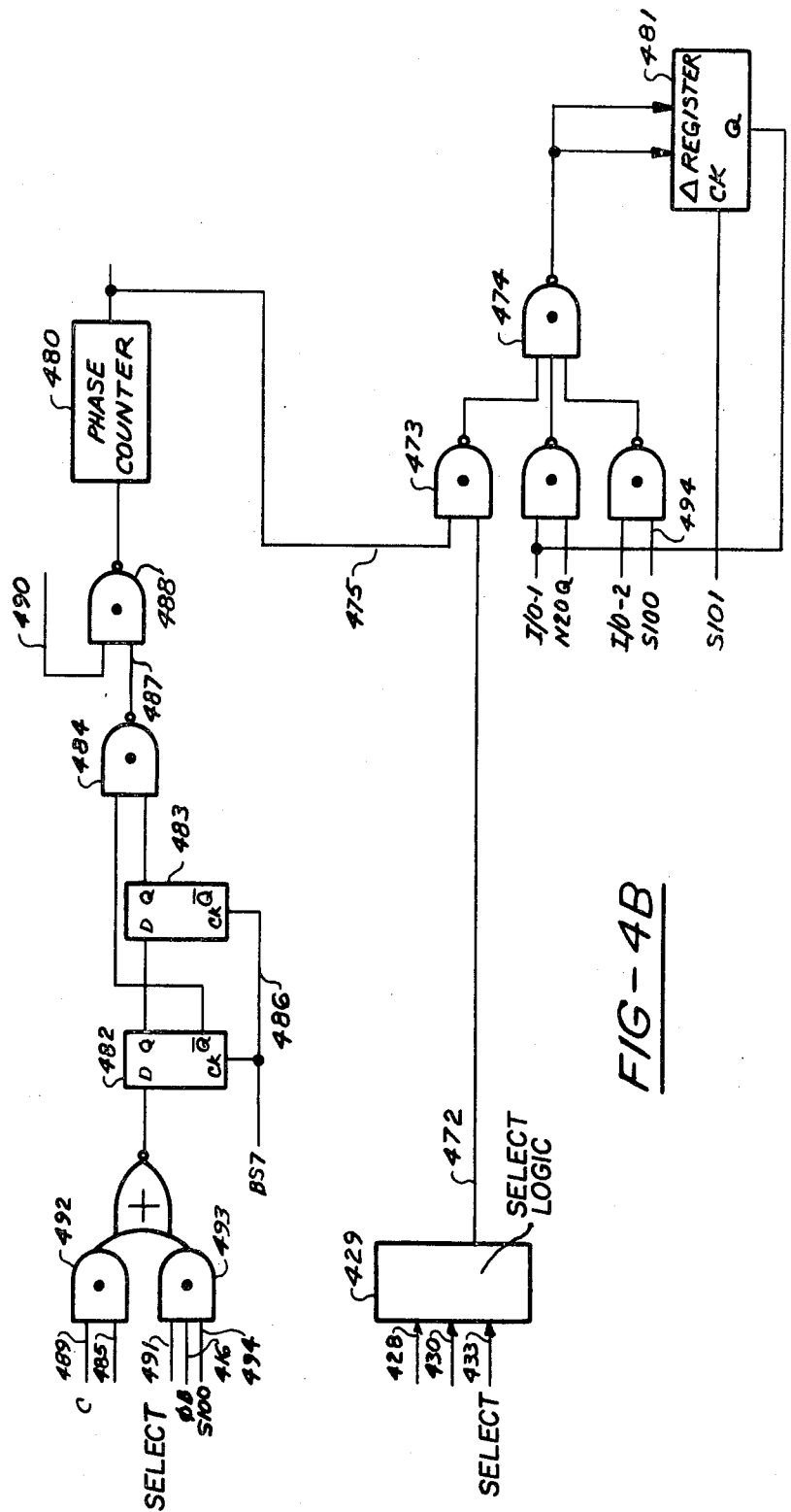

In another embodiment, the servo logic illustrated in FIG. 4B provides the turn-on synchronization capability. A synchronous one-shot is provided with flip-flops 482 and 483 and with the gate 484 to detect the positive transition of the feedback squarewave signal 485 from the resolver. These flip-flops 482 and 483 are clocked with the word time clock (BS7) 486 to provide a precisely synchronized one word time pulse 487 when gate 492 is enabled by the turn-on signal (C) 489, illustrated and described in the referenced application Ser. No. 101,881. The synchronized turn-on pulse 487 disables the recirculation signal 490 of the phase counter 480 with gate 488, thereby clearing the phase counter 480 precisely synchronized with the feedback squarewave 485 transition. Therefore, the phase counter 480 starts it's count coincident with the feedback squarewave transition so the command squarewave is in-phase with the feedback squarewave 485, thereby precluding the rapid drive to null the servos during system turn-on. The asynchronous nature of the turn-on signal 489 may cause an improper initial condition to be loaded into the phase counter 480 but, because the turn-on signal 489 covers at least several cycles of the servo squarewaves, the proper state of the phase counter 480 will be commanded on the next cycle, which is rapid enough to prevent the servos from responding to the improper conditions.

It is often desireable to position an axis to a well defined, precise position. This position will be defined as the pickoff zero position or null position; defined as the position at which the feedback squarewave is in phase with the reference squarewave ($\phi$B)416. Commanding the servo to this position is referred to as zero synchronization.

In one embodiment, the data processor 112 provides the zero synchronization capability by sensing the actual machine position such as with the IW-5 feedback parameter from the $\Delta$ register 481 described herein. The data processor 112 then subtracts this parameter from the desired position, zero in this case, to obtain the incremental coordinates for a linear contour to command the machine to the precisely defined zero pickoff position.

In another embodiment, the servo logic illustrated in FIG. 4B provides the zero synchronization capability. The synchronous one-shot; composed of circuits 482, 483, 484, and 488 and described previously for the turn-on synchronization capability; is used for the zero synchronization capability by detecting the positive transition of the reference squarewave ($\phi$B) 416 and clearing the phase counter 480 precisely synchronized with the reference squarewave 416 transition. Zero synchronization is commanded with an address line 491 from registers 438 through gate 493. A different address line 491 is provided for each axis to select the axis or combination of axes for this function. In order to preclude the possibility of improperly commanding the zero synchronization function with data bits shifted through the registers 438 with the EX-6 instruction, the zero synchronization command is disabled with the signal (S100) 494. In order to preclude the possibility of improperly commanding the zero synchronization function with a feedback parameter in the registers 438, an unused input channel 400 or 406 is selected with the zero synchronization addresses.

The zero synchronization capability can be generalized as a programmed synchronization capability with the data processor software embodiment described previously, where the machine can be commanded to any programmed position of the feedback pickoff. This can be accomplished with a block of parts program commands containing an m26 command and containing x, y, and z departure commands. The m26 command defines the x, y, and z commands as the required positions of the corresponding feedback pickoffs. The omission of one or more departure commands in that m26 block defines that the corresponding axes are not to be repositioned. The data processor provides this programmed synchronization capability by sensing the actual machine position such as with the IW-5 feedback parameter described herein. The data processor then subtracts this parameter from the desired position to obtain the incremental coordinates for a linear contour to command the machine to the precisely defined pickoff position.

The data processor embodiment of the synchronization capability; zero synchronization, turn-on synchronization, and programmed synchronization; is the preferred embodiment. It provides better control and greater versatility with less circuitry then the special logic embodiment. The data processor can precisely control the synchronization contour velocity and other such parameters yielding significant performance advantages over the logic embodiment.

Threading

A program flow diagram is shown in FIG. 5 to illustrate one embodiment of the threading contour operation. This description of lathe threading operations is intended to illustrate one embodiment of the class of applications where a data processor operates interactively with a physical system such as a machine system in real time.

The data processor 112 executes the executive program to control all program operations and provide for time sharing with program routines. The data processor detects inputs and conditions with the executive program, then transfers to the various program subroutines necessary to perform the computations and generate the outputs. The data processor can execute programs on a time shared basis by branching out of subroutines such as on a sequential, interrupt, or priority basis as is well known in the art. For simplicity of description, relatively complex program operations such as time sharing operations are not shown in the flow diagram in FIG. 5 but will become obvious to those skilled in the art from the teachings herein. The data processor stored program will be described hereafter. The data processor 112 is responsive to a stored program contained in main memory 130 to provide this processing capability. Operation of the data processor 112 is controlled by the executive routine 580, where the executive routine accesses the subroutines to be executed, sets the priority of these subroutines, defines the timing, and other such well-known operations. The executive routine 580 will control the data processor to periodically test the real time parameter in operation 582 to determine if it is time to enter one of the real time subroutines such as along path 583; where the real time parameter may be derived from a real time clock, a program timer in the executive routine 580, or other well known means and methods for deriving this parameter. In one embodiment, this timer may be implicit in the stored program, where a transfer to the appropriate subroutine is provided after a certain number of instructions have been executed, thereby implying the required real time period. If the required periods have not expired, the data processor will return to the executive routine along path 584. If one of the required periods has expired to within the required tolerance, the data processor will preserve the return address and other parameters for reentry to the executive routine 580 and perform other required housekeeping functions in operation 588, then the data processor will enter the subroutine along path 589 to perform the required program operations. The data processor will exit the subroutine by fetching the return address, preserved in operation 588, then transferring back to the executive routine 580 along path 581.

The data processor 112 tests the system conditions in operation 500 to determine if a threading operation is in process. If not in process, the data processor branches along path 502 to operation 504, where the data processor tests the system conditions to determine if a threading operation is pending. If not pending, the data processor branches along path 506 to exit the threading subroutine at 585. If pending, the the data processor branches along path 508 to operation 510 where the data processor calculates the initial conditions such as the rectilinear translational slopes as a function of the spindle angular rotation which are described hereafter.

For a lathe machine, the translational axes are the X axis and the Z axis. The spindle angular position $\theta$ is the independent variable associated with the synchronous contouring computation, providing the driving function for the translational axis motions. The slopes of the rectilinear axes motion relative to the spindle axis motion are derived from the initial contour conditions, usually provided in units of inches-per-revolution. The X axis slope is $dX/d\theta$ while the Z axis slope is $dZ/d\theta$. It should be noted that the dX, dZ, and d$\theta$ parameters are whole numbers with many significant figures of resolution.

After processing the initial conditions in operation 510, the data processor sets the in-process condition bit so that the data processor will branch along path 514 after testing for this condition in operation 500 for subsequent iterations. After performing the calculations in operation 510, the data processor will follow path 512 to exit this subroutine.

On subsequent iterations, if the data processor detects the in-process condition in operation 500, it will branch along path 514 to operation 516 and test for the startup condition. If the startup condition is true, when the data processor must await initiating the contour until the spindle is approximately in the startup position $(\theta_s)$. This is because precise multi-pass turning operations require precise tracing over the path for each successive operation, where it is necessary to start the contour at the same angular position of the spindle for each successive operation.

If the startup condition tested in operation 516 is true, the data processor will branch along path 518 to operation 520, where the data processor will sample the spindle position, such as with an EX-6 instruction for one embodiment of the feedback means as described herein; then compare this spindle position parameter $(\theta_I)$ with the reference parameter $(\theta_R)$ in operation 522. If these parameters do not compare within a prescribed tolerance, the data processor will branch along path 524 to exit the subroutine to await the proper spindle condition. If these parameters compare within a prescribed tolerance, the data processor will branch along path 525 to operation 526; where the data processor will reset the startup condition bit, thereby causing the data processor to branch along path 528 on subsequent iterations. The data processor will then exit this subroutine along path 527.

The squarewave spindle position feedback means takes samples at discrete times and does not, therefore, obtain continuous sampling of all angular positions. For the startup condition, it might be considered necessary to always start at the $\theta_R$ position, but the feedback means does not sample the exact $\theta_R$ position on each rotation because the samples are discrete positions and may, therefore, bracket this $\theta_R$ position. It may take many spindle rotations until the exact $\theta_R$ position is obtained based upon well-known statistical sampling considerations. This will cause a long start up delay that decreases utilization of the lathe. Therefore, an algorithm is presented that insures startup on the first spindle rotation. In operation 522, the startup position need only be within a tolerance of the actual $\theta_R$ position, where this tolerance is large enough to insure startup on the first spindle rotation. Regardless of whether the startup position is greater than or less than the $\theta_R$ parameter, the $\theta_R$ parameter is stored as the $\theta_o$ parameter in operation 526. Therefore, all subsequent samples will be referenced to $\theta_R$ as if $\theta_R$ were actually sampled, but subsequently perturbed by an angular velocity deviation between samples. Therefore, the first threading commands to the x and z axes will be a velocity that will cause the axes to "catch up with the spindle" if the actual initial sample was past $\theta_R$ and will cause the spindle to "catch up with the axes" if the actual initial sample was before $\theta_R$.

In a threading operation, the machine is started off the workpiece to permit the axes to accelerate to velocity and stabilize before entering the workpiece to cut metal. This consideration permits the startup technique previously described to be used without introducing an initial thread error.

If the startup condition tested in operation 516 is false, then the contour has been synchronized with the spindle and the data processor branches along path 528 to perform the contour computations. The data processor will sample the spindle position in operation 530, such as with an EX-6 instruction as described herein for one embodiment of the feedback means, then subtract this input spindle position $(\theta_I)$ from the stored spindle position $(\theta_o)$ to obtain the change in spindle position $(\Delta\theta)$. The data processor then tests the $\Delta\theta$ parameter in operation 532 to determine if the angular change is less than the minimum angular driving function $d\theta$. If $\Delta\theta$ is less than $d\theta$, then the spindle angular change $(\Delta\theta)$ is below the system response level and the contouring commands are not generated. The program then branches along path 534 and exits the subroutine for a one iteration delay to obtain a larger value of $\Delta\theta$. If $\Delta\theta$ is equal to or greater than the minimum angular driving function $d\theta$ in operation 532, then the data processor branches along path 536 to operation 538, where the data processor performs the contouring computations. The first computation:

$$n = \Delta\theta/d\theta$$

is performed, where n defines the numer of minimum angular driving function increments that the spindle has translated between contour iterations. This n parameter is rounded off to an integer parameter (N), where the roundoff does not contribute to an accumulating contour error, as will be described hereafter. The second set of calculations performed in operation 538 are:

$$\Delta X = N(dX/d\theta)$$

$$\Delta Z = N(dZ/d\theta)$$

where $dX/d\theta$ and $dZ/d\theta$ are the displacements for each axis per each minimum angular driving function increment, defined as the contour slopes, as calculated in operation 510. These $\Delta X$ and $\Delta Z$ calculations must be precise, where roundoff can contribute to an accumulating contour error. This algorithm provides a precise linear contour in the x-z plane synchronized with the spindle for a precision linear taper thread. The data processor then executes for $\Delta X$ and $\Delta Z$ contour commands in operation 540 to provide the contour motion required for each translational axis for the angular change $\Delta\theta$. The contour command execution is described in the referenced application Ser. No. 101,881, on page 86 lines 25 through 30, page 87 lines 1 through 6, page 89 lines 29 through 30, page 85 lines 1 through 13, page 87 lines 21 through 30, and page 88 lines 1 through 2. The contour command execution is further described in the referenced application Ser. No. 134,958 on page 10 lines 7 through 10, page 11 lines 1 through 23, page 14 lines 20 through 29, page 22 lines 2 through 30, and page 23 lines 1 through 15.

The data processor next updates the parameters in operation 542 as follows:

$$X_o + \Delta X \rightarrow X_o$$

$$Z_o + \Delta Z \rightarrow Z_o$$

$$\theta_o + Nd\theta \rightarrow \theta_o$$

The old contour positions, $X_o$ and $Z_o$, are updated with the contour commands just executed, $\Delta X$ and $\Delta Z$, to provide the new contour positions, which are then stored to define the updated old contour positions for subsequent calculations. The old angular position $\theta_o$ is updated with the $Nd\theta$ term to form the new angular position which is stored to define the updated old angular position for subsequent iterations. It should be noted that the update for $\theta_o$ is the calculated $\Delta\theta$ parameter which does not include the remainder that was disregarded in the first calculation in operation 538. Although the contour calculations have disregarded the remainder portion of the sample $\theta_I$, the whole number spindle pickoff provides a memory of the true position to insure that this remainder will not be premanently lost, but will be used when it builds up to the magnitude of the $d\theta$ parameter.

The data processor next performs a test in operation 544 to determine if the contour has progressed to within a tolerance ($\delta$) of the final position parameters $X_f$ and $Z_f$. This test is:

$$(X_o - X_f) < \delta X$$

$$(Z_o - Z_f) < \delta Z$$

If the commanded positions are not within the tolerance, the data processor branches along path 546 and exits the subroutine. If the commanded positions are within the tolerance, the data processor branches along path 548 to operation 550, where the data processor commands the servos to drive to the final position $X_f$ and $Z_f$ with the $\Delta X_f$ and $\Delta Z_f$ final commands, where:

$$\Delta X_f = X_o - X_f$$

$$\Delta Z_f = Z_o - Z_f$$

This final driveout is a very small amount because the initial conditions, defined in operation 510, provided a contour that is completed in an integer number of $d\theta$ steps and the rate of execution of this subroutine, known as the iteration rate, is usually greater than the rate at which the $d\theta$ increments are provided from the spindle. The data processor resets the in-process condition in operation 550 so that the data processor will follow path 502 for the subsequent iterations until a new threading contour is required. The data processor sets the startup condition in operation 550 so that the data processor will follow path 518 for the startup of the first threading iterations of a new threading contour. The data processor then branches along path 552 to exit the subroutine.

Thread precision is a function of a repeatable starting angular position. Therefore, the actual starting angular position is of no importance. The introduction of fixed start position bias such as the value of $\theta_R$ or a startup fixed angular position bias will not affect the thread precision, which is a function of repeatability for each of a plurality of successive threading operations.

Servo updates occur at precisely defined intervals such as at phase zero degrees defined as $\phi B$ or $\theta_R$ 416. Therefore, the SD-13 signal to the data processor from the servos will occur at this phase zero time. The feedback spindle position parameter is provided at different intervals, defined by the value of the count relative to the phase zero time. As will described previously, a constant or repeatable time delay does not introduce an error because all points on the contour are affected in the same manner. That is not the case with this feedback count delay, which varies with the angular position of the spindle and, therefore, introduces a linearly changing bias with respect to angular position. This will introduce errors such as with thread cutting.

The variable time delay can be compensated for in the data processor by extrapolating back in time by the count period to obtain the calculated angular position of the spindle at the $\phi_B$ time rather than the sensed angular position of the spindle at the time that the count terminated. This backward extrapolation can be accomplished with the equation:

$$\theta_C = \theta_I(1 \pm k\omega)$$

where $\theta_C$ is the compensated or desired angular position at phase zero ($\phi_B$) time 416, $\theta_I$ is the feedback parameter sampled at a time that is a function of the value of the sampled parameter, k is a correction constant relating to microseconds of count time per degree of angular position, and w is the calculated angular velocity of the spindle. The term kw is the angular distance that the spindle would traverse in one unit of angular displacement (such as one degree).

The $(1 \pm k\omega)$ term is a correction factor for the $\theta_I$ term to determine the angular displacement, not at the completion of the count, but at the start of the count. The $+$ or $-$ term is to be selected based upon computational logic such as the spindle direction of rotation.

One exception must be considered. For a zero count, the correction will not be zero because the overtime one-shot 464 must run out before the conversion is completed. Therefore, the data processor must logically detect this zero count condition and substitute a special term in the equation for this special case.

The conditions of the correction equation are determined in operation 510 and this equation is processed for each sample in operations 520 and 530.

Turning Machine Operations

Three modes of feedrate programming are provided for turning machines, which are:
 (1) Inch-Per-Minute (IPM)
 (2) Inch-Per-Revolution (IPR)
 (3) Revolutions-Per-Inch (RPI)

A comparison of all three modes is presented in Table III.

TABLE III

| FEEDRATE | SYMBOL | FEEDRATE MODES | | | |
|---|---|---|---|---|---|
| | | FORMAT | SELECT | RESOLUTION | RANGE |
| Inch/Minute | IPM | f22 | g90 | 00.01 IPM | 99.99 IPM |
| Inch/Revolution | IPR | f13 | g91 | 0.001 IPR | 9.999 IPR |
| Revolutions/Inch (Pitch) | RPI | f22 | g92 | 00.01 RPI | 99.99 RPI |

Selection of IPM, IPR, and RPI feedrate modes is performed with g90, g91, and g92 commands, respectively. These g commands need only be programmed once for the particular mode and need not be programmed again until a new mode is required. If the feedrate parameter is changed but the mode is not changed, then the new feedrate parameter must be programmed but the g command does not have to be reprogrammed. Direct inches-per-minute (IPM) feedrate programming provides precise control of tool vector velocity without tedious calculations. Tool velocity is programmed directly in inches-per-minute, where the f22 format provides a resolution of 00.01 IPM with a range of 99.99 IPM. Direct inch-per-revolution (IPR) and revolutions-per-inch (RPI) feedrate programming provides precise control of tool velocity relative to the spindle speed without tedious calculations. Direct IPR programming has an f13 format, providing a resolution of 0.001 IPR with a range of 9.999 IPR. Direct RPI programming has an f22 format providing a resolution of 00.01 RPI with a resolution of 99.99 RPI. The combined capability of RPI and IPR feedrate programming provides a maximum lead of 100 inches with 00.01 RPI and a minimum lead of 0.001 inches with 0.001 IPR. This wide dynamic range, in conjunction with the convenience of both IPR and RPI feedrate programming, adds simplicity and flexibility to turning operations. Direct IPR and RPI feedrate programming operate in the turning mode unless the threading mode is selected with a g33 command. Maximum machine utilization is achieved in the turning mode because the tool enters the part without an initial synchronization dwell and the velocity is not adjusted for spindle speed variation. In addition, greater velocities may be programmed for turning operations, as contrasted to threading operations. IPR and RPI unslaved operation generates a fixed contour velocity based upon the programmed spindle speed value, but does not compensate for variations in spindle speed from that programmed value. IPR and RPI unslaved operation is selected with g91 or g92 commands, respectively, with the appropriate feedrate parameter. The vector velocity corresponds to the programmed velocity, as related to the programmed spindle speed; where: IPM=$\omega$(IPR) and IPM=$\omega$(RPI) and where $\omega$ is the programmed spindle speed and IPM, IPR, and RPI are the units of the various velocity parameters. IPR and RPI slaved operation or threading slaves the instantaneous contour velocity to the instantaneous spindle speed to compensate for variations in spindle speed from the programmed value. IPR and RPI slaved operations are selected with a g33 command in addition to the g91 or g92 commands. For a turning machine, the Z axis velocity component corresponds to the programmed velocity, although the vector velocity can be provided as an alternative. Slaved operation is primarily used for threading, where the workpiece entry point and axes velocity are both slaved to the spindle for cut repeatability, independent of spindle speed variations. Although most threading operations are performed along the Z axis, a taper thread can be cut with a simultaneous linear contour in both X and Z dimensions. The IPR and RPI slaved or threading modes synchronize the contour velocity with the spindle velocity to insure the highest degree of repeatability between successive cuts. The data processor uses spindle feedback for synchronization, such as described for servo feedback in the previously referenced application Ser. No. 134,958.

The combined capability of both IPR and RPI feedrate programming, provides a resolution far exceeding the resolution of either parameter. As an example; a pitch of 12 can be programmed directly with RPI feedrate programming, yielding an IPR value of:

$$IPR = \frac{1}{RPI} + \frac{1}{12} = 0.0833333\ldots$$

If only IPR feedrate programming were provided, the limited resolution would only permit a value of 0.083 to be programmed with a significant loss in resolution. An RPI value of 0.083 with a significant loss in resolution. An RPI value of 0.083 provides a pitch of 12.05, which causes an error of an extra thread for a 20 inch long threading contour.

An adaptive feedrate control feature is provided to automatically preclude loss of servo synchronization for high velocity conditions. This capability relieves the parts programmer and operator from the burden of computing the velocity components per axis to verify that it is within the required velocity envelope. Automatic feedrate control also compensates for variations in servo loop characteristics such as frictional and inertial parameters, servo loop gain, and motor torque. Operation is adaptively controlled to insure that under dynamic conditions such as acceleration and deceleration, full synchronization is maintained.

For adaptive feedrate control, the data processor 112 monitors the steady state position error signals of the servos 120, 121, and 122 and overrides the programmed feedrate if any steady steady state position error exceeds a programmable value. Data processor monitoring of these signals is described for various feedback means herein.

Because of the wide range of values possible for RPI and IPR feedrate programming described herein, feedrates can be commanded that are not physically possible to achieve. For example, IPM feedrate programming is limited to 99.99 IPM and, with a feedrate override of 150%, can provide approximately 150 IPM. Rapid traverse will approach the machine velocity limits, usually in the range of 300 IPM. Considering an IPR feedrate parameter of 9.999 IPR with a spindle speed programmed at 1000 RPM. To achieve this command, the machine axes would be required to travel:

IPM=(9.999 inches/rev.)(1000 rev./min.)

yielding an IPM velocity of approximately 10,000 IPM which is a physical impossibility. Similarly, consider an RPI feedrate parameter of 00.01 RPI with a spindle speed programmed at 1000 RPM. To achieve this command, the machine axes would be required to travel:

IPM = (1000 rev./min.)/(00.01 rev./in.)

yielding an IPM velocity of 100,000 IPM which is also a physical impossibility. To protect against this type of condition, the data processor checks parts program commands to insure that the direct commands and the implied commands both remain within the operational constraints of the system. When these commands exceed predefined operational constraints, an error lamp is illuminated to appraise the operator of an error condition. In addition, an error code is displayed on the numeric display indicative of the error condition to appraise the operator of the cause of this error condition. The operator can cross reference the error code in the operators manual to identify the error condition and obtain a description of the corrective action.

The error display is not limited to the example shown, but is intended to include all other error conditions that can be detected by the data processor. The error lamp display and numeric display are described in the referenced applications Ser. No. 101,881 and Ser. No. 101,449. The operator corrective action is described in the referenced application Ser. No. 101,449 on page 19 line 2 through page 20 line 6.

The simplest and most common form of threading is with a straight, constant lead, non-tapered thread along the z axis, which is parallel to the center of workpiece rotation. Various other types of threads have been found to be useful such as taper threads and variable lead threads for self locking requirements.

A taper thread is provided automatically with the threading algorithm described herein, where a two dimensional x and z axis thread is provided synchronized with the spindle motion. The use of only $\Delta z$ commands provides a straight, non-taper thread. The use of $\Delta x$ and $\Delta z$ commands as described herein provides a thread that has a taper in the x direction as either an increasing or decreasing taper thread.

A variable lead thread is provided, where the $dx/d\theta$ and $dz/d\theta$ slopes can be independently varied along the thread. The use of parts program g commands can be used to select the axis and the desired lead variation, where g35 selects a linearly increasing lead for the z axis, g36 selects a linearly increasing lead for the x axis, g37 selects an exponentially increasing lead for the z axis, and g38 selects on exponentially increasing lead for the x axis. Other variable leads will become obvious to those skilled in the art. It should be noted that the variable lead can be provided for both the x and z axes with the form of each variation individually selectable. This capability provides not only a variable lead thread, but a compound variable-lead, variable taper thread; where the term compound is intended to mean different variation curves for the x and z contours. The term variable for variable lead or variable taper relates to a variation along the contour; where the capability to program different leads and tapers, whether fixed or variable, is defined as programmable leads and programmable tapers.

Another form of variable lead, variable taper is an x-z plane circular contour with a spindle position independent variable. The independent variable for this contour is $d\theta$ or $\Delta\theta$ obtained from the spindle feedback means as contrasted to the non-threading circular contour where the independent variable is dt or $\theta t$ relating to real time feedrate. This contour will provide a circular variable pitch, variable taper which can be used as a retract taper for tool withdrawl, as described herein, with a gradual locking characteristic. As an alternate; a sine, cosine, or other such trigonometric function can be used to provide a variable lead thread without a taper such as by calculating the x-z plane two dimensional trigonometric threading commands $\Delta x$ and $\Delta z$, then zero setting the $\Delta x$ commands prior to outputting these commands to the servos, yielding only the z axis component for a z axis trigonometric variable lead thread.

It should be noted that the threading contours are all synchronized with the spindle, where the threading contour provides $\Delta x/\Delta\theta$ and $\Delta z/\Delta\theta$ contours and the variable lead also provides $\delta(\Delta x)/\Delta\theta$ and $\delta(\Delta z)/\Delta\theta$ slope updates or variations. The x axis motion and y axis motion are defined by parametric equations in terms of the independent variable, $\theta$. An alternate threading contour can be implemented, where the motion of one axis such as the z axis is defined as a function of $\theta$, while the motion of the other axis such as the x axis is defined as a function of the first axis. In this case, the contour equations would take the form of:

$$\Delta z = f(\Delta\theta) = N(dz/d\theta)$$

$$\Delta x = f(\Delta z) = \Delta z(dx/dz)$$

Other equations that relate the dependent variables, $\Delta z$ and $\Delta x$ in this case, to the independent variable, $\Delta\theta$ in this case, will become obvious to those skilled in the art.

Figure 6:
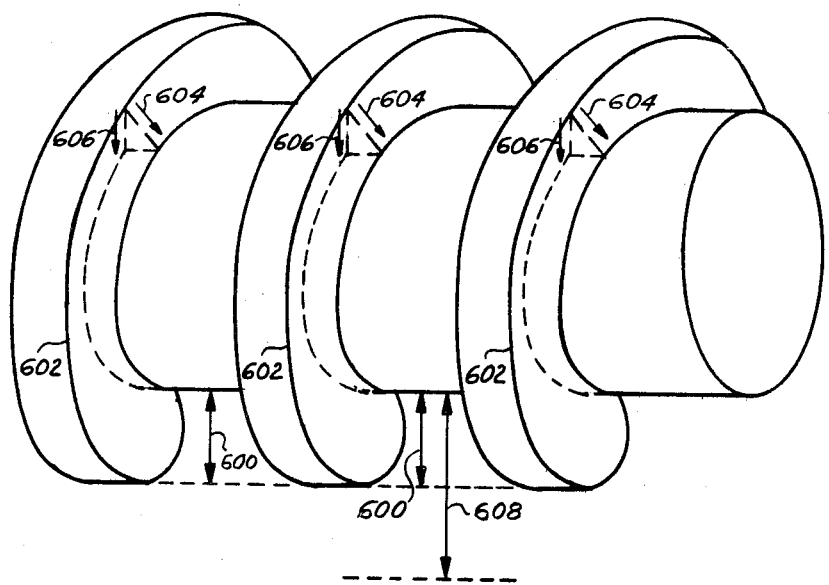
FIG. 6 is a diagram showing machined threads.

A schematic diagram of a thread is shown in FIG. 6. It is usually not possible to cut a thread to the proper depth 600 with a single cutter pass. Therefore, multiple cutter passes are programmed to iteratively cut deeper threads for the succession of cutter passes. As described, each pass must start at the same point and follow the same thread contour 602, with the exception of depth of cut 600. On each successive pass, the depth of cut is increased to progressively deepen the thread. The step increases in depth 600 for each successive cut is performed with endfeed 604. It is desireable to decrease the endfeed on successive cuts to provide substantially a constant chip load on the cutter. This endfeed may be only a x axis endfeed for a square thread face 606 or may be a combined x and z axis endfeed for a slant thread face 604 as is well known in the art.

The system of this invention provides for automatic multiple pass threading operations with automatic endfeed, wherein many threading passes are executed for a single threading block of commands. The first threading contour is programmed with x and z slope parameters, a feedrate parameter, and a g33 command to define a threading operation. A multiple pass threading contour also contains a g93 command; with the retract distance 608 defined with an r command, the total two dimensional endfeed 604 or thread depth 600 defined with u and w commands, and the first pass endfeed defined with a p command. In addition, the q command defines the percentage decrease in endfeed per pass, where q30 defines a 30% decrease in endfeed per pass and q00 defines a constant endfeed for all passes. Also, the g94 through g99 parts program commands define analytic functions that control changes in endfeed per pass. The data processor will generate the first pass threading contour, then retract to the r position, then rapid traverse along the z axis to the z start point, then rapid traverse along the x axis to the start point, then calculate the endfeed, then rapid traverse to the new start point as defined by the endfeed calculation, then generate the next pass in succession; repeating the above sequence until the total endfeed equals the y and w programmed parameters. The last past may require only a partial endfeed to achieve the total u and w positions, as computed in the data processor. Alternate embodiments would permit the programming of different parameters, such as the number of passes required to completely define the multipass threading operation.

Control of machine acceleration and deceleration will now be discussed. Acceleration and deceleration operations for machine motion are provided in response to parts program commands, and are also provided automatically and adaptively when conditions warrant acceleration or deceleration operations. The data processor 112 modifies the contour calculations to change the real time interpolation commands 123 to the servos 120, 121, and 122 to provide acceleration and deceleration control signals to the machine 124. The machine 124 responds to these acceleration and deceleration control signals 120, 121, and 122 to gradually accelerate or decelerate the machine 124 to the required velocity as commanded by the data processor command signals.

Programmable acceleration and deceleration capability is provided for continuous mode operation where continuity of the contour is required at the parts programmers option. Acceleration can be commanded with a g08 command and deceleration can be commanded with a g09 command. These commands apply only to the block in which they are programmed. A block of commands can contain either a g08, a g09, both or neither of these commands.

Automatic acceleration and deceleration is provided for all conditions that continuity of the contour is not required such as when the axes motions are initially at rest, come to a stop, or for rapid traverse conditions which are not used for cutting metal.

The data processor also provides an automatic acceleration/deceleration capability. One example is for threading, where the threading contour will usually start and end with a zero velocity condition. If the computed velocity for either the x or the z axes is greater than a predetermined velocity parameter characteristic for that machine, then the data processor will automatically initiate an acceleration and a deceleration command for that threading contour. If the computed velocity for neither the x nor the z axes is greater than that predetermined velocity parameter, then the data processor will only accelerate and decelerate for that threading contour if that block of parts program commands containing an acceleration command (g08) and-/or a deceleration command (g09). Otherwise that contour would start and end with a velocity step function.

In the above example, acceleration and deceleration for a threading contour requires that the contour start and stop off of the workpiece with sufficient clearance for the axes to accelerate to a stable velocity and decelerate to a stop, respectively. The parts programmer can control these acceleration and deceleration contour portions with the a and d parts program commands discussed in the referenced application Ser. No. 232,459.

The data processor provides acceleration and deceleration portions of the contour that will automatically synchronize with the spindle position to insure precise threading contours. Tight high gain axes servo loops are provided for precise tracking between the various axes and between the various axes and the spindle. A high servo loop gain with a Kv of 50 or greater is used for this capability to minimize error buildup during acceleration and deceleration conditions and for precise steady state operation. General servo considerations such as servo Kv are described in Automatic Control Systems by Benjamin C. Kuo, published by Prentice Hall, Inc. in 1962; where the velocity gain (Kv) is described on pages 148-149: included herein by reference.

As described herein, when a threading block pair are used to provide a retract thread, acceleration and deceleration are automatically disabled to provide continuity from the first threading contour to the second retract threading contour.

It may be desireable to end a thread with a second threading contour that has a relatively rapid taper to withdraw from the workpiece. This can provide a type of automatic locking thread and can provide termination of a thread without the need to cut a groove, as is common in the prior art. This is accomplished by programming pairs of threading blocks, where the second block in that pair is a retract taper thread. The data processor provides a buffer memory capability, where a block of parts program commands are processed and stored prior to the completion of the last prior contour. Therefore, the data processor can initiate the execution of this retract taper thread without the need to stop and, therefore, without the need to resynchronize the initial point on the thread with the spindle position. An alternate embodiment would be to command the retract taper thread such as with a g34 parts program command to eliminate the spindle resynchronization for a continuous double thread contour for the retract thread. This thread could be a simple taper thread or a variable lead taper thread and can have a fixed pitch or a variable pitch as previously described to provide different types of self locking characteristics.

On a turning machine, the cutter will remove material proportional to the tangential velocity of the workpiece rotating past the cutter. The tangential velocity is a function of distance that the cutter is from the z axis, which is the axis of workpiece rotation. For a contour with an x axis component of motion, the distance from the z axis is continually changing; resulting in a changing tangential velocity and, therefore, a changing cutter load. Cutter load compensation is provided when g45 is commanded, which causes the data processor 112 to vary the feedrate and spindle speed inversely proportional to the x axis position. Therefore, this feed and speed override computationally maintains a constant cutter load through the entire contour.

The data processor accepts a block of parts program commands as the initial conditions of feeds, speeds, and displacements; then varies the feeds and/or speeds to compensate for the change in cutter load as a function of the displacements when this compensation is commanded. In an IPM feedrate mode, the spindle speed and feedrate are independent. Therefore, the g45 parts program command will command the data processor to vary the spindle speed or the g46 parts program command will command the data processor to vary the feedrate to provide this compensation. For the IPR or RPI feedrate modes, either a g45 or g46 parts program command will vary the spindle speed, which will provide an automatic, corresponding variation in the axis velocities which are computationally a function of the spindle speed.

The computational algorithm detects a Δx command, then updates the feeds and/or speeds as a function of this change in the x position, where the correction factor:

100(1−Δx/x)

is related to the percentage change in the x position. This factor is divided into the last previous feed and/or speed parameter to obtain the new feed and/or speed parameter for the next contour iteration.

Cutter load compensation provides better tool life and higher precision cuts. In addition, it will significantly reduce the length of parts programs; where it would otherwise be necessary to program multiple blocks of parts program commands for a single contour to change feeds and speeds as a function of changes in the x axis position. Also, when in this cutter load compensation mode, it is not necessary to reprogram the feeds and speeds between contours until the cutter load is required to change.

GENERAL CONSIDERATIONS

Many terms well known in the numerical control art are used in this description and claims. These terms are generally defined in the prior art literature and in the numerical control industry standards. The meaning of numerical control terms is intended to be as used in this specification and, if not fully defined in this specification, then as further defined in those referenced EIA Standards and, if not fully defined in those EIA Standards, then as commonly used in the numerical control field.

The term computer as used herein is intended to mean a stored program digital data processor.

Well known documents on numerical control are listed below and are incorporated herein by reference.

(1) Numerical Control by Nils O. Olesten for John Wiley and Sons.

(2) Numerical Control Users Handbook by Leslie for McGraw Hill (1970).

(3) Numerical Control, Practice and Applications by William J. Patton for Reston Publishing Company (1972).

(4) Automation Bulletin No. 3B Glossary of Terms For Numerically Controlled Machines by the Electronic Industries Association (1965) New York, N.Y.

(5) Interchangeable Perforated Tape Variable Block Format for Contouring and Contouring/Positioning Numerically Controlled Machine Tools (RS-274-A) by the Electronic Industries Association (1965) New York, N.Y.

Well known documents on computer programming are listed below and are incorporated herein by reference.

(1) Programming And Coding Digital Computers by Philip M. Sherman for John Wiley & Sons, Inc. (1963).

(2) Digital Computer Programming by Peter A. Stark for MacMillian Co. (1967).

(3) Programming For Digital Computers by Joachim Jeenel for McGraw Hill (1959).

(4) IBM 360 Programming And Computing by Golden and Leichus for Prentis-Hall Inc. (1967).

(5) Fundamentals Of Flowcharting by Thomas J. Schriber for John Wiley & Sons, Inc. (1969).

(6) Programming: An Introduction To Computer Languages by Ward Douglas Maurer for Holden-Day Inc. (1968).

(7) Design of Real-Time Computer Systems by James Martin.

(8) Elements Of Computer Programming by Swallow and Price for Holt Rinehart, and Winston (1965).

It is thus clearly seen that the present invention provides a novel means and method of providing a data processor system for interactive control of machines.

From the above description it will be apparent that there is thus provided a device of the character described possessing the particular features of advantage before enumerated as desirable, but which obviously is susceptible to modification in its form, method, mechanization, operation, detail construction and arrangement of parts without departing from the principles involved or sacrificing any of its advantages.

While in order to comply with the statute, the invention has been described in language more or less specific as to structural features, it is to be understood that the invention is not limited to the specific features shown, but that the means, method, and construction herein disclosed comprise the preferred form of several modes of putting the invention into effect, and the invention is, therefore, claimed in any of its forms or modifications within the legitimate and valid scope of the appended claims.

What is claimed is:

1. A feedback system comprising:
a feedback device for generating a repetitive signal having a repetitive signal characteristic that is related to a feedback condition, wherein said feedback device includes an excitation circuit for generating a repetitive excitation signal and further includes an electromagnetic transducer for generating the repetitive signal in response to the excitation signal, and wherein the repetitive signal characteristic is a transition between states;
a detection circuit for generating a detection signal in response to the transition between states of the repetitive signal;
a reference circuit for generating a reference signal; and
an output circuit for providing a digital feedback number in response to the detection signal and the reference signal, wherein said output circuit includes a counter for generating the digital feedback number related to a time difference between the detection signal and the reference signal.

2. A feedback control system comprising:
a feedback device for generating a repetitive signal having a repetitive signal characteristic that is related to a feedback condition;
a detection circuit for generating a detection signal in response to the repetitive signal characteristic;
a reference circuit for generating a reference signal;
an output circuit for providing a digital feedback number in response to the detection signal and the reference signal;
a stored program data processor for generating a digital command number in response to the digital feedback number; and
a control for controlling a physical system in response to the digital command number.

3. A feedback system comprising:
a feedback device for generating a repetitive signal having a repetitive signal characteristic that is related to a feedback condition;
a detection circuit for generating a detection signal in response to the repetitive signal characteristic;

a reference circuit for generating a reference signal, wherein said reference circuit includes a digital counter for generating a digital count number related to a time duration from a reference condition; and an output circuit for providing a digital feedback number in response to the detection signal and the reference signal, said output circuit including means for receiving a value of the digital count number in response to the detection signal wherein the received value of the digital count number is related to the time duration between the reference condition and the detection signal.

4. A feedback system comprising:

a feedback device for generating a repetitive signal having a repetitive signal characteristic that is related to a feedback condition, wherein said feedback device includes means for generating a plurality of repetitive signals and a digital multiplexer for selecting one of the plurality of repetitive signals as the repetitive signal to said detection circuit, wherein said multiplexer includes a plurality of digital gates for selecting the feedback signal, and wherein said plurality of repetitive signals are squarewave signals;

a detection circuit for generating a detection signal in response to the repetitive signal characteristic;

a reference circuit for generating a reference signal; and an output circuit for providing a digital feedback number in response to the detection signal and the reference signal, wherein the digital feedback number is related to a time of transition from one signal state to a second signal state of the selected feedback signal.

5. A feedback display system comprising:

a feedback circuit for generating a repetitive feedback signal having a phase that is related to a feedback condition;

a counter for generating a repetitive count number;

a detector for generating a detector signal in response to a phase related transition of the feedback signal;

a register for receiving the count number in response to the detector signal, wherein the magnitude of the received count number is related to the sensed feedback condition;

a processor for generating a feedback display signal in response to the received count number stored in said register; and a display for displaying feedback information in response to the feedback display signal.

6. A feedback display system comprising:

a feedback circuit for generating a repetitive feedback signal having a phase that is related to a feedback condition;

a counter for generating a repetitive count number;

a detector for generating a detector signal in response to a phase related transition of the feedback signal;

a register for receiving the count number in response to the detector signal, wherein the magnitude of the received count number is related to the sensed feedback condition;

a processor for generating a feedback display signal in response to the received count number stored in said register;

a display for displaying feedback information in response to the feedback display signal;

a control circuit for controlling a physical system in response to a command signal; and a command circuit for generating the command signal in response to the received count number.

7. A control system for controlling a physical system, said system comprising:

feedback means for generating a plurality of feedback signals related to a condition of a physical system, said feedback means including means for providing a first feedback signal having a first range of the physical system condition and means for providing a second feedback signal having a second range of the physical system condition, wherein the second range is greater than the first range;

command means for generating a command signal in response to the second feedback signal; and means for controlling the condition of said physical system in response to the first feedback signal and the command signal.

8. A control system for controlling a physical system, said control system comprising:

feedback means for generating a plurality of feedback signals related to a condition of a physical system, said feedback means including means for providing a first feedback signal having a first range of the physical system condition and means for providing a second feedback signal having a second range of the physical system condition, wherein the second range is greater than the first range;

a stored program computer for generating a command signal in response to the second feedback signal; and control means for controlling the condition of said physical system in response to the first feedback signal and the command signal.

9. A control system for controlling a machine, said control system comprising:

feedback means for generating a plurality of feedback signals related to a condition of a machine, said feedback means including a first resolver pickoff for providing a first feedback signal having a first range of the machine condition and a second resolver pickoff for providing a second feedback signal having a second range of the machine condition, wherein the second range is greater than the first range;

command means for generating a command signal in response to the second feedback signal; and control means for controlling the condition of a physical system in response to the first feedback signal and the command signal.

* * * * *